(12) United States Patent
Youngquist

(10) Patent No.: US 9,547,284 B2
(45) Date of Patent: Jan. 17, 2017

(54) AUTO-SETUP CONTROL PROCESS

(71) Applicant: John S. Youngquist, Niagara Falls (CA)

(72) Inventor: John S. Youngquist, Niagara Falls (CA)

( * ) Notice: Subject to any disclaimer, the term of this patent is extended or adjusted under 35 U.S.C. 154(b) by 536 days.

(21) Appl. No.: 13/838,762

(22) Filed: Mar. 15, 2013

(65) Prior Publication Data

US 2014/0277680 A1  Sep. 18, 2014

(51) Int. Cl.
*G06F 19/00* (2011.01)
*G05B 11/01* (2006.01)

(52) U.S. Cl.
CPC .................................... *G05B 11/01* (2013.01)

(58) Field of Classification Search
CPC ............................................... G05B 11/01
USPC ........................................................ 700/121
See application file for complete search history.

(56) References Cited

U.S. PATENT DOCUMENTS

| | | | |
|---|---|---|---|
| 4,151,945 | A | 5/1979 | Ragard et al. |
| 4,595,335 | A | 6/1986 | Takahashi et al. |
| 4,860,438 | A | 8/1989 | Chen |
| 5,278,634 | A | 1/1994 | Skunes et al. |
| 6,145,901 | A | 11/2000 | Rich |
| 6,168,169 | B1 | 1/2001 | Boyd et al. |
| 6,859,996 | B1 | 3/2005 | Slife et al. |
| 8,068,664 | B2 | 11/2011 | Rudd |
| 2002/0070362 | A1 | 6/2002 | Duquette |
| 2004/0149383 | A1* | 8/2004 | Bergstrom ......... H05K 13/0417 156/702 |
| 2005/0161498 | A1* | 7/2005 | Byskov et al. ............. 235/376 |
| 2010/0229380 | A1* | 9/2010 | Endo et al. ..................... 29/760 |
| 2010/0289345 | A1 | 11/2010 | Sakai et al. |
| 2010/0295935 | A1 | 11/2010 | Case et al. |
| 2012/0218402 | A1 | 8/2012 | Gieskes et al. |

FOREIGN PATENT DOCUMENTS

| | | |
|---|---|---|
| DE | 31 15831 | 11/1982 |
| EP | 0 235 045 A2 | 2/1987 |
| EP | 0 330 301 | 1/1989 |
| WO | WO 01/76994 A1 | 10/2001 |

OTHER PUBLICATIONS

Solid State Electronics Center, Honeywell Sensor Products, "Applications of Magnetic Position Sensors," AN211, pp. 1-8 (precedes applicant's filing date).
International Search Report and Written Opinion issued Jul. 2, 2014 in corresponding International Patent Application No. PCT/CA2014/000218.
Communication forwarding an Extended European Search Report issued Nov. 4, 2016 in a corresponding European Application No. 14764894.3 (9 pages).

\* cited by examiner

*Primary Examiner* — Mohammad Ali
*Assistant Examiner* — Yuhui R Pan
(74) *Attorney, Agent, or Firm* — Nixon & Vanderhye P.C.

(57) ABSTRACT

A pick-and-place machine and method includes use of a passive component feeder cartridge including a feeder gear. Rotation of the feeder gear causes a component-bearing tape to be fed through the feeder cartridge. A pickup head includes a vacuum nozzle to pick up the components from the tape and a rack gear to engage and drive the feeder gear of the feeder cartridge via translational motion of the pickup head when operatively disposed with respect to a selected feeder cartridge.

14 Claims, 40 Drawing Sheets

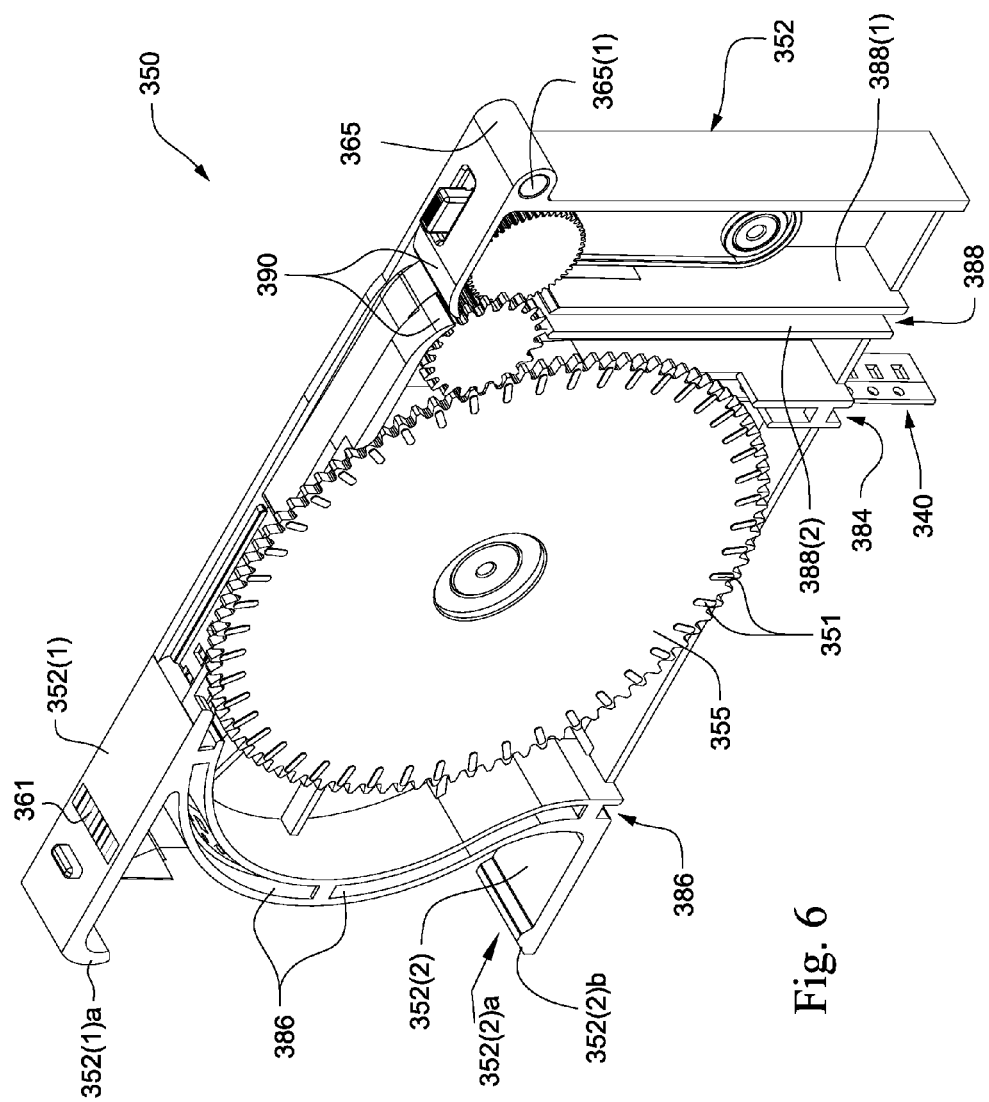

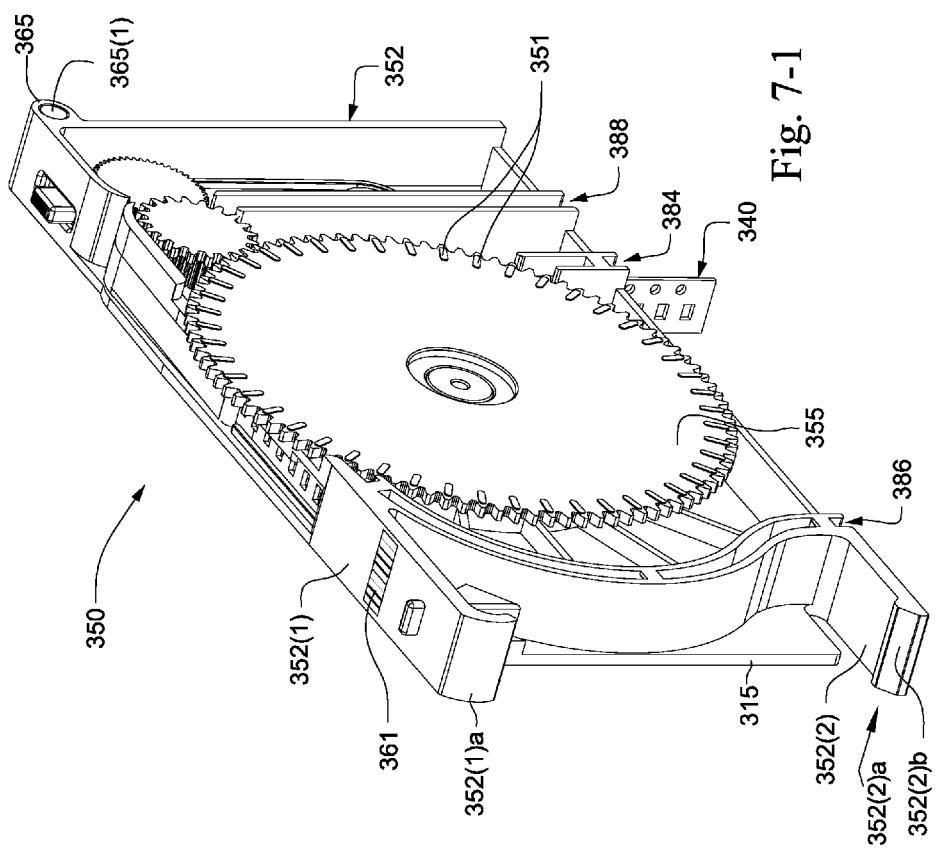

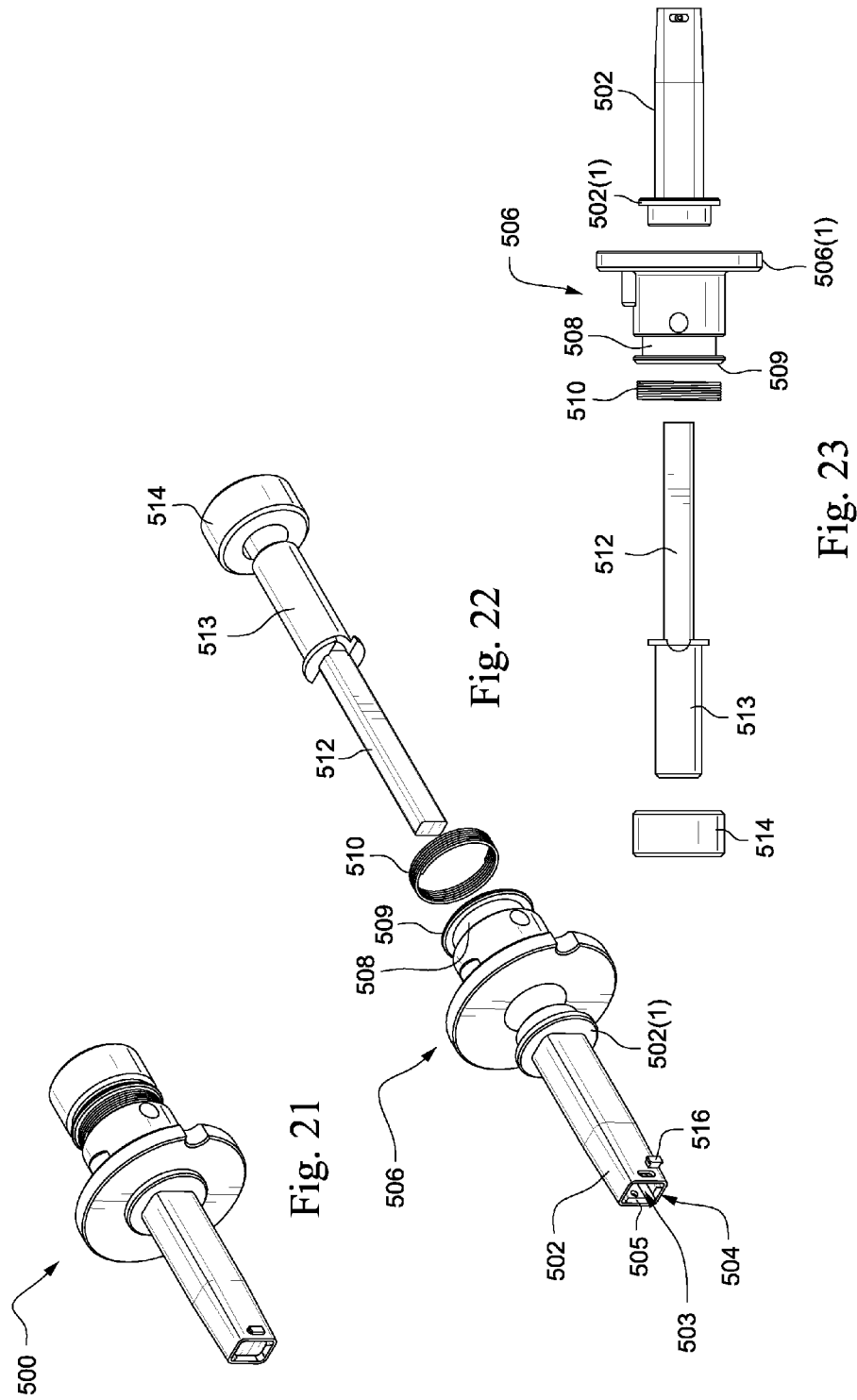

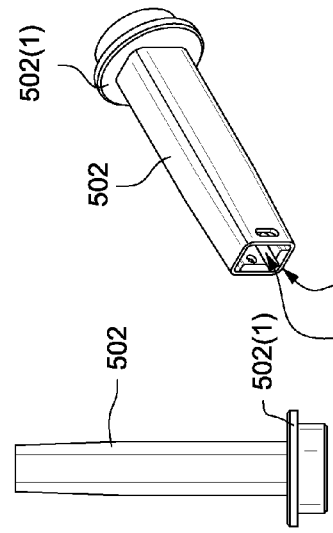
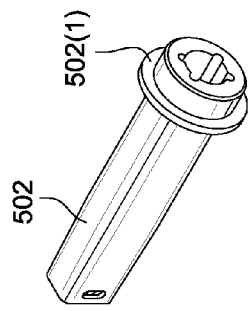
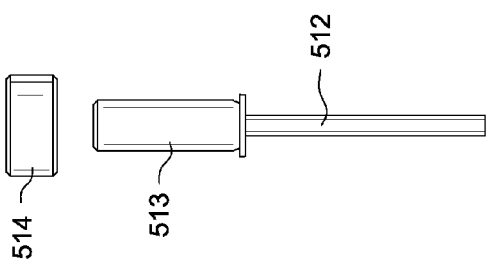
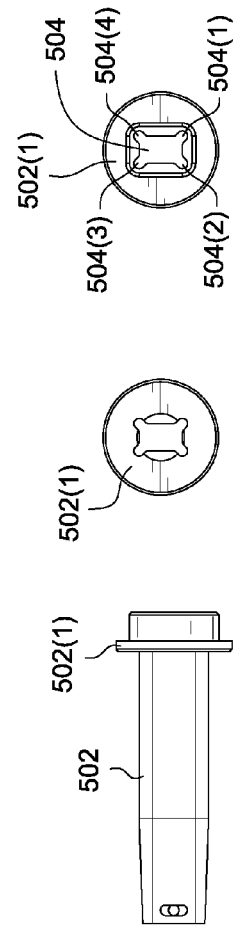
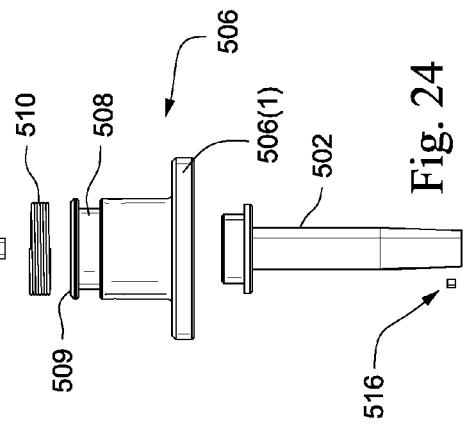

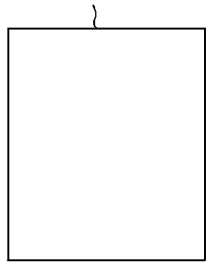
Image of substrate to be assembled into PCB
Fig. 38-1

Images of components to be placed onto substrate
Fig. 38-2

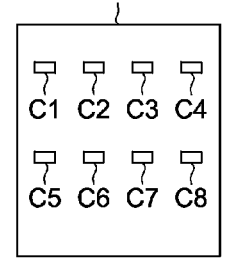
Component images overlaid onto substrate image (Virtual PCB)
Fig. 39

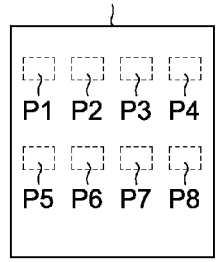
Graphical representation of a pre-defined PCB having placement locations P1 to P8
Fig. 40

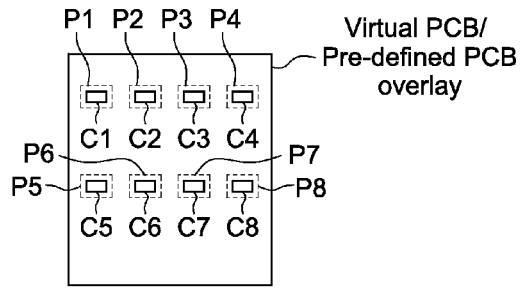
Virtual PCB/Pre-defined PCB overlay
Fig. 41

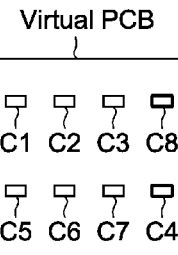
Virtual PCB
Fig. 42

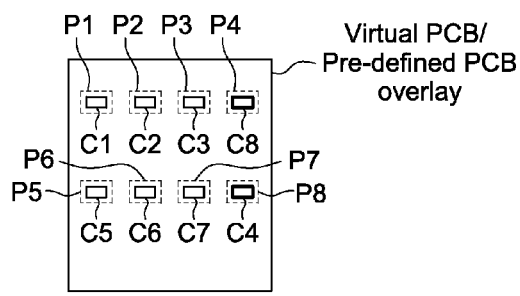
Virtual PCB/Pre-defined PCB overlay
Fig. 43

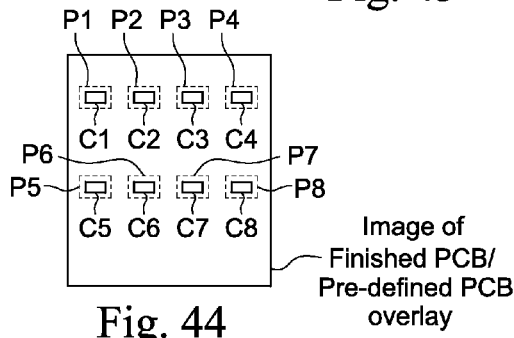
Image of Finished PCB/Pre-defined PCB overlay
Fig. 44

Finished PCB Inspection

| Component type | Images |
|---|---|
| 1 | □ □ □ □ ⌐⏌ ← misplaced component |
| 2 | □ □ □ □ ◇ ← misaligned component |
| | |

Fig. 45

| Required Components for PCB | | | |
|---|---|---|---|
| Component type | Quantity | X-Y coordinate locations | Number of components missing |
| 1 | 1 | 1,2 | — |
| 2 | 1 | 2,2 | — |
| 3 | 1 | 3,2 | 1 |
| 4 | 1 | 4,2 | — |
| | | | |

Fig. 46

AUTO-SETUP CONTROL PROCESS

CROSS-REFERENCE TO RELATED APPLICATIONS

This application is related to the following concurrently filed and commonly owned applications:

1. Ser. No. 13/837,727, filed Mar. 15, 2013, entitled: Passive Feeder Cartridge Driven by Pickup Head;
2. Ser. No. 13/838,075, filed Mar. 15, 2013, entitled: Linear/Angular Correction of Pick-and-Place Held Component and Related Optical Subsystem;
3. Ser. No. 13/838,416, filed Mar. 15, 2013, entitled: Mufti-Component Nozzle System;
4. Ser. No. 13/839,239, filed Mar. 15, 2013, entitled: Virtual Assembly and Product Inspection Control Processes; and
5. Ser. No. 13/839,790, filed Mar. 15, 2013, entitled: Pick-and-Place Feeder Module Assembly.

TECHNICAL FIELD

The present technology relates generally to the field of material handling, and more particularly to mechanisms and methods for transporting small articles from a first location to a second location, as might be involved during precise placement of components onto a printed circuit board.

BACKGROUND

Pickup, transport and precise placement of small articles normally includes use of a vacuum head for engaging and releasing the transported article. Such apparatuses are commonly referred to as pick and place mechanisms.

Some pick and place mechanisms include a pneumatic cylinder which drives a spindle mounting a vacuum head on a free end thereof. The spindle is advanced and retracted as required along its own axis, to pick up or place the articles (components), and is transported in a plane normal to the axis of the spindle to move the components from one location to another. Pneumatically operated devices are accompanied by substantial disadvantages inherent in pneumatic operation. Some drawbacks are the difficulty in monitoring the spindle position along its axis, and excessive size, particularly when the component is quite small.

Known pick and place mechanisms include, for example, U.S. Pat. No. 5,278,634 to Skunes, U.S. Pat. No. 6,145,901 to Rich, U.S. Pat. No. 4,860,438 to Chen, U.S. Pat. No. 4,595,335 to Takahashi, U.S. Pat. No. 4,151,945 to Ragard, U.S. Pat. No. 8,068,664 to Rudd and European patent application publication 0235045 A2 to Universal Instruments Corporation.

SUMMARY

One exemplary pick-and-place machine feeds components from a supply tape cartridge advanced by a feeder gear mechanically rotated by the pickup head, thus avoiding the need for the tape cartridge to have on-board power components. The pickup head includes a pickup device (e.g., a vacuum nozzle) to pick up components from the tape as well as a rack gear to engage and drive the feeder gear of the supply tape cartridge. The pickup head also places components accurately on a substrate such as a printed circuit board (PCB).

The exemplary pick-and-place machine may include a component camera cooperating with a collimated light source arranged to project collimated light towards a component held by the pickup device and a diffuser screen disposed between the component and the component camera such that a shadow image of the held component is projected onto the diffuser screen. A linear correction and an angular correction of the held component position are calculated in accordance with this shadow image on the diffuser screen.

An exemplary pickup nozzle has an elongated hollow portion, a stop slidably disposed within the hollow portion, and a vacuum source in fluid communication with the hollow portion. The hollow portion is configured to simultaneously accommodate a plurality of picked-up components as the internal stop is adjusted in the proximal direction. A component can be ejected from the hollow portion and onto a substrate as the internal stop is adjusted in the distal direction.

A computer program readable storage medium may store computer program code structures including executable instructions that control at least one computer processor programmed to control a pick-and-place machine in picking up components from a feeder cartridge and then precisely placing the components onto a substrate (e.g., to assemble a printed circuit board). At least one pickup device may be selectively installed on the pickup head under such program control. Thereafter, the pickup head may be controlled to advance a selected component supply tape. A multi-purpose camera also mounted on the pickup head may read readable information on each feeder cartridge to obtain location and/or identification information for each respective feeder component and use such data to better insure correct assembly of the printed circuit board in accordance with the detected location and identification information.

Computer program code instructions may also control at least one processor in virtually assembling a printed circuit board with a plurality of components to be provided on a substrate at predetermined locations. Individual images of the plurality of components are overlaid on an image of the substrate in accordance with the predetermined locations. An operator may confirm the location of each virtual component placement to insure the proper location of each feeder without actually consuming any components.

A substrate having a plurality of components provided thereon (e.g., held on the substrate with soldering paste) can also be inspected. An imaging device may capture an image of each component on the substrate and then group the images such that images of what is supposed to be the same component type are grouped together so that one may readily detect whether in fact the components installed on the substrate (a) are the same component type; (b) are the intended component; and/or (c) were installed with the correct orientation.

An exemplary feeder cartridge for a pick-and-place machine may include a feeder gear which acts to feed a tape through the feeder cartridge, wherein the feeder cartridge itself is without onboard provisions of electrical, mechanical or pneumatic power.

An exemplary feeder module for a pick-and-place machine may be interchangeable with other feeder modules in the pick-and-place machine to reduce setup time. A user may configure in a feeder module a group of feeder cartridges for a particular job (e.g., assembly of a certain board) and leave the feeder module undisturbed until the next time that particular board assembly is needed. Such modularity may allow a user to change jobs in a matter of seconds.

Other aspects, features, and advantages of the present technology will become apparent from the following detailed description when taken in conjunction with the accompanying drawings, which are a part of this disclosure and which illustrate, by way of example, different aspects of this technology.

BRIEF DESCRIPTION OF THE DRAWINGS

The accompanying drawings facilitate an understanding of various embodiments wherein:

FIG. 3-1 is a perspective view of an example feeder module of the pick-and-place machine of FIG. 1;

FIGS. 3-2a to 3-2e are various views of example feeder modules of the pick-and-place machine of FIG. 1;

FIG. 6 is a perspective view of an example removable feeder cartridge of the pick-and-place machine of FIG. 1;

FIG. 7-1 is another perspective view of the removable feeder cartridge of FIG. 6;

FIG. 7-2a is a perspective view of another example removable feeder cartridge of the pick-and-place machine of FIG. 1;

FIG. 7-2b is another perspective view of the removable feeder cartridge of FIG. 7-2a;

FIG. 11b is an exploded perspective view of the force sensing mechanism of FIG. 11a;

FIG. 11c is another exploded perspective view of the force sensing mechanism of FIG. 11a;

FIG. 21 is a perspective view of an example optional multi-component vacuum nozzle system for the pick-and-place machine of FIG. 1;

FIG. 22 is an exploded perspective view of the multi-component vacuum nozzle system of FIG. 21;

FIG. 23 is an exploded top view of the multi-component vacuum nozzle system of FIG. 21;

FIG. 24 an exploded bottom view of the multi-component vacuum nozzle system of FIG. 21;

FIGS. 25-30 are various views of a vacuum nozzle of the multi-component vacuum nozzle system of FIG. 21;

FIGS. 38-1 and 38-2 are example graphical representations of images of a substrate and components to be placed on the substrate;

FIG. 39 is a schematic representation of an example virtual PCB having the component images of FIG. 38-2 placed onto the substrate image of FIG. 38-1;

FIG. 40 is an example image representing a computer generated pre-defined PCB;

FIG. 41 is representative of an example computer generated image of the virtual printed circuit board of FIG. 39 overlaid onto the pre-defined PCB of FIG. 40;

FIG. 42 is an example schematic representation of a virtual PCB having some component images of FIG. 38-2 misplaced onto the substrate image of FIG. 38-1;

FIG. 43 is representative of a computer generated image of the virtual PCB of FIG. 42 overlaid onto the pre-defined PCB of FIG. 40;

FIG. 44 is representative of a computer generated image of a finished PCB image overlaid onto the pre-defined PCB of FIG. 40;

FIG. 45 is representative of an example operator display screen enabling finished product inspection;

FIG. 46 is representative of an example operator display screen providing information regarding components required for a PCB assembly;

DETAILED DESCRIPTION OF ILLUSTRATED EXAMPLES

The following description is provided in relation to several examples (most of which are illustrated) which may share some common characteristics and features. It is to be understood that one or more features of any one example may be combinable with one or more features of the other examples. In addition, any single feature or combination of features in any of the examples may constitute additional examples.

1.0 Pick-and-Place Machine

Figure 1:
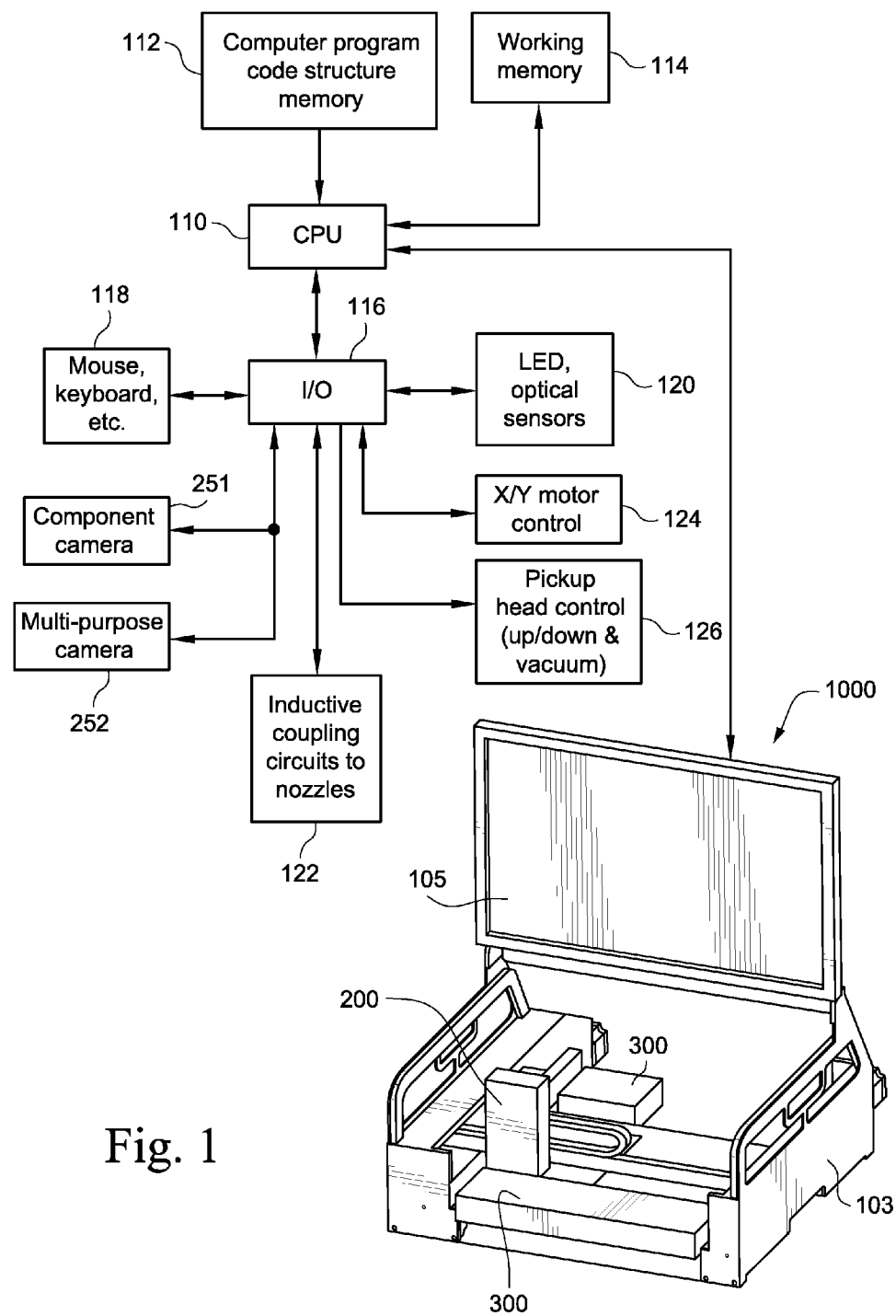
FIG. 1 is a perspective view of an example pick-and-place machine.

The example pick-and-place machine shown in FIG. 1 includes an outer frame 103 and a display 105 supported by the outer frame. The machine 1000 further includes a pick and place head 200 arranged to pick up a selected component from feeder cartridges within feeder modules 300 and accurately place the component on a substrate (e.g., a printed circuit board (PCB)) (not shown in FIG. 1) located there below and positioned in an area between the opposing groups of feeder modules 300. The display provides a convenient interface for a machine operator.

Computerized control circuits are shown schematically in FIG. 1 as including at least one central processing unit (CPU) 110 connected to execute computerized program code structures stored in memory 112 (e.g., possibly in conjunction with a suitable overarching operating system as those in the art will appreciate). Of course, CPU 110 also has access to any needed working memory 114, as well as suitable input/output (I/O) circuits 116. Indeed, display screen 105 may itself provide an I/O port for operators (e.g., using a touch sensitive screen). A mouse, keyboard and/or other conventional I/O devices 118 may also be provided as will be understood.

CPU 110 also has control of various light sources (e.g., LEDs) and optical sensors 120 distributed throughout the pick-and-place machine 1000 as will be described further below. In addition, the exemplary pick-and-place machine 1000 also has a multi-purpose camera 252 and a component camera 251 interfaced with CPU 110 and utilized as explained below. Inductive coupling circuits 122 are also interfaced with CPU 110 and utilized to control optical interfaces with vacuum nozzles as will be explained. X/Y motor control 124 is also coupled to the CPU 110, as are control circuits 126 for controlling up/down pickup head motion and vacuum on/off valve control to the pickup head vacuum nozzle.

Figure 2:
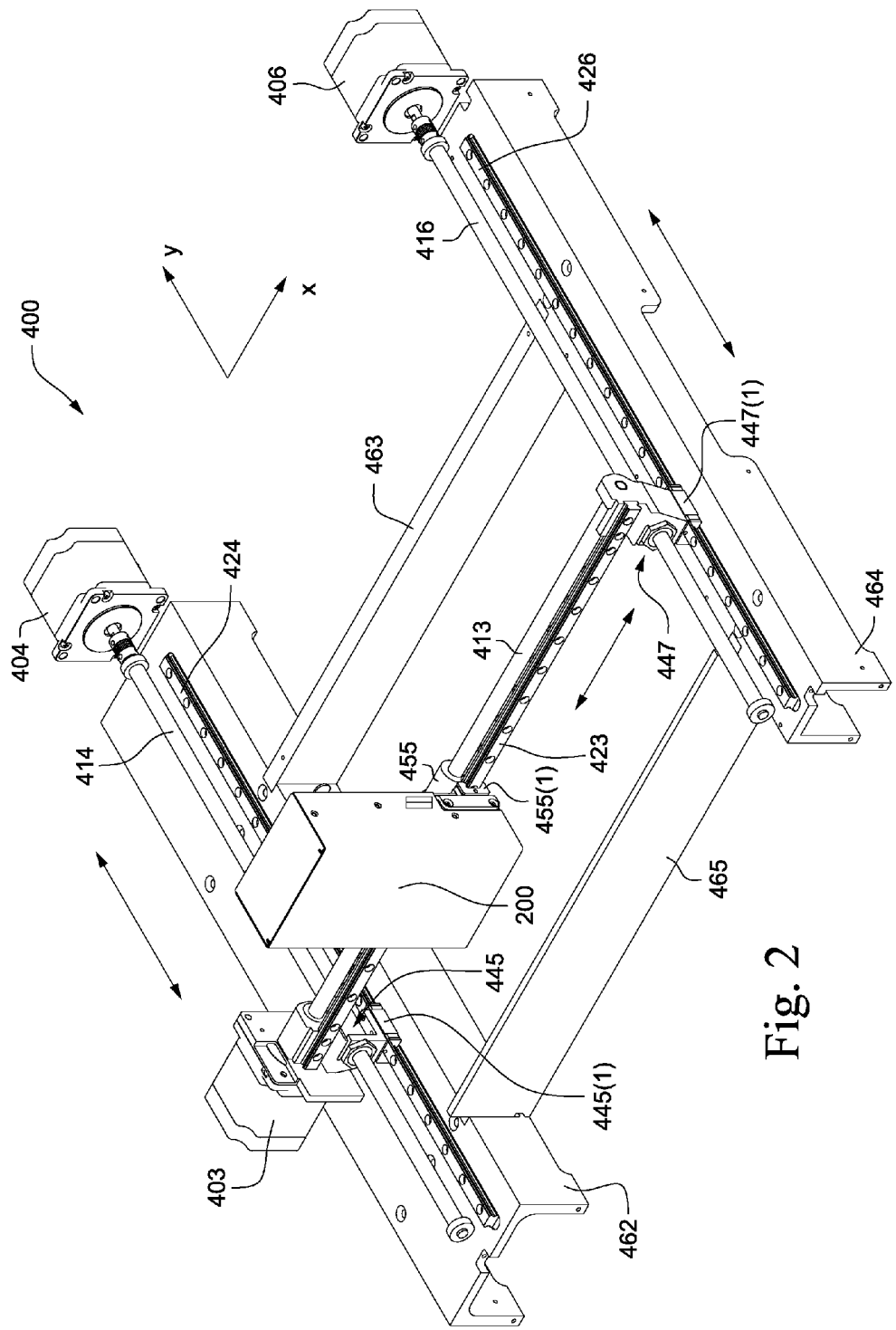
FIG. 2 is a perspective view of an example motion system of the pick-and-place machine of FIG. 1.

An X/Y motion system 400, shown in FIG. 2, is used to transport pick and place head 200 between feeder modules 300 and a desired underlying substrate location. Motion system 400 provides movement in both the X and Y directions, thereby enabling pickup head 200 to be positioned adjacent any desired component pick-up locations (i.e., feeder cartridges within feeder modules 300) and adjacent any desired placement locations on the substrate. Once the pickup head is positioned in the correct x-y coordinate location, a crank mechanism (described later) inside pickup head 200 quickly raises or lowers the pickup head vertically to either pick up or place components.

Pickup head 200 is attached to a slider 455(1) that traverses a rail 423 parallel to the X axis. A motor 403 rotates a screw shaft 413 that also extends in the X axis direction. A nut member 455 receives screw shaft 413 and is also attached to slider 455(1) such that rotation of motor 403 causes movement of nut member 455 along the screw shaft 413, thereby causing the pickup head to traverse the rail 423 in the X axis direction.

Rail 423 is attached at its ends to respective nut members 445, 447. Nut members 445, 447 are each in turn connected to respective sliders 445(1), 447(1). The sliders 445(1), 447(1) are arranged for movement along respective parallel rails 424, 426 which each extend in the Y axis direction. Two parallel screw shafts 414, 416 are arranged along the Y axis direction such that each one of screw shafts 414, 416 extends through a respective nut member 445, 447. Each screw shaft 414, 416 is connected to a respective motor 404, 406 such that synchronous rotation of motors 404, 406 causes synchronized movement of nut members 445, 447 along screw shafts 414, 416, thereby causing rail 423 (and therefore pickup head 200) to move in the Y axis direction.

Rails 424, 426 may be positioned on support members 462, 464 to provide a stable, sturdy base for the motion system 400. Further, stabilizers 463, 465 may extend between and connect support members 462, 464 to prevent relative movement between the support members.

Motors 403, 404, 406 may be conventional synchronized incrementally stepped servo motors using encoders for conventional position feedback to enable precise positioning of pickup head 200 in the X/Y directions.

1.1 Feeder System

Figures 1, 3:
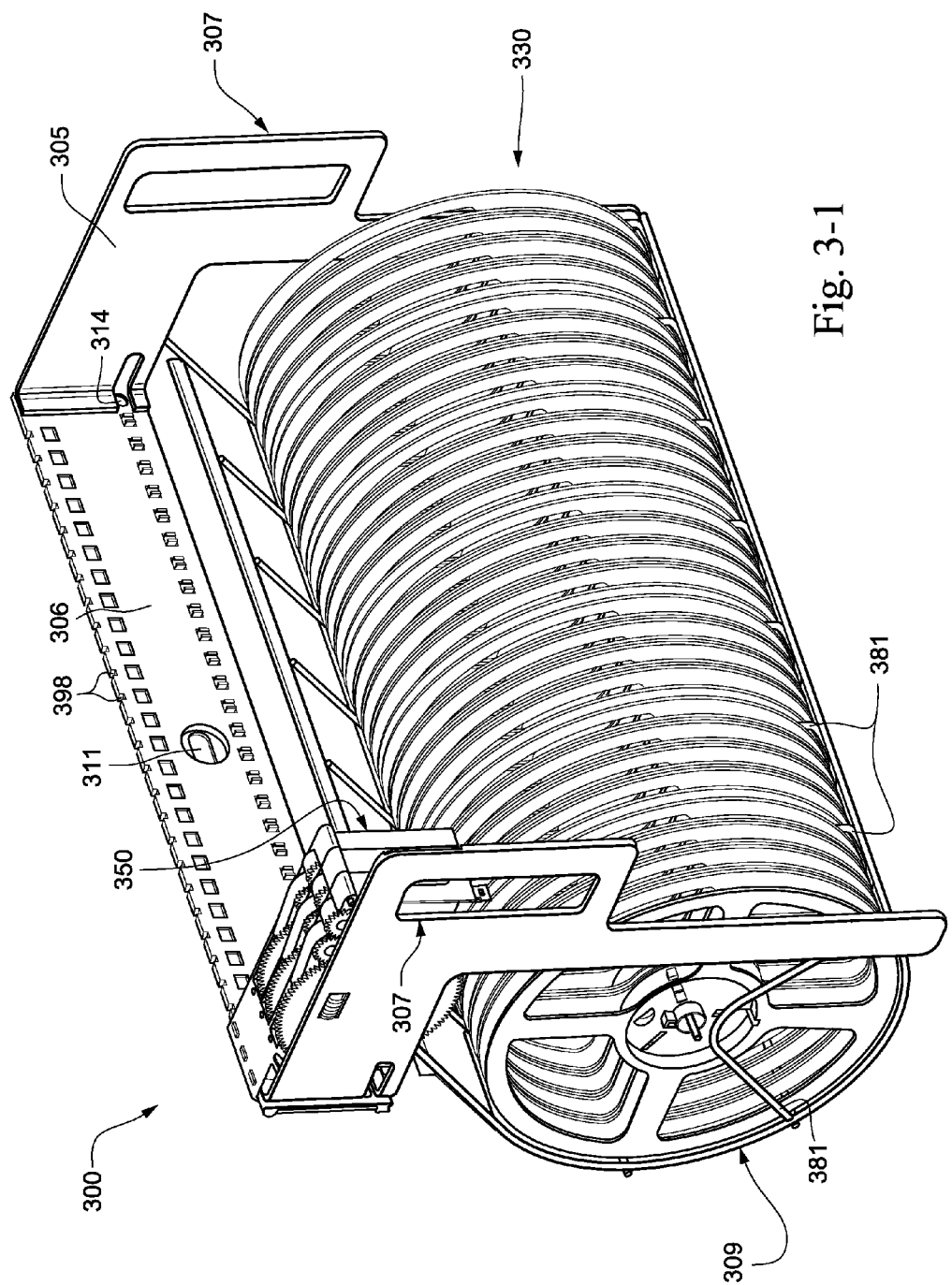
Figure 4:
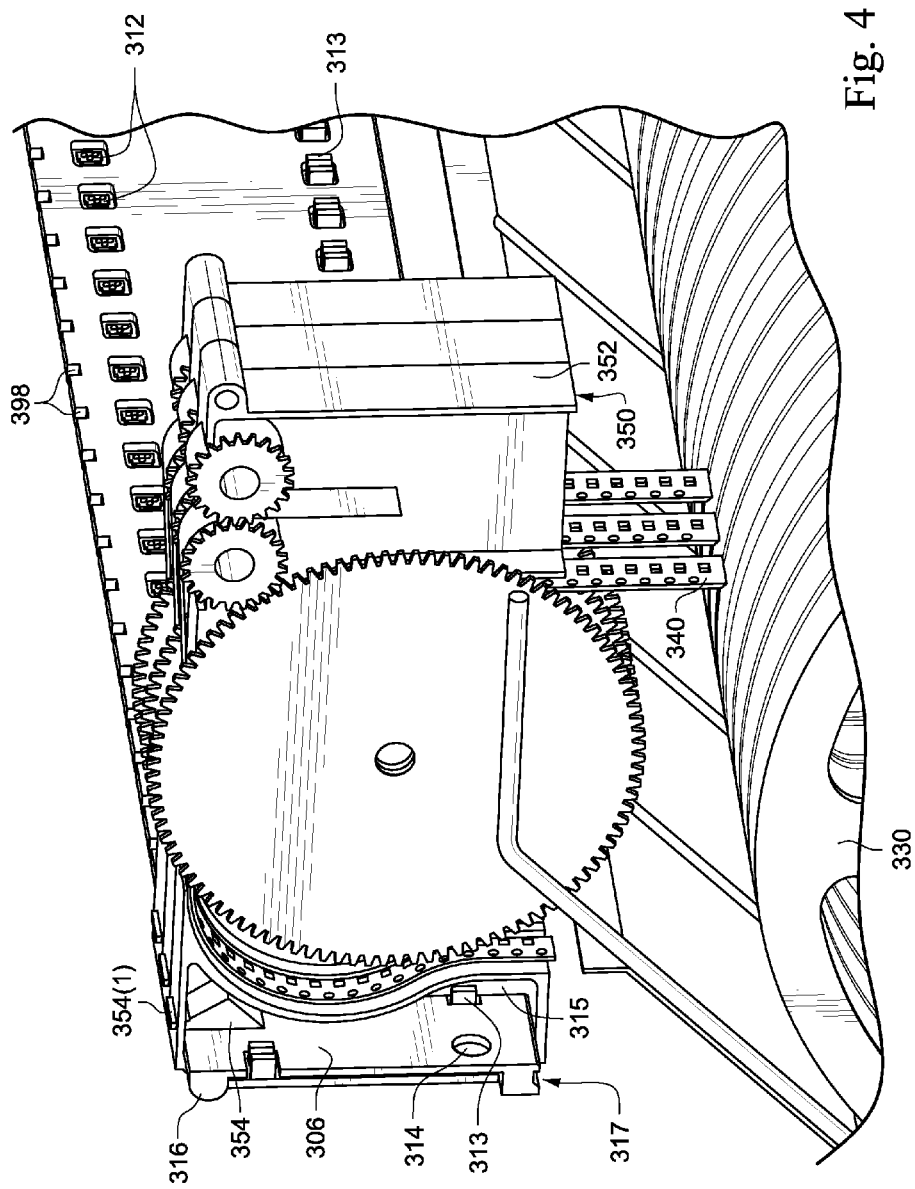
FIG. 4 is an enlarged detail of a portion of FIG. 3.

Now, with reference to FIGS. 3-10, an example feeder system will be described. A feeder module 300 is shown in FIG. 3. Feeder module 300 includes a frame 305 which supports a plurality of removable feeder cartridges 350, as best shown in FIG. 4. The feeder module frame includes two spaced-apart handle portions 307 and a front plate portion (or rail) 306 extending between handle portions 307. A reel-retaining portion 309 is positioned below the front plate portion 306. The reel-retaining portion 309 includes a curved section arranged to removably receive a plurality of tape-wound reels 330. Reel upright supports 381 may be slidably disposed in the reel-retaining portion 309 so provide support to reels 330 to aid in keeping the reels upright.

The handle portions 307 facilitate an operator in positioning the feeder module into, or removing the feeder module from, its operable position in the pick-and-place machine 1000. Feeder modules 300 are interchangeable. An aperture 314 in front plate portion 306 is arranged to receive an alignment pin (not shown) that protrudes from pick-and-place machine 1000. The alignment pin serves to properly align feeder module 300 in the machine. The opposing end of front plate portion 306 may also include an aperture 314, as shown in FIG. 4. Front plate portion 306 also includes a feeder module lock/ejection mechanism 311 configured to lock feeder module 300 to the pick-and-place machine, as shown in FIG. 3. The feeder module lock/ejection mechanism 311 may also be actuated to eject the feeder module 300 from the machine 1000. Further, a plurality of alignment slots 398 may be formed in and extend across a top portion of front plate 306 in a spaced arrangement, as shown in FIG. 3-1. Each alignment slot 398 is configured to engage a mating portion of a feeder cartridge 350. Alignments slots 398 serve to properly align and space feeder cartridges 350 in feeder module 300 which in turn ensures that feeder cartridges 350 are properly aligned in pick-and-place machine 1000. A plurality of feeder modules 300 may be positioned in the machine at any given time.

Alignment slots 398 may be spaced apart by 0.25 inches. A typical 8 mm tape feeder cartridge has a width of 0.5 inches, while 12 mm and 16 mm tape feeder cartridges have a width of 0.75 mm. Thus, by spacing the alignment slots 0.25 inches apart, 8 mm, 12 mm and 16 mm tape feeder cartridges can be accommodated without gaps or wasted spaced between the feeder cartridges.

The modular arrangement of feeder module 300 facilitates quick setup time. For instance, a user can configure in a feeder module 300 a group of feeder cartridges 350 for a particular job (e.g., assembly of a certain board). Feeder module 300 may be left undisturbed until the next time that particular board assembly is needed. Cost impediments to such strategy are removed by the relatively low cost of feeder cartridge 350, which is constructed from relatively inexpensive materials and designed without onboard provisions for power (as described below). In other words, a user can own significantly more feeder cartridges 350 as compared to conventional feeders without adding significantly to the cost of pick-and-place machine 1000. A user may even dedicate a feeder cartridge for each tape-wound reel 330. Feeder module 300 may accommodate up to 40 feeder cartridges, which may provide sufficient capacity for complex assemblies while also facilitating portability. However, feeder module 300 may be configured to accommodate more than 40 feeder cartridges depending on need.

Figures 2A, 3:
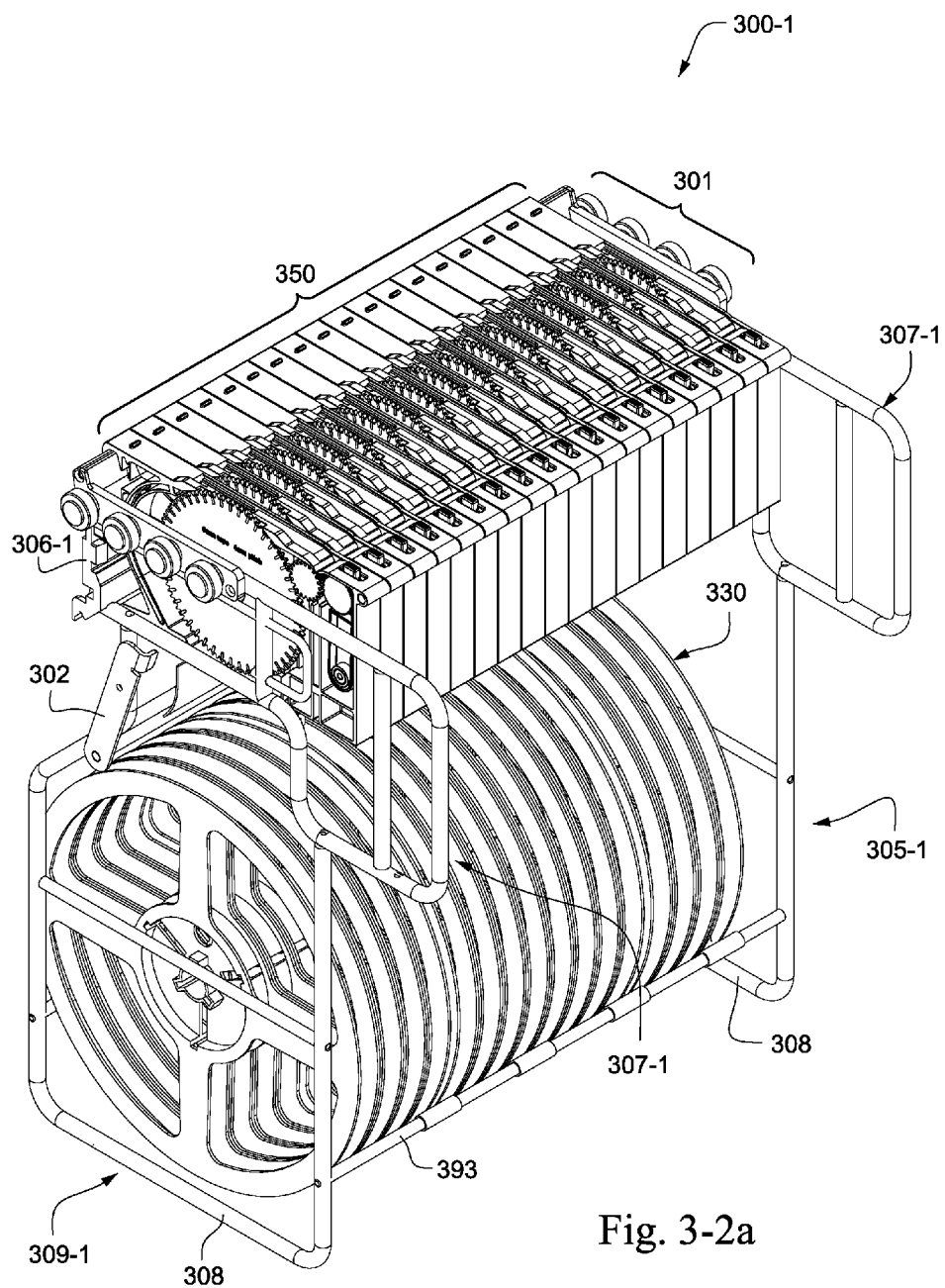
Figures 2B, 3:
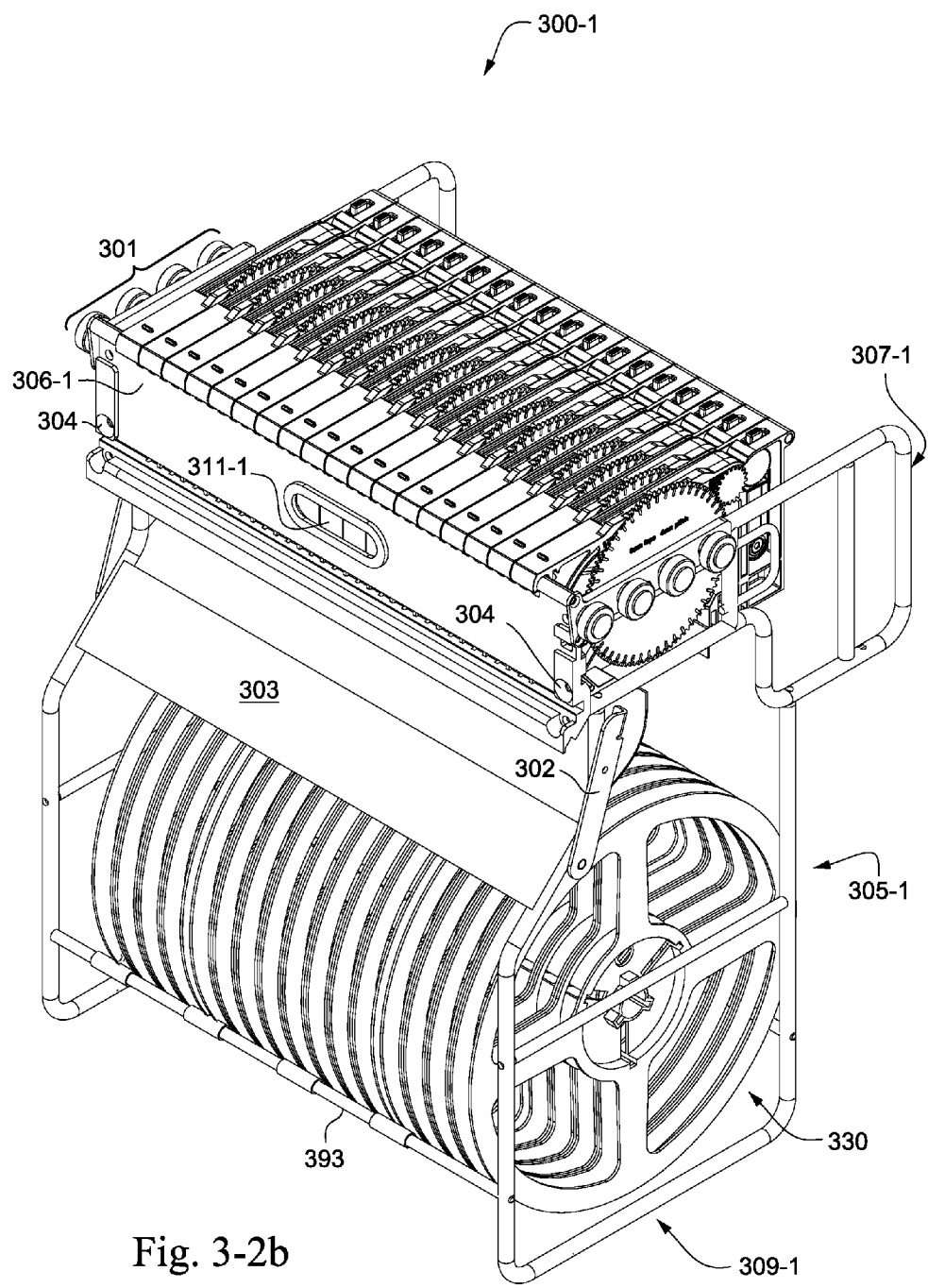
Figures 2C, 3:
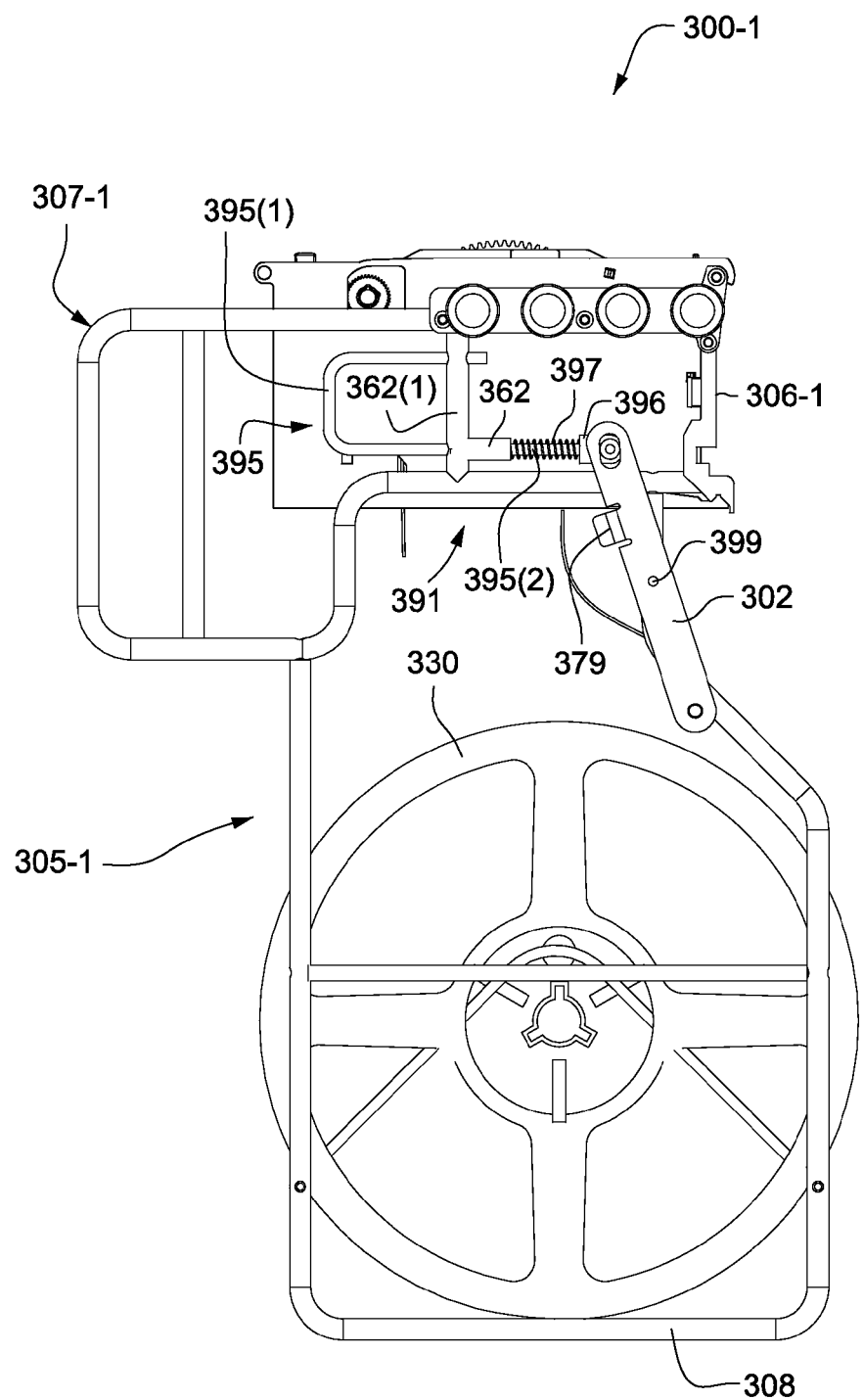
Figures 2D, 3:
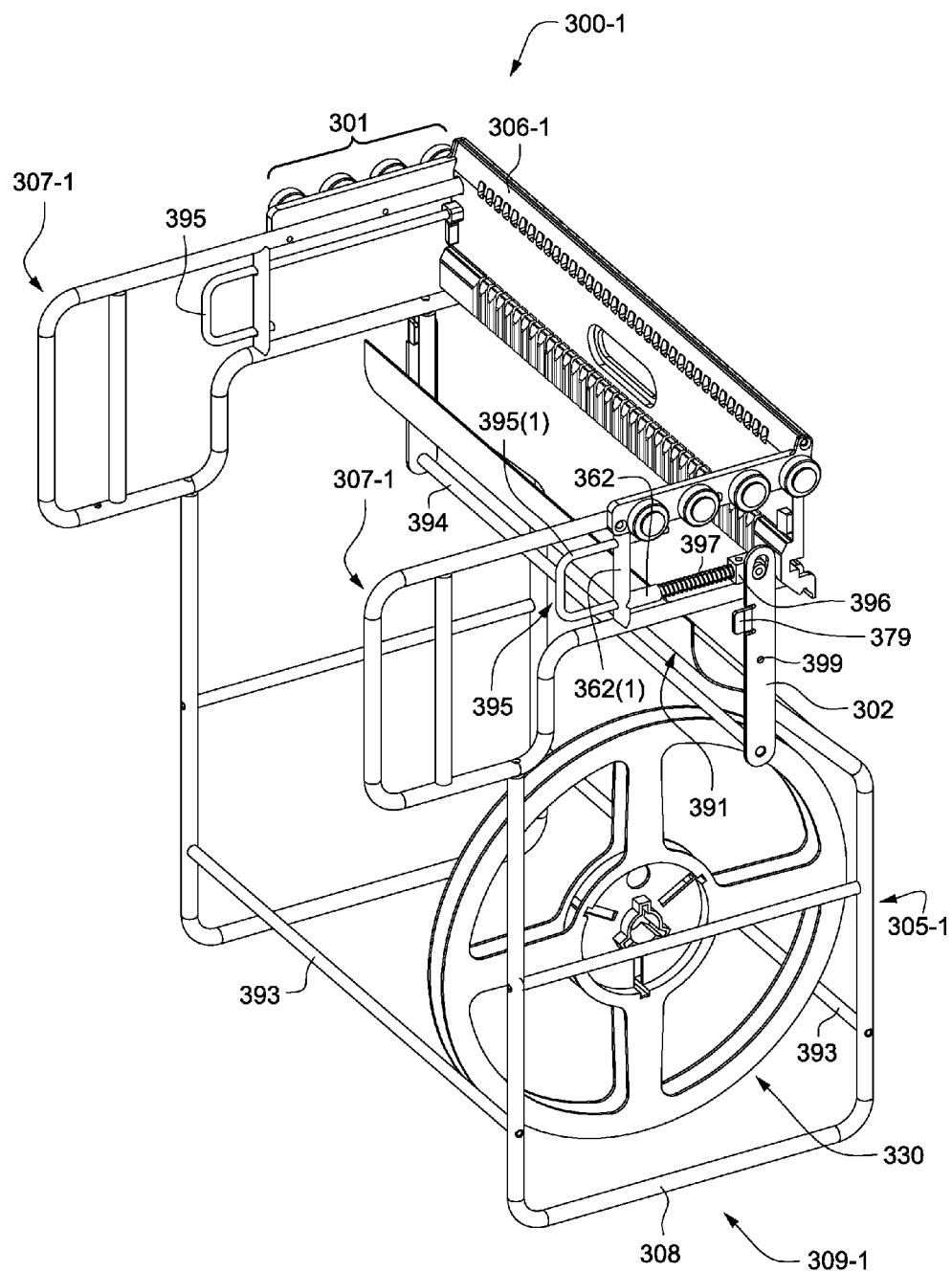
Figures 2E, 3:
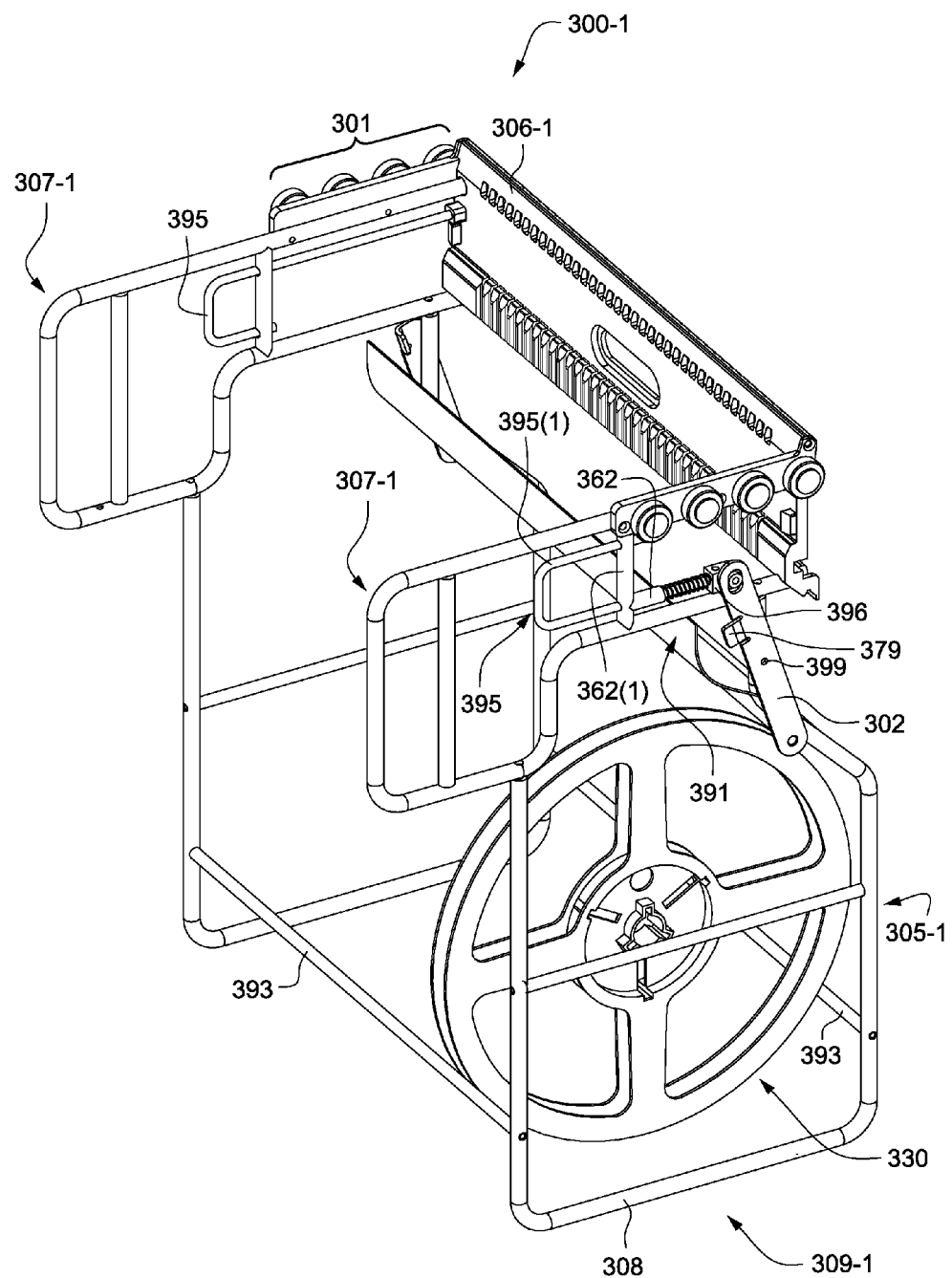

An alternative feeder module 300-1 is shown in FIGS. 3-2a to 3-2e. Feeder module 300-1 includes a frame 305-1 which supports a plurality of removable feeder cartridges 350, as best shown in FIGS. 3-2a and 3-2b. Frame 305-1 includes two spaced-apart handle portions 307-1, a front plate portion 306-1 extending between handle portions 307-1 and foot portions 308 to engage a surface on which the feeder module is positioned. A reel-retaining portion 309-1 is positioned below the front plate portion 306-1 to accommodate tape-wound reels 330 below feeder cartridges 350. Feeder module lock/ejection mechanism 311-1 may be configured to lock feeder module 300-1 to the pick-and-place machine. Frame 305-1 may be constructed from steel rod or other suitable materials. Front plate portion 306-1 may be formed from aluminum or other suitable materials.

Reel-retaining portion 309-1 may include support members (e.g., a pair of spaced support members 393 (e.g., a pair of rods)) to support reels 330, as best shown in FIG. 3-2d. Support members 393 may be spaced apart by a distance relatively close to but smaller than a diameter of reels 330. This arrangement prevents reels 330 from dropping through a space between support members 393 while also containing the reels in stable engagement with the support members.

Feeder module 300-1 may include a locking device 391 to lock reels 330 in position in reel-retaining portion 309-1. Locking device 391 may include a locking member 394 (e.g., a rod or bar) positioned near a top portion of reels 330, a pair of triggers 395 on opposite ends of the feeder module to actuate the locking device, a pair of sleeves 362, a pair of springs 397 (e.g., a helical spring), and a pair of pivot arms 302 connecting locking member 394 to a respective trigger 395, as shown in FIG. 3-2d. Each trigger 395 may include an actuating portion 395(1) (e.g., a user engaging portion such as a U-shaped member configured to be displaced (e.g., by pulling) or otherwise actuated by the user) and an operating portion 395(2) (e.g., an elongate portion configured to transfer movement of actuating portion 395(1) to rotate arm 302 about pivot 399.

Locking member 394 may be connected to first end portions of pivot arms 302. Second end portions of pivot arms 302 may be rotatably connected to respective operating portions 395(2) via an optional block 396 as those skilled in the art will understand. Each helical spring 397 may extend between block 396 and sleeve 362 such that operating portion 395(2) extends through an inner portion of the helical spring. By this arrangement, spring 397 urges block 396 (and thus the second end portion of pivot arm 302 away from sleeve 362 (and toward front plate portion 306-1) thereby causing operating portion 395(2) to move toward front plate portion 306-1 and into an inserted position. When operating portion 395(2) is urged towards the front plate portion, locking member 394 is moved into a locking position, as shown in FIG. 3-2d. In the locking position, locking member 394 is positioned above reels 330 and relative to support member 393 such that the reels are prevented (by locking member 394) from being moved upward enough to clear the support members. Thus, reels 330 are locked inside reel-retaining portion 309-1 when locking member 394 is in the locked position shown in FIG. 3-2d.

Reels 330 may be easily inserted into reel-retaining portion 309-1 by pressing each reel against locking member 394 (when in the locked position) until locking member 394 is displaced against a restoring force of spring 397 a sufficient distance (FIG. 3-2e) that the reel is positioned in place in reel-retaining portion 309-1 and locking member 394 snaps back into its locked position (FIG. 3-2d). A bent tab 379 prevents pivot arm 302 from pivoting past a vertical position thereby preventing reels from being removed by forceful pulling. Reels 330 are locked in reel-retaining portion 309-1 in a manner that allows rotation of reels 330 as tape 340 is fed through feeder cartridges 350. That is, the reels, which, e.g., are formed of plastic, may slide against support members 393 and/or locking member 394.

A user may pull trigger 395 away from front plate portion 306-1 against a restoring force of spring 397 to cause locking member 394 to be moved to the unlocked position shown in FIG. 3-2e in order to remove reels 330 from reel-retaining portion 309-1.

It is noted that sleeve 362 may include an upright portion 362(1). In another example, the spring 397 may extend between the upright portion 361(2) and pivot arm 302 (e.g., via block 396). Those skilled in the art will understand and recognize that there are other suitable arrangements for arranging spring 397 in locking device 391. Furthermore, other suitable locking arrangements may be used to secure reels 330 in feeder module 300-1.

As shown in FIG. 3-2b, guide member 303 may extend between feeder cartridges 350 and reels 330 to guide the used tape 340 away from the reels so that the used tape does not get tangled in the reels.

Feeder module 300-1 may include rollers 301 configured to engage a surface of pick-and-place machine 1000 to facilitate insertion of the feeder module into an operative position in the pick-and-place machine. Apertures 304 (e.g., tapered bores) may be disposed at opposite end portions of the feeder module, as shown in FIG. 3-2b. Apertures 304 may be configured to receive a mating pin on pick-and-place machine 1000 to align the feeder module in the pick-and-place machine.

As shown in FIG. 4, a plurality of removable feeder cartridges 350 are mounted on front plate portion 306 of feeder module 300. A tape 340 from each reel 330 is fed through a respective feeder cartridge 350. Components to be placed on the substrate are contained on and/or in tape 340. Feeder cartridges 350 serve to feed the component-bearing tape to a component pick-up location where the components are exposed for pick-up by pickup head 200. Feeder cartridges 350 are passive devices (as will be described in more detail later) having no onboard provisions for power (e.g., electrical, mechanical or pneumatic power). Tape 340 may have any suitable width as needed for a given component size (e.g., 8, 12, 16, 24 mm or more).

The front plate portion 306 of frame 305 includes a first attachment device (e.g., a protuberance 316, e.g., a rounded protuberance) along a top edge portion thereof and a second attachment device (e.g., a recess 317) along a bottom edge. It is noted that the first and second attachment devices may be partitioned (or otherwise divided) and thus each configured as a plurality of first attachment devices and a plurality of second attachment devices corresponding to a respective feeder cartridge. As mentioned above, alignment slots 398 are formed in an upper portion of front plate portion 306. In an example, the alignment slots may be at least partially formed in protuberance 316. Protuberance 316 and recess 317 facilitate attachment of a feeder cartridge 350 to front plate portion 306.

Figure 5:
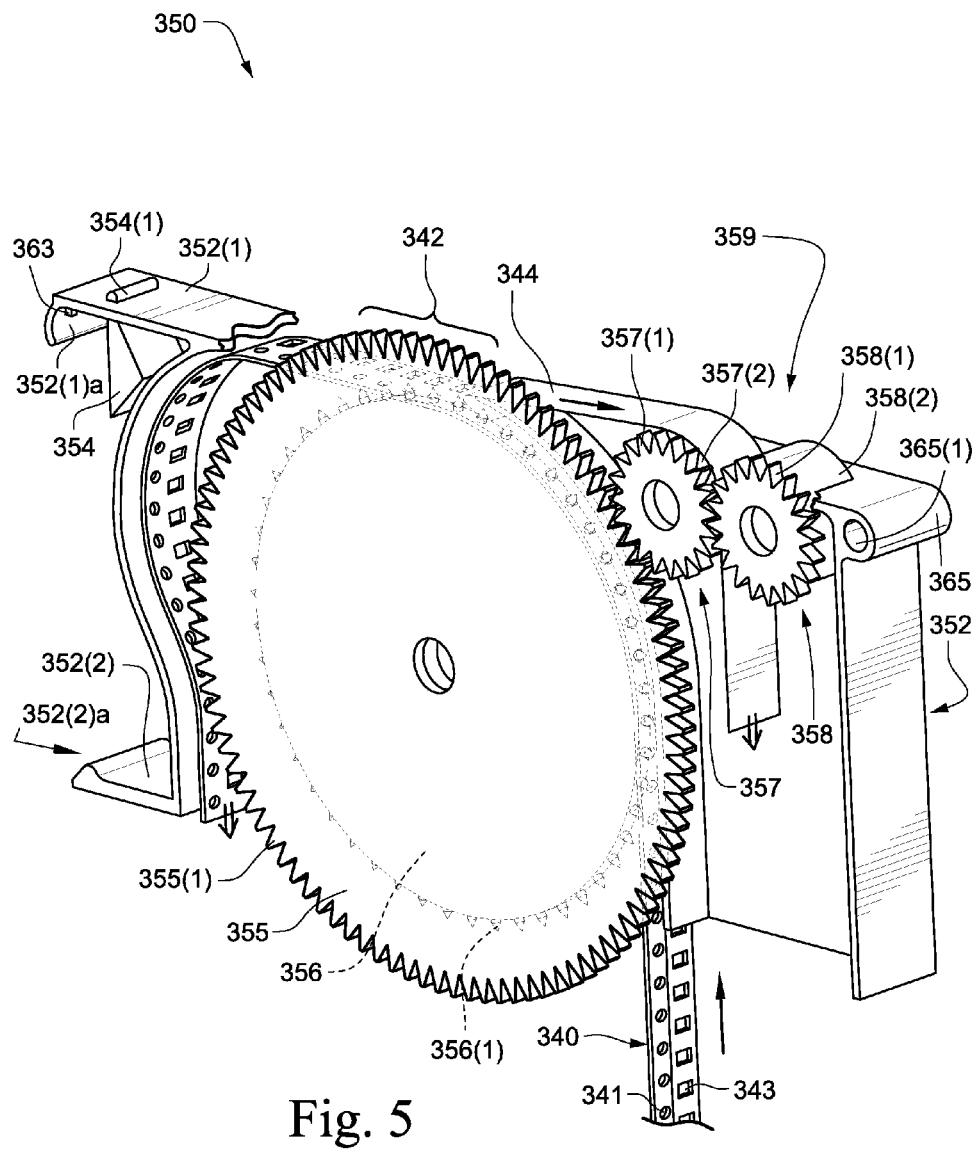
FIG. 5 shows an example removable feeder cartridge of the pick-and-place machine of FIG. 1.
Figures 2A, 7:
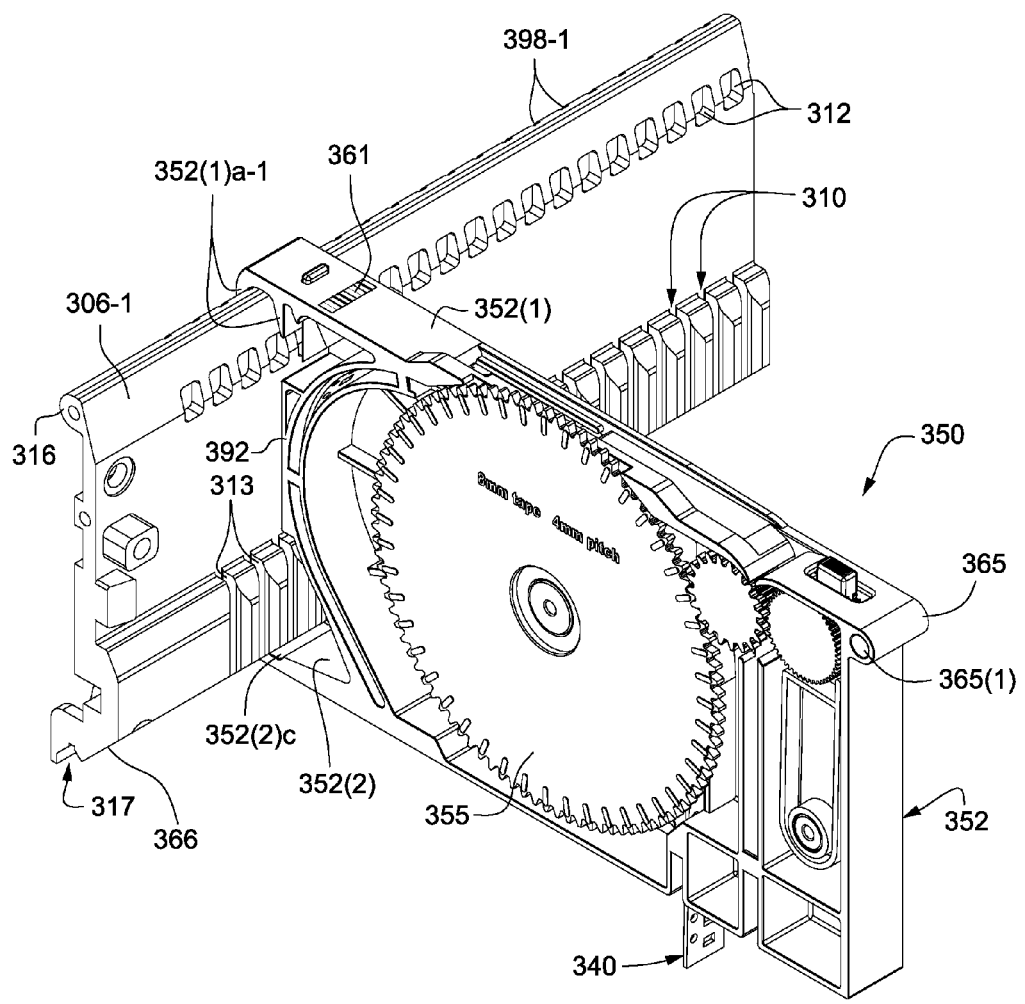
Figures 2B, 7:
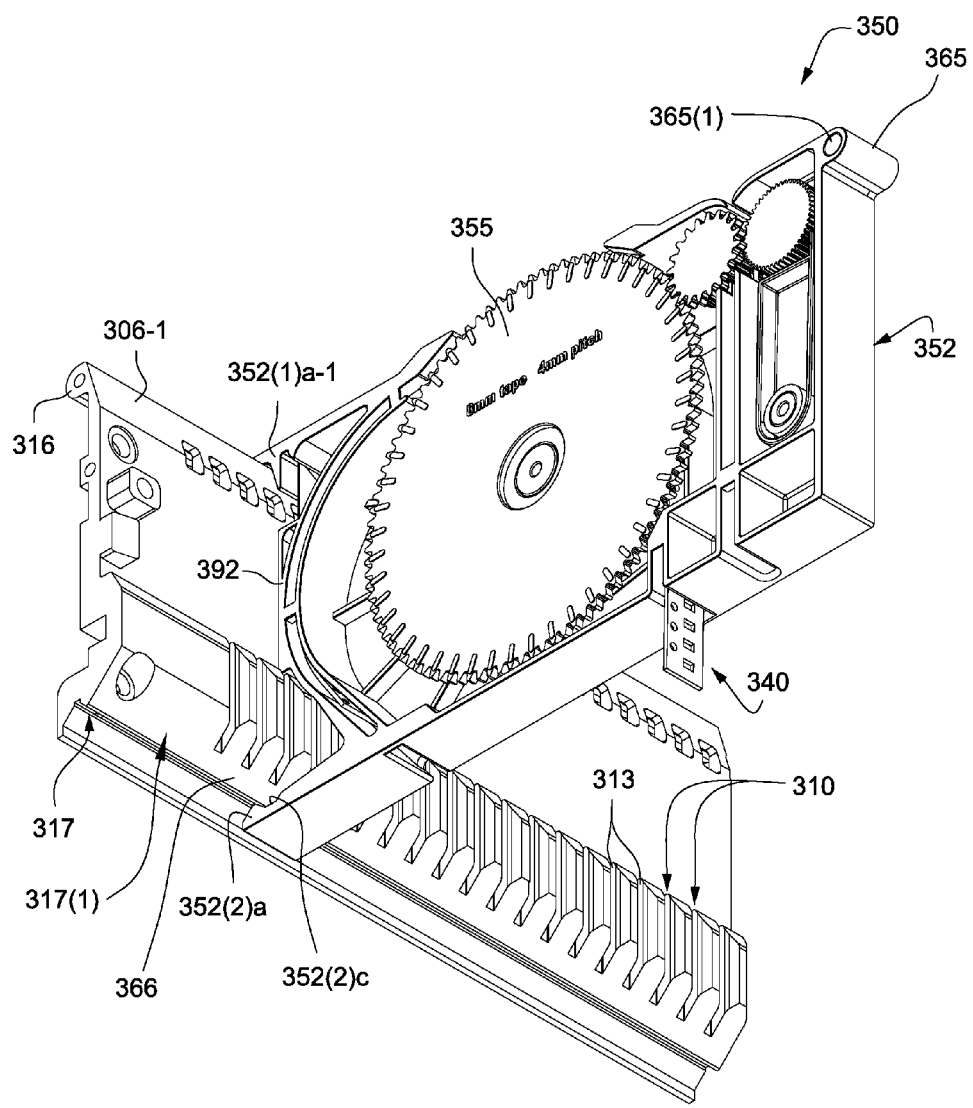

As best shown in FIG. 5, a body portion 352 of the feeder cartridge includes an upper attachment portion 352(1) which terminates in a first connecting device (e.g., receiving portion 352(1)a). Upper attachment portion 352(1) includes alignment protrusion 363 on an inner surface thereof. Alignment protrusion 363 may be configured with a shape that mates with alignment slots 398. Referring to FIG. 7-1, body portion 352 includes a lower attachment portion 352(2) having a second connecting device (e.g., projection 352(2)a) extending across an end portion thereof. Projection 352(2)a has an inclined or tapered surface 352(2)b.

To mount feeder cartridge 350 to frame 305, upper attachment portion 352(1) may be placed over front plate portion 306 such that alignment protrusion 363 fits into a respective alignment slot 398 thereby positioning receiving portion 352(1)a around protuberance 316. A user may then press down upon knob 365 which causes inclined surface 352(2)b to engage front plate portion 306 (e.g., locating member 3170)) which in turn causes lower attachment portion 352(2) to flex so as to cause projection 352(2)a to snap into recess 317 of front plate portion 306. The snap-fit arrangement of lower attachment portion 352(2) and recess 317 provides ease of installation. By this arrangement, feeder cartridge 350 is supported at only one end by the front plate portion 306 of feeder module 300 thereby forming a cantilever. This arrangement allows for compact feeder cartridge and reel packaging. The cantilever mounting of feeder cartridge 350 allows access to a bottom portion of the feeder cartridge. Therefore, reels 330 may be mounted below the feeder cartridges and the tape 340 from each reel may be fed to a bottom portion of a respective feeder cartridge. Providing the feeder cartridges and the reels in a stacked arrangement helps reduce the footprint of the feeder module. In another example, feeder cartridge 350 may be connected directly to pick-and-place machine 1000 in the manner of a cantilever. Preferably, receiving portion 352(1)a and the protuberance have mating shapes.

An example snap-fit arrangement may be described as "a mechanical joint system where part-to-part attachment is accomplished with locating and locking features (constraint features) that are homogenous with one or the other of the components being joined. Joining requires the (flexible) locking features to move aside for engagement with the mating part, followed by return of the locking feature toward its original position to accomplish the interference required to latch the components together. Locator features, the second type of constraint feature, are inflexible, providing strength and stability in the attachment." *The First Snap-Fit Handbook*, Bonenberger, 2000.

To remove a feeder cartridge, a user may simply push upwardly upon knob 365 which causes front plate portion 306 to exert a force against lower attachment portion 352(2) which in turn causes the lower attachment portion to flex such that projection 352(2)a becomes disengaged with recess 317.

Referring to FIGS. 5 to 7-2b, a channel 365(1) is formed in knob 365 such that an anti-tamper device may be fed through a group of feeder cartridges. This allows a group of feeder cartridges 355 (e.g., grouped in a particular feeder module for assembly of a certain board) to be "put on the shelf" until the next time they are needed while ensuring that the grouping of feeder cartridges is not changed.

Pick-and-place machine 1000 may include a detection device (e.g., an optical interrupter 313 provided on front plate portion 306) to detect the presence of feeder cartridge 350 in a properly installed position. Optical interrupter 313 includes spaced light emitting and light detecting portions as one skilled in the art will understand. A protruding portion 315 of body portion 352 is positioned to block the light transmission of optical interrupter 313 (thus triggering the optical interrupter) when feeder cartridge 350 has been inserted far enough that projection 352(2)a snaps into recess 317, thus confirming proper attachment of feeder cartridge 350 to front plate portion 306. A feeder cartridge 350 that is not inserted completely may have a raised position which may interfere with the pickup head. By the above described arrangement, feeder cartridge 350 will snap into place and be consistently positioned with respect to front plate portion 306 each time the feeder cartridge is connected to the front plate portion.

Optical interrupter 313 may be used to determine when a feeder cartridge 350 has been removed or when a new feeder cartridge has been added. As will be described later, the addition of a new feeder cartridge 350 may prompt pick-and-place machine 1000 to acquire information from the feeder cartridge.

Figure 9:
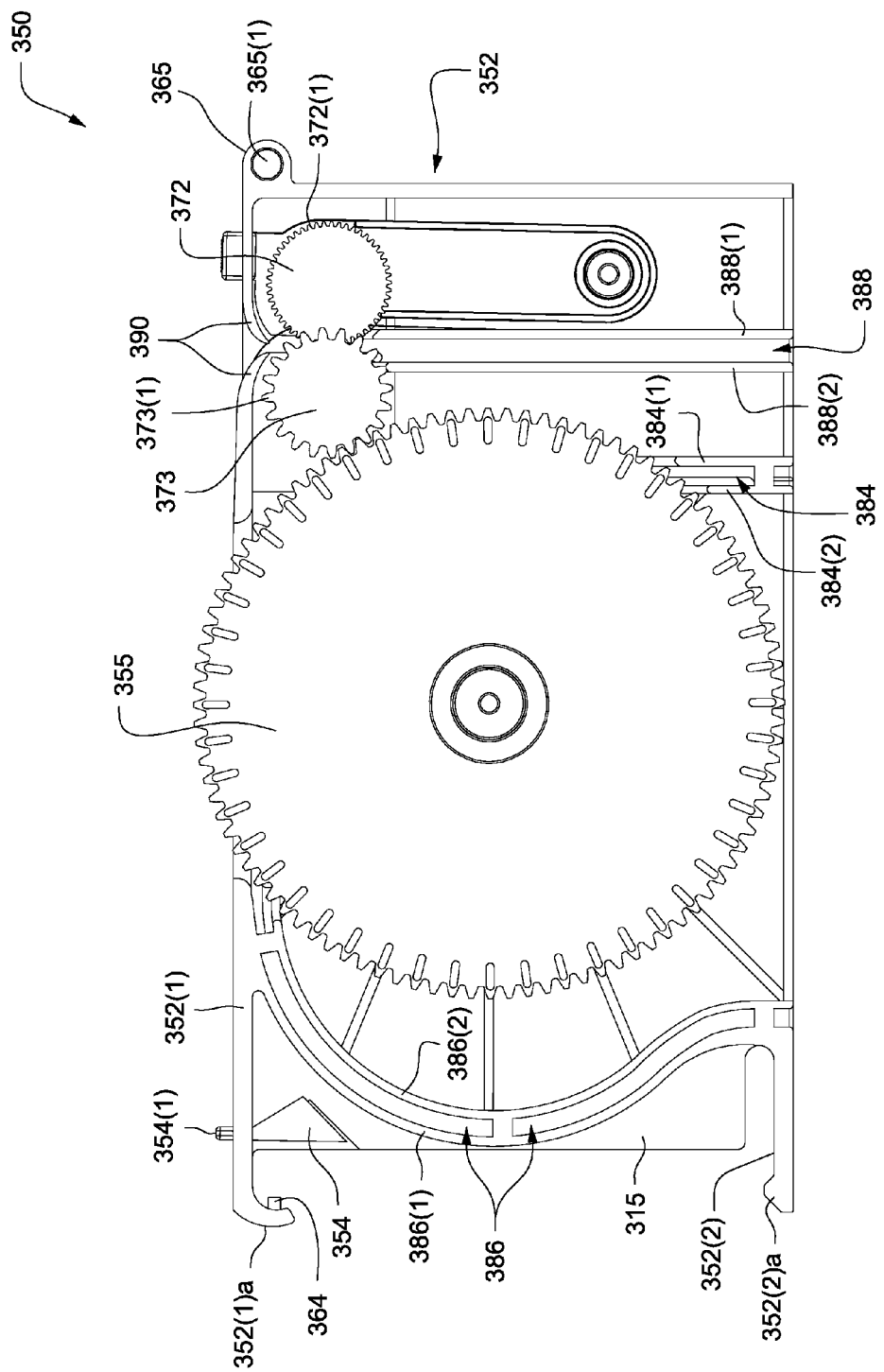
FIG. 9 is a side view of the removable feeder cartridge of FIG. 6.

In an alternative example shown in FIGS. 7-2a and 7-2b, front plate portion 306-1 may include a series of spaced guide channels 310 for receiving protruding portion 315 of feeder cartridges 350. Each guide channel 310 corresponds to a respective alignment slot 398-1 and will further ensure that each feeder cartridge 350 is properly aligned in pick-and-place machine 1000. As shown in FIG. 9, upper attachment portion 352(1) may include a protrusion 364 to mate with alignment slots 398-1 on front plate portion 306-1. Optical interrupter 313 may be disposed within guide channel 310. Further, front plate portion 306-1 may include an inclined surface 366 upon which inclined surface 352(2)b of projection 352(2)a may engage to facilitate attachment of feeder cartridge to front plate portion 306-1. That is, in referring to FIG. 7-2b, as the user pushes downwardly on knob 365, feeder cartridge 350 rotates in a clockwise direction as inclined surface 352(2)b slides against inclined surface 366 until projection 352(2)a snaps into recess 317. Additionally, as shown in FIGS. 7-2a and 7-2b, lower attachment portion 352(2) may include a recessed portion to form a more pronounced catch 352(2)c to accommodate locating member 317(1).

Body portion 352 may further include a stabilizing portion 392 disposed between upper attachment portion 352(1) and lower attachment portion 352(2) and configured to engage front plate portion 306-1 to stabilize feeder cartridge 350. Stabilizing portion 392 may contact an engaging portion of front plate portion 306-1 disposed between protuberance 316 and recess 317. Stabilizing portion 392 may include an extended flat portion configured to engage a flat portion of front plate portion 306-1 for stabilizing the feeder cartridge by limiting movement between feeder cartridge 350 and front plate portion 306-1. Those skilled in the art will recognize that other mating surfaces may be used to limit movement. Receiving portion 352(1)a-1 may include an extending portion configured to engage a surface of front plate portion 306-1 opposite protuberance 316.

Referring to FIG. 5, tape 340 includes a plurality of sprocket holes 341, a plurality of component pockets 343 to accommodate components (not shown), and a cover film 344 to contain the components in pockets 343 until they are to be exposed for pickup. The cover film may be a thin transparent film lightly glued or heat sealed to tape 340 and/or the components. As tape 340 is advanced through feeder cartridge 350, a cover film drive assembly 359 peels the cover film from tape 340 (e.g., see motion arrows on tape 340 in FIG. 5) to expose the components across a pickup zone 342.

Figure 10:
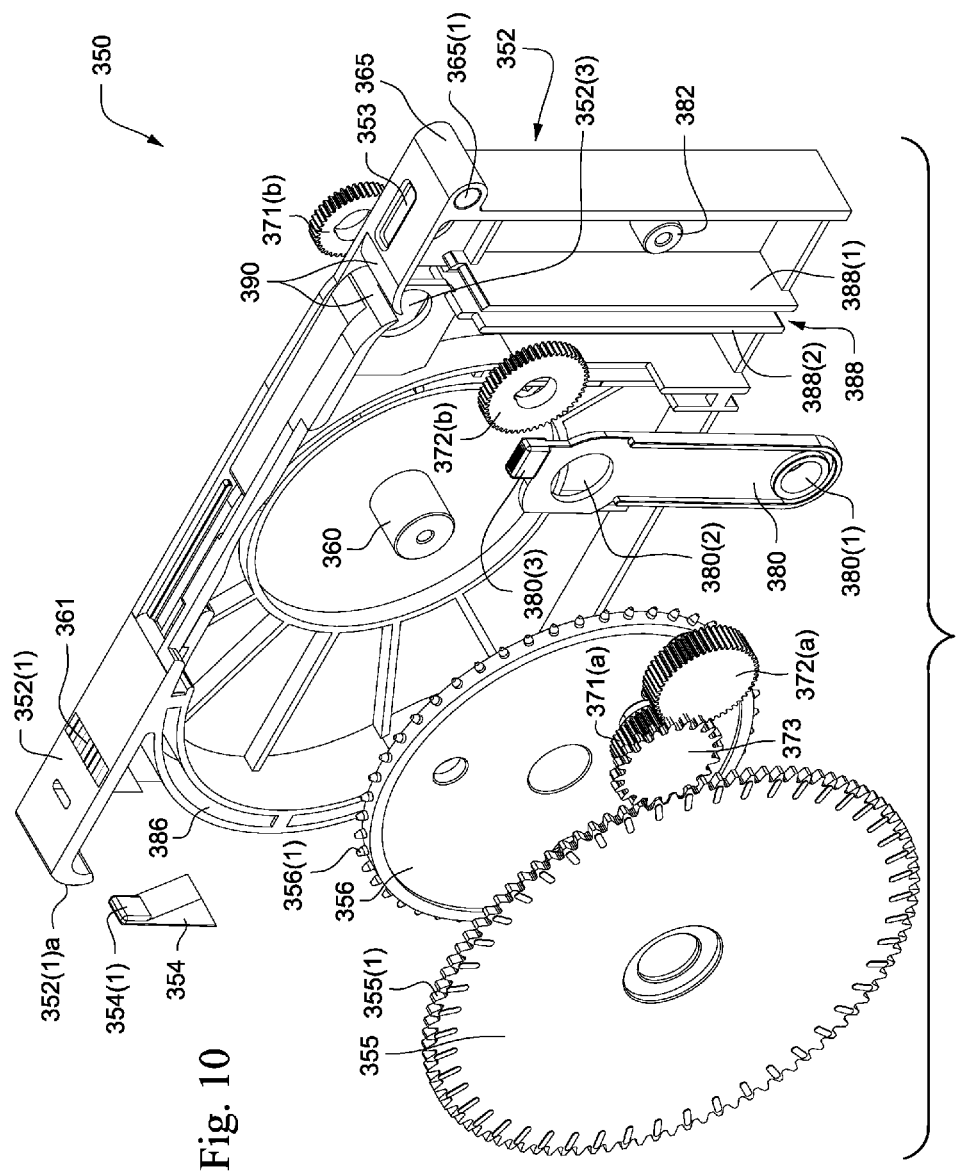
FIG. 10 is an exploded perspective view of the removable feeder cartridge of FIG. 6.

A feeder gear 355 is rotatably disposed in feeder cartridge 350. Feeder gear 355 is a passive gear relying on drive forces external of the feeder cartridge 350 for rotation. Feeder gear 355 may be exposed from body portion 352 to facilitate engagement with an external driving device. However, in another example, feeder gear 355 may be recessed into body portion 352 and accessible via a slot in the body portion. A sprocket wheel 356 (FIG. 5) is rotatable about a common axis with feeder gear 355 and is locked in rotation with the feeder gear. As shown in FIG. 10, feeder gear 355 and sprocket wheel 356 may be rotatably disposed on shaft 360. Pickup head 200 includes a rack gear that drives the feeder gear 355, as will be described later. As feeder gear 355 of a given feeder cartridge 350 is driven (by pickup head 200), sprocket wheel 356 also rotates because of its locked arrangement with the feeder gear. Sprocket teeth 356(1) engage sprocket holes 341 in tape 340 to advance the tape through feeder cartridge 350.

Gear teeth 355(1) of feeder gear 355 engage cover film peeling gears 357, 358 (FIG. 5) in cover film drive assembly 359 to cause cover film 344 to be peeled away from tape 340. Specifically, gear teeth 355(1) of feeder gear 355 mesh with gear teeth 357(1) of cover film peeling gear 357. Gear teeth 357(1), in turn, mesh with gear teeth 358(1) of cover film peeling gear 358. Cover film peeling gears 357, 358 are connected, respectively, to a pair of mating rollers 357(2), 358(2) which together function to pull cover film 344 and peel it from tape 340. In another example, the feeder gear could drive cover film drive assembly 359 via a belt or other suitable device as those skilled in the art will recognize.

As shown in FIGS. 6 and 7, feeder gear 355 includes calibration marks 351 (e.g., corresponding to every other tooth), to enable the position of the feeder gear to be precisely determined by CPU 110, as will be described in more detail later. Calibration marks 351 may be hot-stamped with a highly reflective foil (e.g., a white foil) to facilitate easy optical detection. Alternatively, the marks may be stamped with a silver or gold colored foil, for example. Calibration marks 351 may be arranged on feeder gear 355 in a manner that matches the component spacing on tape 340 such that the calibration marks may also identify a location of components on tape 340 as well.

Turning back to FIG. 4, a series of light emitting diodes (LEDs) (e.g., multi-colored LEDs 312) extend across front plate portion 306. Front plate portion 306 (or another part of feeder module 300) may include through holes or channels to permit the LEDs to optically communicate with light pipes 354 (e.g., formed of translucent or transparent plastic) disposed on each feeder cartridge 350. Since feeder cartridges 350 do not require electrical power, light (i.e., LEDs 312) produced by pick-and-place machine 1000 may be selectively fed to light pipes 354 to derive a status of each feeder cartridge 350. The light may be visible to an operator through a button 354(1) at a top portion of light pipe 354.

Now referring to FIGS. 6, 7 and 9, body portion 352 of feeder cartridge 350 includes an inlet guide channel 384 through which tape 340 is guided to pickup zone 342. Inlet guide channel 384 is formed by opposing wall portions 384(1), 384(2), as best shown in FIG. 9. Once cover film 344 is peeled from tape 340, the remaining portion of the tape (after components are removed) is fed out of the feeder cartridge through an outlet guide channel 386. As shown in FIG. 9, outlet guide channel 386 is formed by opposing wall portions 386(1), 386(2). Similarly, peeled back and used cover film 344 is guided out of the feeder cartridge 350 by a cover film guide channel formed by opposing wall portions 388(1), 388(2).

Figure 8:
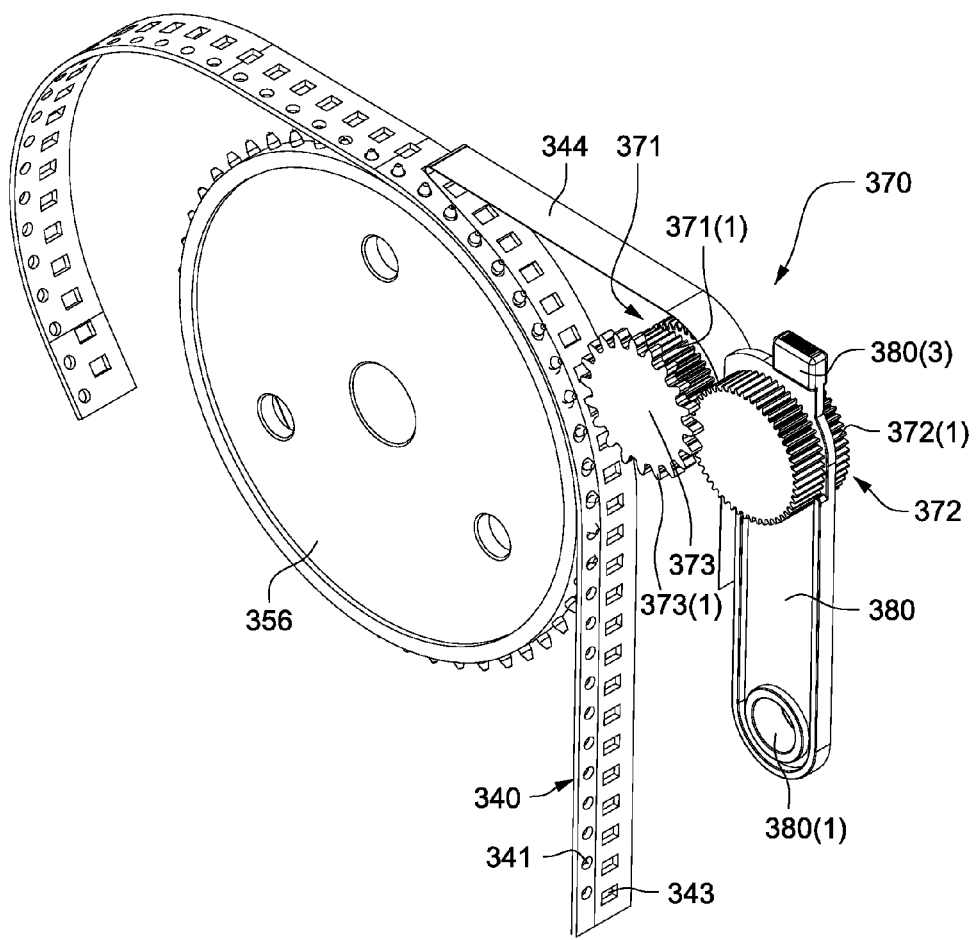
FIG. 8 is a perspective view of an example cover film drive assembly of the pick-and-place machine of FIG. 1.

An alternative cover film drive assembly 370 is shown in FIGS. 6-10. As best shown in FIG. 8, cover film drive assembly 370 includes first and second cover film peeling gears 371, 372 having mating gear teeth 371(1), 372(1). First gear 371 is connected to and driven by a third gear 373. Referring to FIGS. 8 and 10, third gear 373 has gear teeth 373(1) that engage gear teeth 355(1) of feeder gear 355 such that third gear 373 is driven by feeder gear. As best shown in FIGS. 6 and 8, cover film 344 is fed between mating first and second gears 371, 372 such that rotation of feeder gear 355 causes the peeled back cover film to be drawn between first and second gears 371, 372 thereby peeling the cover film from tape 340. The mating teeth 371(1), 372(1) drive the cover film 344; however, it is noted that the cover film 344 is intended to slip at a modest force through the teeth 371(1), 372(1). Alternatively, one of the first and second gears 371, 372 may instead be a roller (e.g., a rubber roller).

The second gear 372 may be supported on a tensioner arm 380. A lower portion of tensioner arm 380 includes a shaft opening 380(1) that rotatably receives shaft 382 (FIG. 10) which protrudes from body portion 352. Second gear 372 is attached to an upper portion of tensioner arm 380. When tape 340 is initially fed through feeder cartridge 350, an operator may peel cover film 344 from a leading edge of tape 340 and feed a leading edge of the cover film through cover film drive assembly 370, as an initial set-up procedure. Tensioner arm 380 enables second gear 372 to be rotated away from first gear 371, thereby providing sufficient space to easily place the leading edge of cover film 344 between first and second gears 371, 372. Once the leading edge of the cover film is in place between the first and second gears, tensioner arm 380 may be rotated toward first gear 371 to pinch the cover film between first and second gears 371, 372. Tensioner arm 380 may be urged toward the cover film by a spring (e.g., a helical torsion spring (not shown) connected to the shaft 382).

The tensioner arm 380 may include a knob 380(3) to assist the operator in pivoting tensioner arm 380. Knob 380(3) protrudes upwardly from body portion 352 through opening 353 in the body portion.

In another example, first and second gears 371, 372 may each include separable portions, as shown in FIG. 10. For instance, first gear 371 may comprise a first portion 371(a) and a second portion 372(b) disposed on opposite sides of body portion 352 and connected to one another through opening 352(3) formed in body portion 352. Similarly, second gear 372 may comprise a first portion 372(a) and a second portion 372(b) disposed on opposite sides of tensioner arm 380 and connected to one another through opening 380(2) formed in the tensioner arm. A shaft portion may protrude from one portion of first and second gears 371, 372 to connect to the other portion.

Body portion 352 may include opposing curved portions 390 to assist in directing the cover film to cover film drive assembly 370. The curved portions may be tapered to more precisely direct the path of the cover film.

As shown in FIGS. 6 and 7, a feeder cartridge 350 may include a label (e.g., on the body portion 352). Label 361 may include a machine readable barcode (or other machine readable markings), as well as human readable alphanumeric text (which may, of course, also be machine read and recognizable). The barcode may be read by a multi-purpose camera on pickup head 200, as will be described later, to convey to pick-and-place machine 1000 (e.g., CPU 110)

information (e.g., a part number) regarding the particular components being fed by that particular feeder cartridge. Additionally, as a confirmation, the operator may simply read the alphanumeric text on label 361 to ensure that the component identifying information (e.g., a part number) on the label matches the component identifying information (e.g., a part number) on reel 330 containing tape 340 being fed through feeder cartridge 350.

Turning back to FIG. 4, in an example, four color LEDs (e.g., green blue, red and yellow LEDs 312) may be used. The light pipe 354 of a newly installed feeder cartridge may blink yellow until label 361 is read. If label 361 is successfully read, the light pipe may show the green or blue light. The green light may indicate that all is ready to go while the blue light may indicate that the feeder cartridge is ready but not used in the current program (assembly). Thus, the blue light might indicate an "incorrect" feeder cartridge for the current assembly or simply that the feeder cartridge is needed for a later assembly. If a feeder cartridge has no label or a label that is not readable, light pipe 354 will show red. During an assembly process, the blue light may indicate to a user which feeder cartridges 350 can be removed without affecting the current assembly. This facilitates change-over to a new assembly.

Further, light pipe 354 of a feeder cartridge may blink (e.g., red) when the feeder cartridge will be empty in a certain amount of time (e.g., 20 minutes) at the current rate of production. The light may blink at a faster rate as the feeder cartridge approaches an empty status (e.g., 5 minutes until empty). This may alert a user to prepare a new reel of components for reloading, or the user may simply install a backup feeder cartridge to allow the machine to revert to the backup feeder cartridge upon depletion of the primary cartridge. Light pipe 354 of the primary feeder cartridge may then show red to indicate an empty status.

The feeder cartridge 350 parts (e.g., body portion 352, feeder gear 355, sprocket wheel 356, and cover film drive assembly 359, 370) are preferably formed of plastic (e.g., injection molded plastic).

1.2 Pickup Head

Referring to FIGS. 11-14, the pickup head 200 of the example pick-and-place machine 1000 is shown. Pickup head 200 includes a frame 204. A controller (e.g., printed circuit board 202) for controlling the pickup head 200 is attached to the frame 204. The frame includes opposing sidewalls 204(2), 204(3). Each sidewall 204(2), 204(3) may extend continuously or may include offset portions in the manner of sidewall 204(3) which has an inwardly offset upper portion. A front lower wall portion 205 extends between front portions of the sidewalk 204(2), 204(3) and a rear lower wall portion 207 extends between rear portions of sidewalls 204(2), 204(3).

Figure 12:
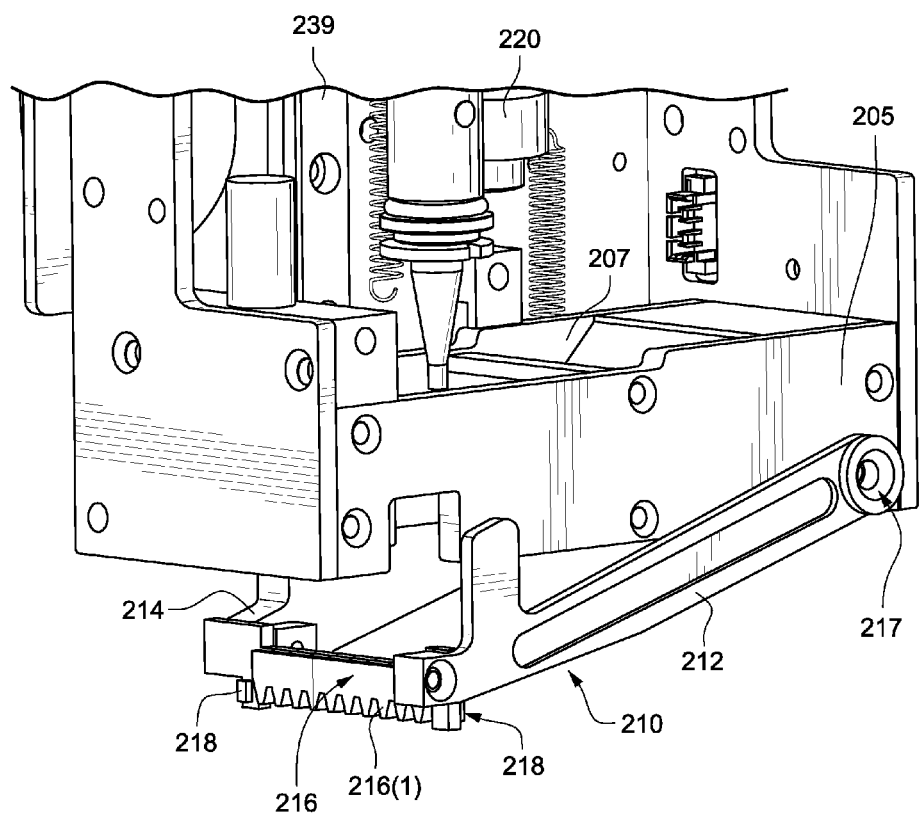
FIG. 12 is a perspective view of a lower portion of the pickup head shown in FIG. 11.

A gear driving mechanism 210 is disposed at a lower portion of pickup head 200 and is rotatably connected to the front and rear lower wall portions 205, 207. As best shown in FIG. 12, gear driving mechanism 210 includes a pair of parallel arms 212, 214. The arms 212, 214 are rotatably connected to lower wall portions at pivot 217. Arms 212, 214 may be formed of any suitable material, but are preferably formed of aluminum, A1 stainless steel or brass.

Figure 13:
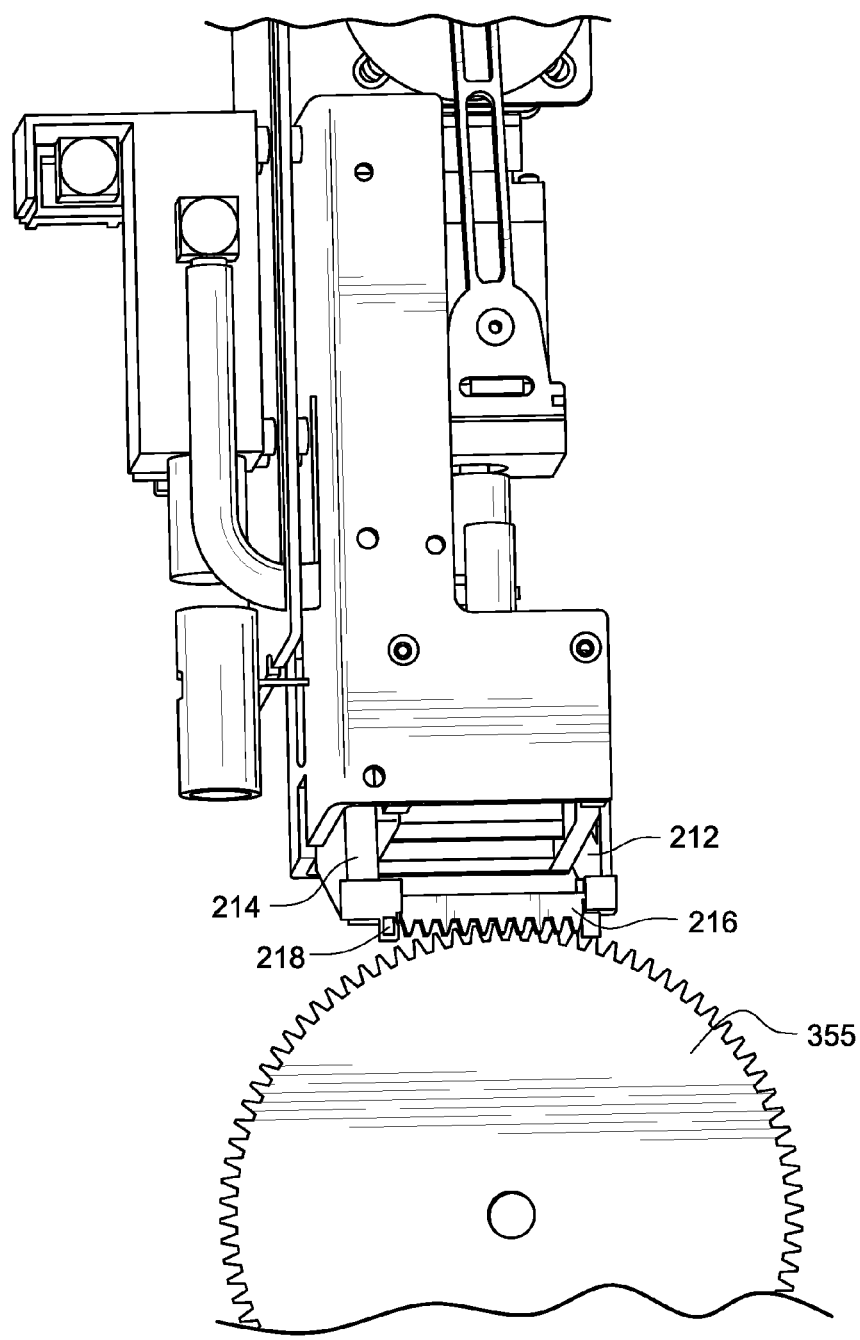
FIG. 13 is a side view of the pickup head of FIG. 11 engaging a feeder gear.

A rack gear 216 is connected to the free ends of arms 212, 214 such that the rack gear extends between the arms. Rack gear 216 may be formed of any suitable material, but is preferably formed of aluminum, A1 stainless steel or brass. The rack gear has one or more gear teeth 216(1) that mesh with the gear teeth 355(1) of the feeder gear 355 of a particular feeder cartridge that happens to be aligned with it. That is, arms 212, 214 are configured to rotate downwardly to cause rack gear 216 to mesh with feeder gear 355 when the pickup head 200 is so positioned at a particular selected feeder cartridge 350, as best shown in FIG. 13. Once rack gear 216 is engaged with feeder gear 355, the pickup head may be moved in the Y axis direction by motion system 400 to drive feeder gear 355 and thereby index (i.e., move) tape 340 to bring the next component into pickup zone 342. The motive power required for the feeder cartridges is thus supplied as needed by the pickup head 200, avoiding the need for a drive motor in the feeder cartridge (or feeder module) itself.

The gear driving mechanism 210 includes an optical sensing system (e.g., reflective sensors) to read the calibration marks 351 on the engaged feeder gear 355. In the illustrated example of FIG. 12, gear driving mechanism 210 includes two sensors (e.g., LED/phototransistor sensors) 218 on opposing ends of rack gear 216. The two sensors 218 are also disposed on opposite sides of rack gear 216. The sensors 218 include an LED arranged to emit light toward feeder gear 355. A phototransistor element is also included in each sensor 218 to detect whether or not the emitted light is reflected, as one skilled in the art will understand. As such, sensors 218 are able to precisely detect the rotary position of feeder gear 355. As shown, sensors 218 are oppositely directed thus permitting one to be used when the feeder gear is on one side of pickup head 200 and the other sensor 218 to be used when the feeder gear is on the other side of pickup head 200.

Optical sensors 218 may also be used to measure the gear position in the lateral (x) axis direction, as determined by a distance from one of the sensors 218 to feeder gear 355. Sensor 218 has a relatively narrow range (distance) over which the sensor can detect reflected light. The response signal amplitude peaks at a specific distance from feeder gear 355 and falls quickly at greater or lesser distances from that point thus making it possible to identify an optimal distance relative to the peak amplitude point. One skilled in the art will recognize that a "valley" instead of a peak of the signal amplitude may be used. Moving sensor 218 until the response has a predetermined amplitude relative to the peak amplitude will identify the lateral position of the gear (distance from feeder gear 355 to sensor 218). Since feeder gear 355, sprocket 356 and tape 340 are connected to one another, the measured lateral position of feeder gear 355 can be used to further determine the location of pickup zone 342 as well as a component to be picked. This peak/distance sensing operation may be done on the fly. For example, the process can be performed by starting with sensor 218 in relatively close position to feeder gear 355 and then moving the sensor away from the feeder gear, or alternatively, starting with sensor 218 relatively far away and then moving the sensor closer to the feeder gear, while noting a peak in the amplitude and the position where the peak occurred—the peak being at a known distance relative to a desired optimum distance.

The rotary position of feeder gear 355 can be used to determine component location in the Y axis direction, while the lateral position of the feeder gear can be used to determine component location in the X axis direction. This information is used by the pick-and-place machine 1000 to refine its determined location of pickup zone 342. Knowledge of the exact X axis location of pickup zone 342 can be used to mitigate or cancel the effects of feeder lateral location misalignment. Similarly, knowledge of the exact Y axis location of pickup zone 342 can be used to mitigate or eliminate the effects of errors caused by mechanical slop or lash in the drive gear train.

Sensor 218 includes an LED to emit light and a photo-sensor to detect the reflected light. However, one skilled in the art will understand that the LED may serve the dual functions of emitting light and sensing (now operating as a photodiode) reflected light. Such arrangement may reduce the space required by sensors 218 on the gear driving mechanism 210.

Figure 11:
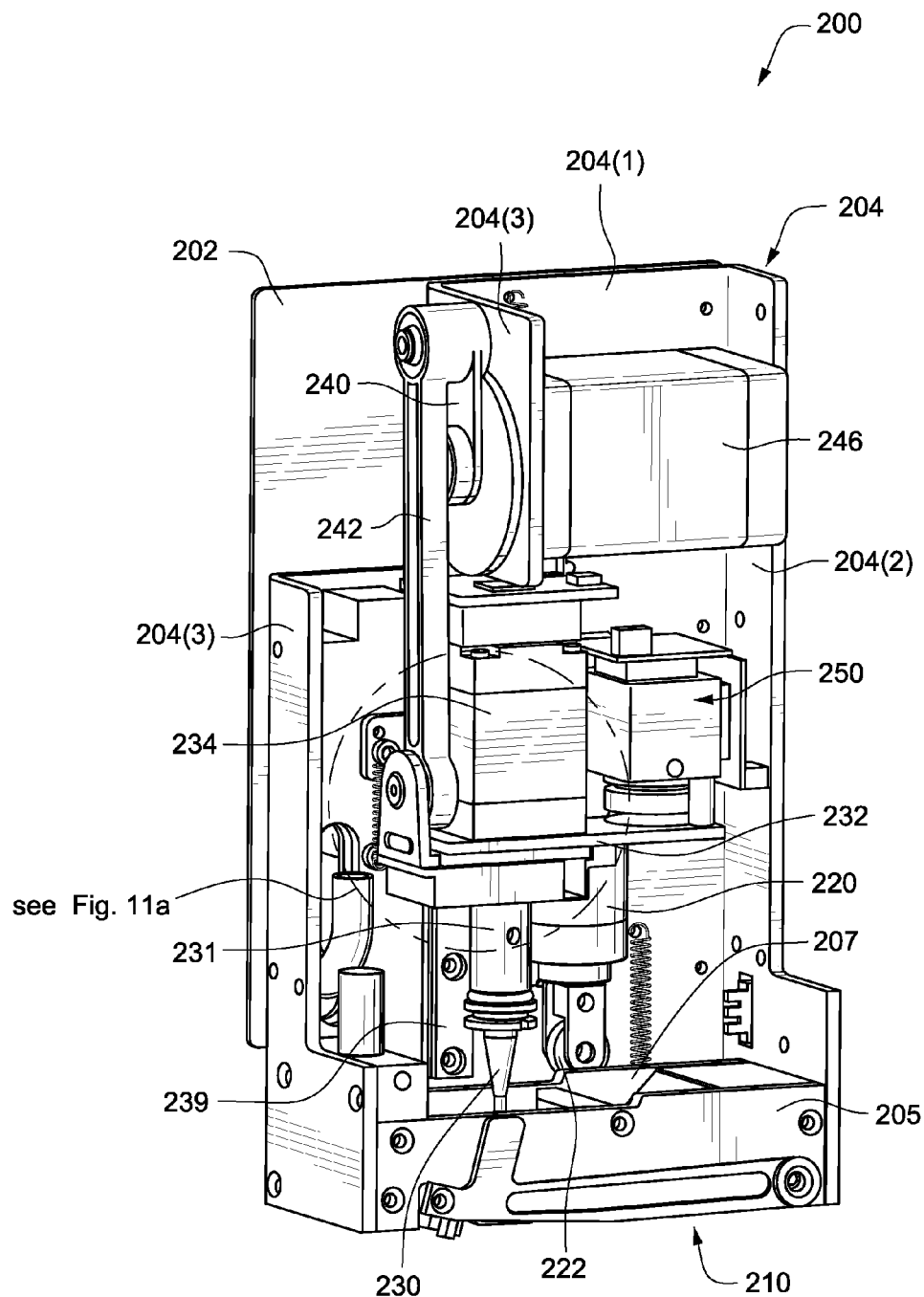
FIG. 11 is a perspective view of an example pickup head of the pick-and-place machine of FIG. 1.

An electromechanical solenoid 220 is positioned in pickup head 200, as best shown in FIG. 11. Electromechanical solenoid 220 may be actuated to lower an engaging element (e.g., a roller) 222 which engages arm 214 and pushes it downwardly about its pivot to cause the gear driving mechanism 210 to be lowered. In other examples, an air cylinder or motor (e.g., a linear motor) may be used instead of electromechanical solenoid 220. Gear driving mechanism 210 may be returned to its original position by a spring (as depicted) or other suitable device.

Figure 14:
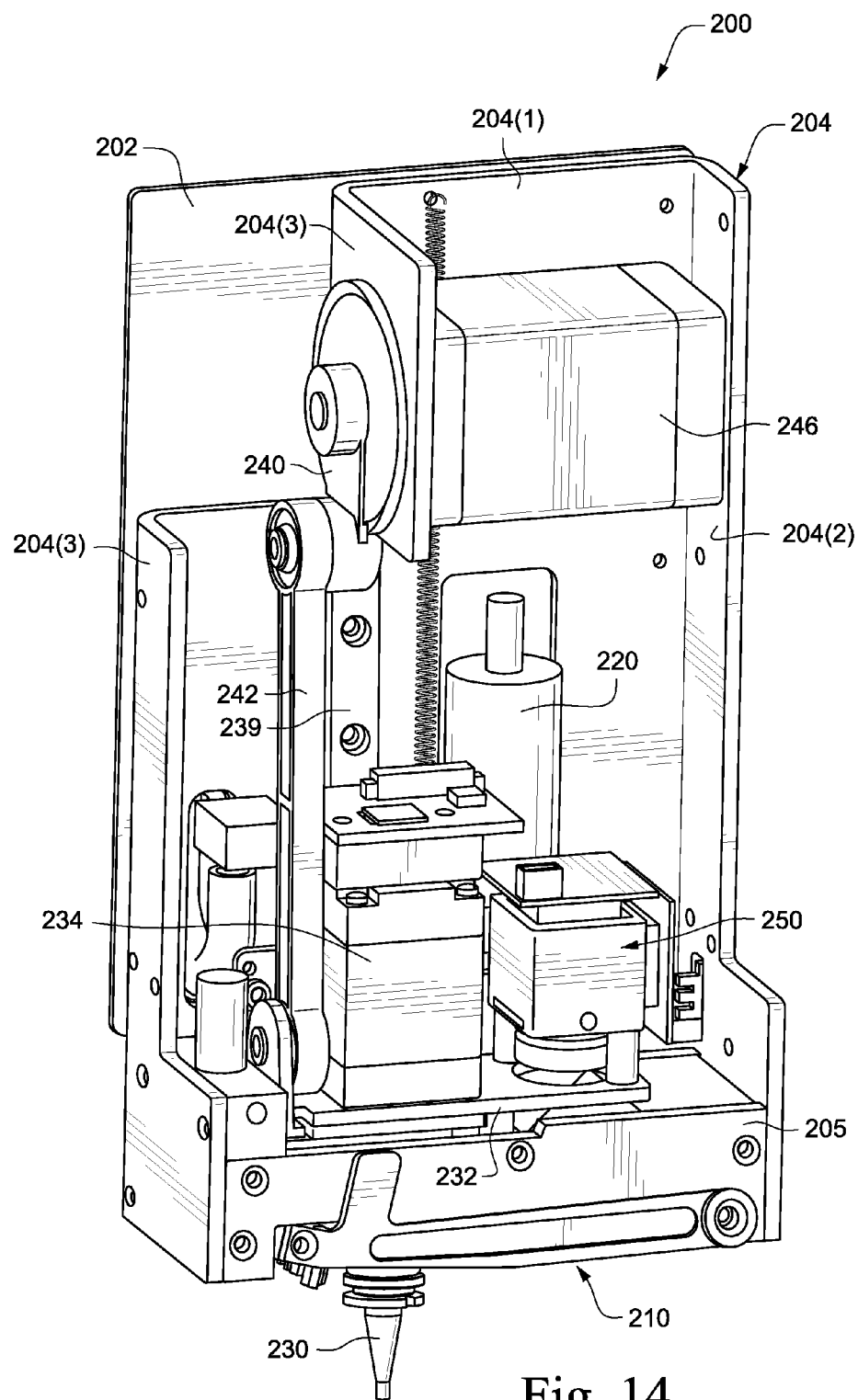
FIG. 14 is a perspective view of the pickup head of FIG. 11 showing an example vacuum nozzle in a down position.

Referring to FIGS. 11 and 14, pickup head 200 includes a pickup device (e.g., vacuum nozzle 230) that functions to pick up a component from a selected tape 340 and then place that component onto the substrate (not shown) at a precisely determined location and in a precisely determined orientation. Although vacuum nozzle 230 is shown in the illustrated example, it is noted that other methods of picking up and placing a component may be used. For example, grippers may be actuated (e.g., by a vacuum pressure driven piston) to pick up components and place the components on a substrate. Magnetic components may be picked up with an electro-magnet. An adhesive could be used to pick and place components. Other examples include state change adhesion (e.g., freezing water into ice), AC magnetic induction (which may attract non-magnetic components if they are electrically conductive), jet entrainment (which may be used to pick and place components by pressure), and electro-static charge.

As shown in FIG. 11, vacuum nozzle 230 is suspended from nozzle holder 231. Vacuum nozzle 230 is removably attached to nozzle holder 231. Nozzle holder 231 is connected at its upper end to a shaft of nozzle rotation motor 234. Vacuum nozzle 230 is in flexible fluid communication (e.g., a flexible tube) with a vacuum generator via nozzle holder 231 so as to provide vacuum/suction at a distal opening of vacuum nozzle 230. The suction is provided so that a component may be picked up and held against the distal nozzle end by vacuum force (i.e., actually by differential air pressure forces on the top and bottom of the component caused by the vacuum at the distal end of the nozzle) while in transit between the feeder cartridge and the substrate.

Nozzle rotation motor 234 is positioned on a top side of platform 232 opposite nozzle holder 231. Nozzle rotation motor 234 serves to rotate vacuum nozzle 230 so as to adjust an angular position of a component picked-up/held by vacuum nozzle 230. Nozzle rotation motor 234 is preferably a servo step motor using a conventional position feedback encoder to provide precise rotary adjustment of vacuum nozzle 230.

Vacuum nozzle 230 is quickly raised and lowered by a crank mechanism connected to platform 232, e.g., via a force sensing mechanism 800 which will be described later. Crank arm 240 is connected to connecting rod 242 which extends downwardly to connect to platform 232. Crank arm drive 246 (e.g., a servo-controlled rotary motor) is arranged to rotate crank arm 240, thereby causing connecting rod 242 to raise or lower vacuum nozzle 230. When platform 232 is raised or lowered, nozzle rotation motor 234 is also raised or lowered along with platform 232. Platform 232 is arranged to slide along vertical guide rail 239 positioned on rear wall 204(1) of frame 204. Instead of a crank mechanism, vacuum nozzle 230 may be raised and lowered by other devices, such as a motor driven lead screw of a voice coil linear motor.

As can be seen in FIG. 11, the platform extends to a side portion of pickup head 200 to support a camera assembly 250. As such, camera assembly 250 is also raised or lowered with the platform, as can be seen in FIG. 14 where pickup head 200 is in a down position. Vacuum nozzle 230 is arranged to either pick up a component from a selected tape 340 or place a component on the substrate at a selected position when the vacuum nozzle is in the down position shown in FIG. 14.

Figure 15:
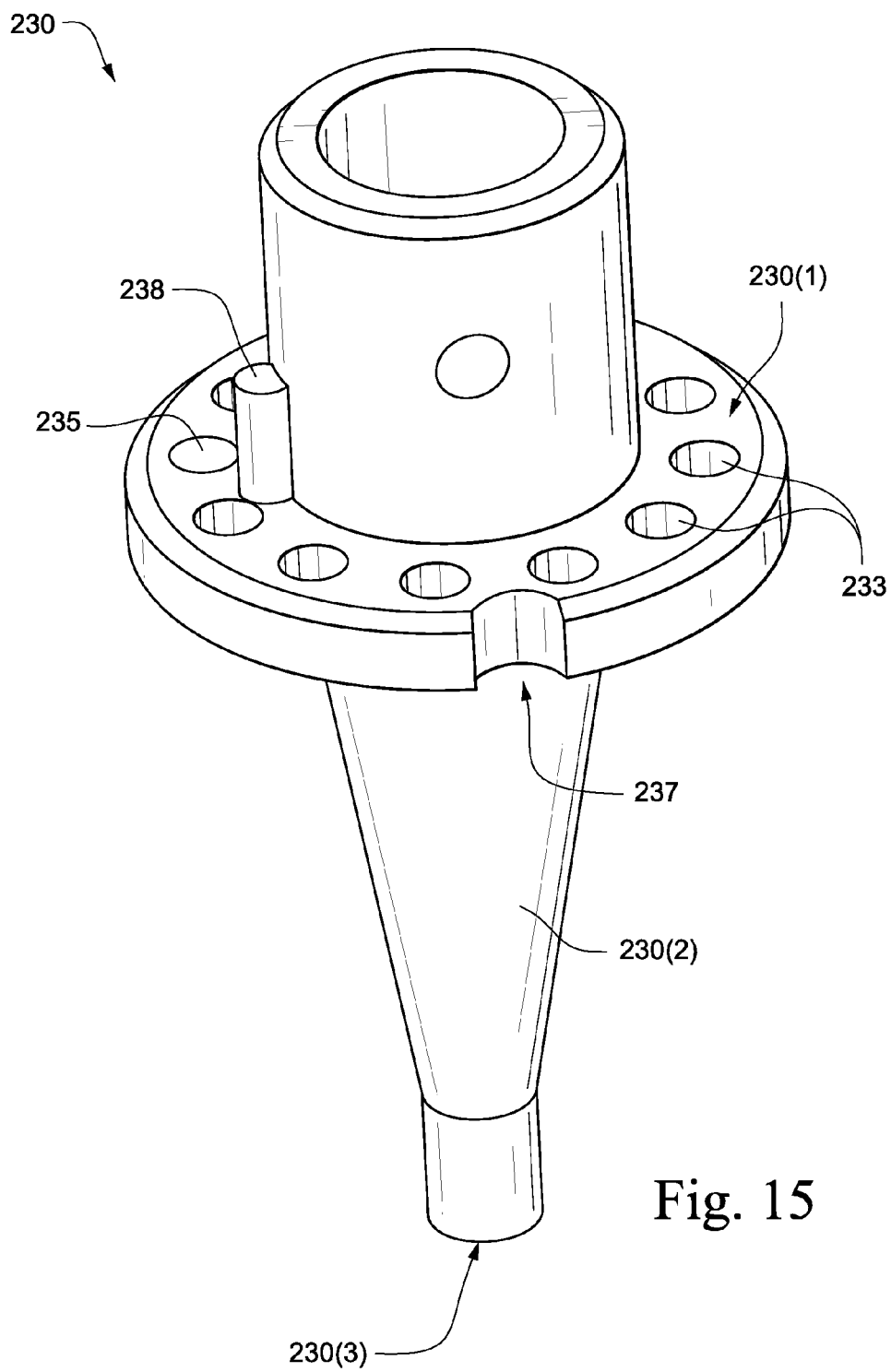
FIG. 15 is a perspective view of the vacuum nozzle shown in FIG. 14.

As shown in FIG. 15, vacuum nozzle 230 includes flange 230(1), neck portion 230(2) and distal nozzle opening 230(3). Projection 238 and notch 237 permit controlled accurate indexed positioning of the vacuum nozzle 230 on pickup head 200 and/or a nozzle changer cartridge. Specifically, projection 238 may be used to align vacuum nozzle 230 in nozzle holder 231 and the notch 237 may be used to align the vacuum nozzle in a nozzle changer 270 (discussed below). Information as to nozzle type and/or identity can be encoded by fiducial markings 233, 235 (e.g., reflective/non-reflective and/or color-coded markings).

Figure 16:
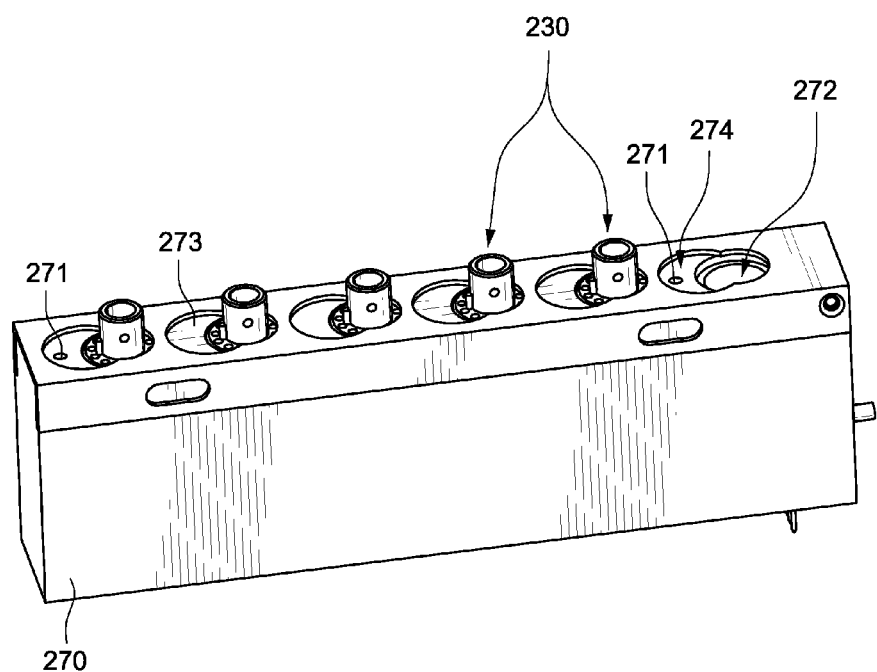
FIG. 16 is a perspective view of an example vacuum nozzle changer cartridge of the pick-and-place machine of FIG. 1.
Figure 17:
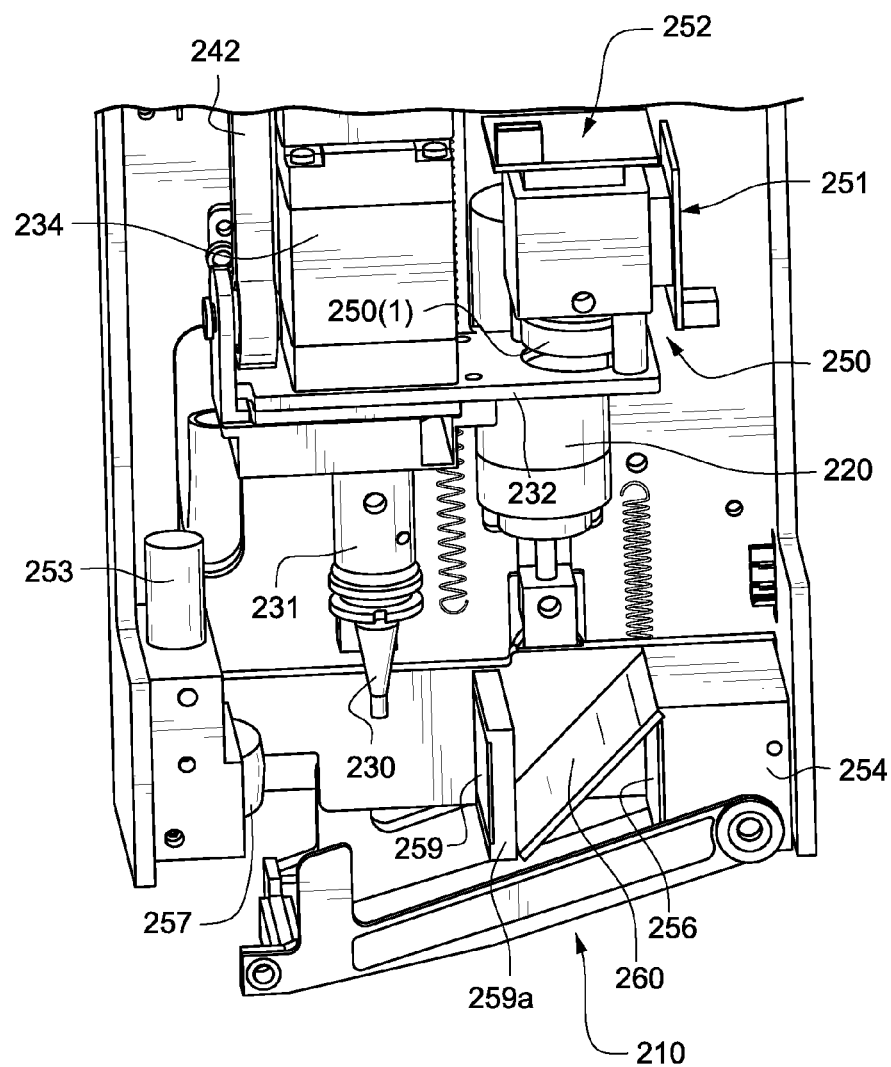
FIGS. 17 and 18 are perspective views of an example optical subsystem of the pick-and-place machine of FIG. 1.

A nozzle changer cartridge 270 is shown in FIG. 16. The nozzle changer cartridge may house a variety of vacuum nozzles, including differently sized vacuum nozzles. Nozzle size may correspond to the size of components contained on a particular tape 340 (e.g., a larger vacuum nozzle may be required for larger components). The nozzle changer cartridge is arranged in the pick-and-place machine 1000 in an area accessible to pickup head 200. In this manner, pickup head 200 may be lowered at a selected position to cause nozzle holder 231 to attach to a desired vacuum nozzle (or to deposit a presently attached vacuum nozzle into an empty cavity of the nozzle changer cartridge). Then, the selected vacuum nozzle 230 may be unlocked from the nozzle changer cartridge 270 by shifting locking plate 273 from alignment of nozzles with the small opening 272 to alignment of nozzles with the large opening 274 of the nozzle changer cartridge 270. Locking plate 273 may be driven back and forth (e.g., with a solenoid, air cylinder or motor).

The multi-purpose camera in pickup head 200 may be used to read the fiducial markings 233, 235 on vacuum nozzle 230 so as to selectively position the pickup head for pickup of a desired vacuum nozzle and/or for deposit of a vacuum nozzle in a currently empty position of the nozzle changer cartridge 270. CPU 110 may also be programmed to maintain a table or other data to record the identity of vacuum nozzles in particular changer cartridges positions, open positions in the changer cartridge, and the like.

Fiducial marks 271 (e.g., round dots) on the nozzle changer cartridge 270 are used to locate the precise installed location of the changer cartridge. Other information may be encoded by fiducial size or location, such as changer type, number of positions, etc. An optical interrupter (not shown) may be positioned internally to report when a user opens the changer cartridge 270 (e.g., to change the nozzle configuration). The system will be prompted to re-read fiducial markings 233, 235 on the vacuum nozzles if changer cartridge 270 is opened. Once the changer cartridge is open, the system may maintain the changer cartridge in the open position for the user's convenience.

1.3 Dual Camera Assembly

The pickup head 200 employs a dual camera assembly 250 to provide for component centering and a variety of other imaging control functions. Referring to FIGS. 17 and 19A to 20B, dual camera assembly 250 includes side-facing component camera 251 to capture a shadow image (silhouette) of a component held on vacuum nozzle 230. Component camera 251 facilitates angular adjustment of the component as well as linear adjustment, i.e., positioning of the component. Dual camera assembly 250 also includes a down-facing multi-purpose camera 252 to capture images of the substrate, read barcode labels (e.g., on the feeder cartridges 350), image calibration marks (e.g., on the machine 1000) and perform other imaging functions. Cameras 251, 252 are preferably high resolution monochrome cameras.

Figure 19A:
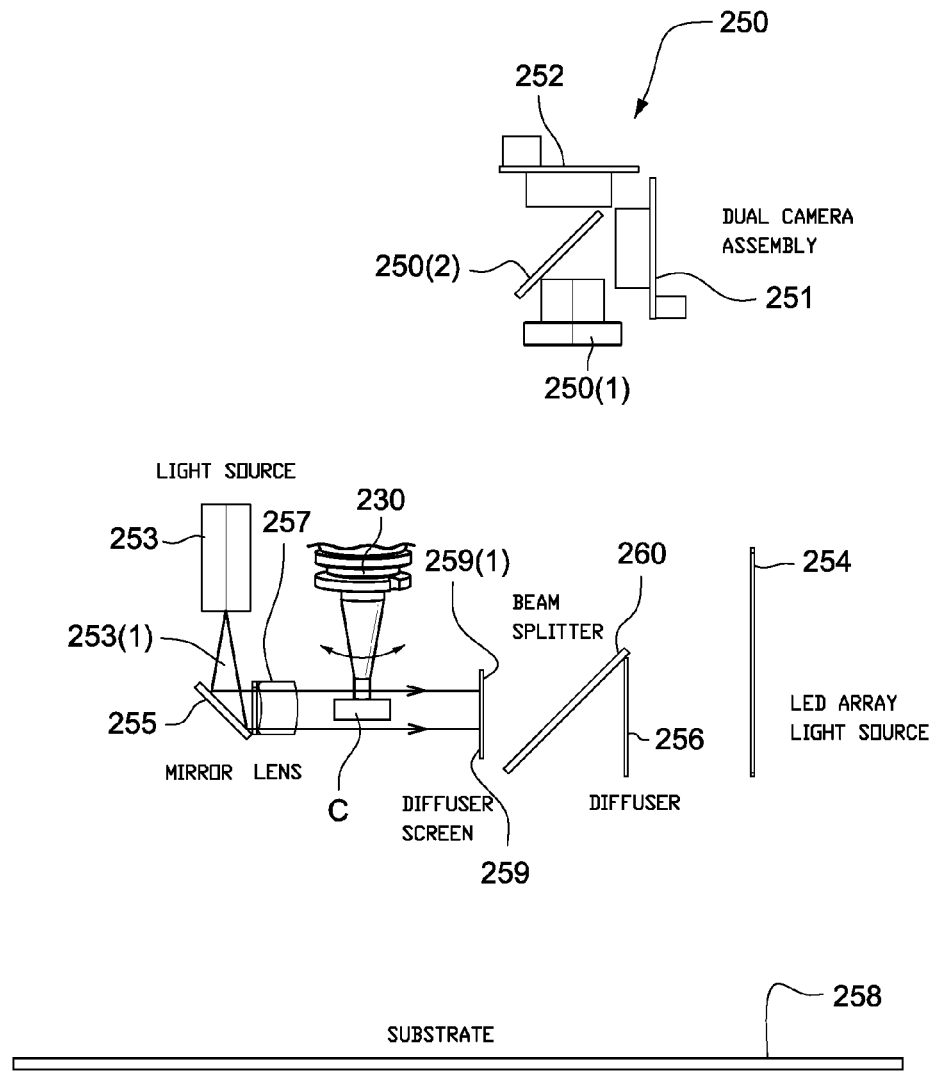
FIGS. 19A to 20B are schematic representations of optical paths of the optical sub-systems of FIGS. 17 and 18.
Figure 19B:
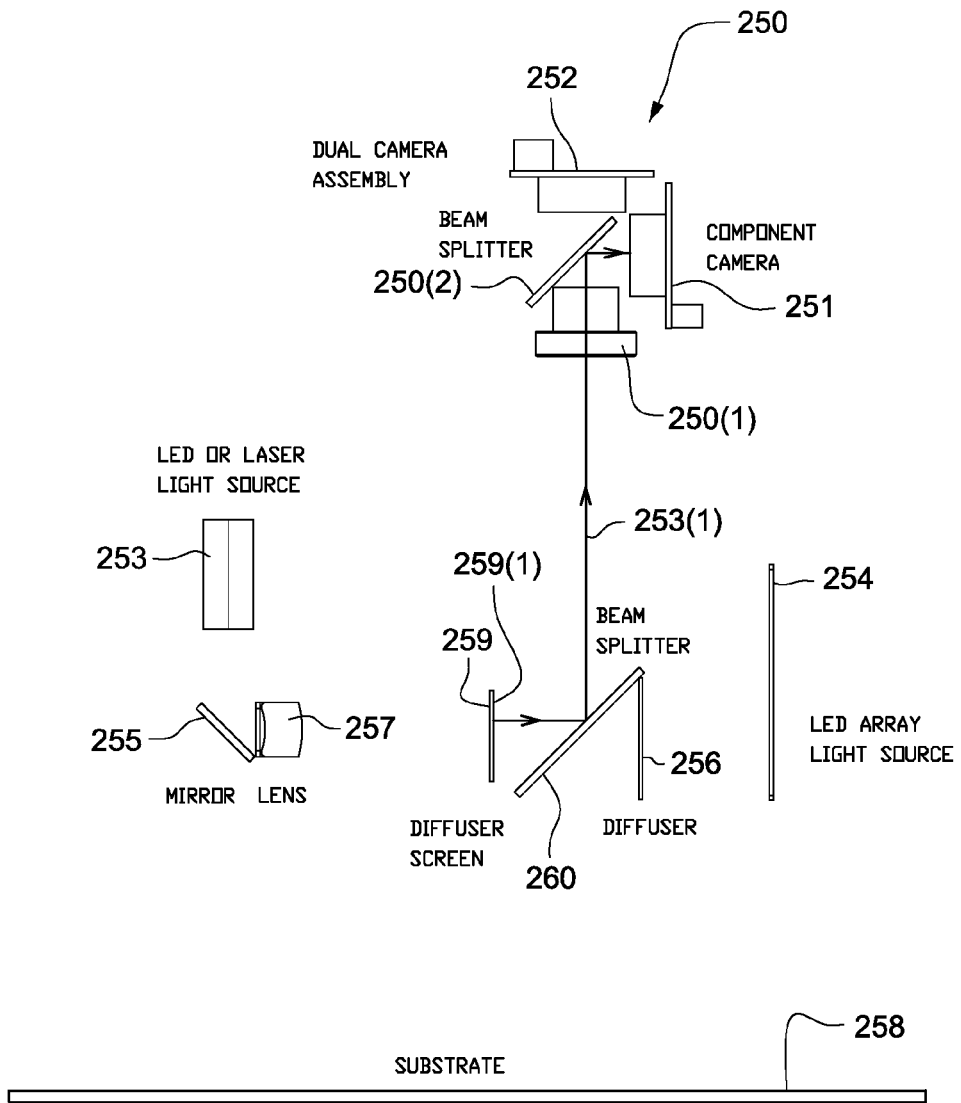

Component camera 251 and the multi-purpose camera 252 share a single lens 250(1) via beam splitter 250(2), as best shown in FIG. 19A. The lens 250(1) is preferably an ordinary lens intended for ordinary (not telecentric) camera imaging. Light passing through lens 250(1) is directed to both component camera 251 and multi-purpose camera 252 by a beam splitter 250(2). However, in the exemplary embodiment, component camera 251 and the multi-purpose camera 252 are not required to be used at the same time.

The dual camera assembly 250 also comprises a conventional microprocessor/controller subsystem (not shown) and video capture hardware (not shown) to interface the cameras 251, 252 and the microprocessor/controller subsystem ultimately to the at least one system CPU 110.

1.3.1 Component Camera

Figure 18:
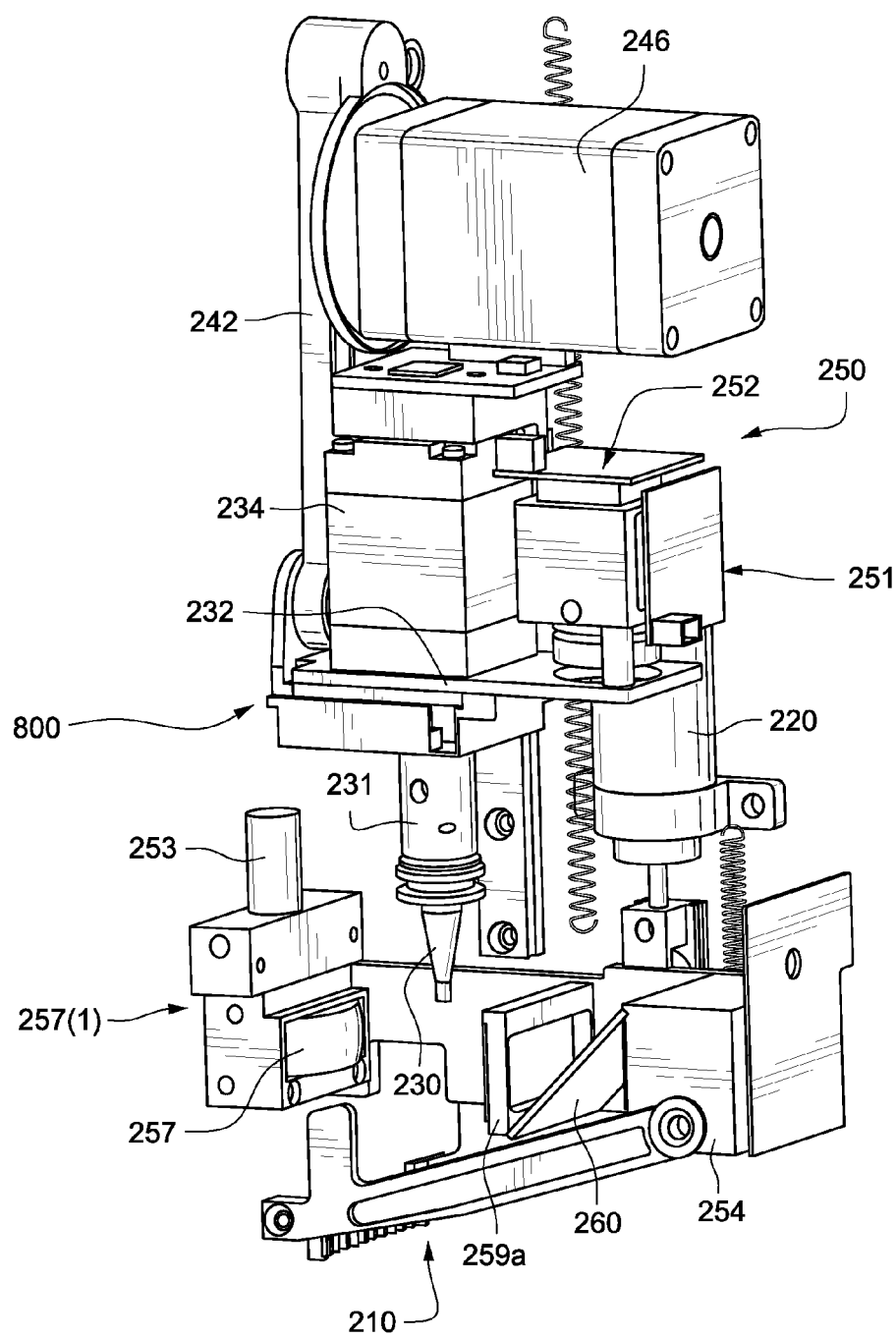

Referring to FIGS. 17-19A, light from a light source (e.g., LED or laser) 253 is delivered to component camera 251 via mirror 255, collimating lens 257, component C, diffuser screen 259, beam splitter 260, lens 250(1) and beam splitter 250(2). Light source 253 projects light 253(1) downwardly to mirror 255, as best shown in FIG. 19A. The mirror reflects the light through collimating lens 257 and then towards diffuser screen 259. Mirror 255 and collimating lens 257 may be contained in housing 257(1), as shown in FIG. 18. Additionally, support structure 259a may support the diffuser screen. Light 253(1) emerging from diffuser screen 259 enters conventional beam splitter 260 and is directed upwardly to camera lens 250(1), as best shown in FIG. 19B. Finally, light 253(1) enters component camera 251 by way of beam splitter 250(2).

When the component C is picked up by vacuum nozzle 230, the vacuum nozzle is raised to the up position within pickup head 200, as shown in FIG. 18. Such positioning brings the component C, which is held against the nozzle opening 230(3), into the path of light 253(1), as shown in FIG. 19A. The collimated light projects a clearly focused shadow of the component C onto diffuser screen 259. Use of a diffuser screen 259 between component C (illuminated by collimated light) and component camera 251 provides essentially an unlimited depth of field.

A component C as held against the distal nozzle opening 230(3) is typically not exactly centered with respect to the nozzle opening. Thus, to ensure accurate placement of the held component on the substrate, an alignment correction must be calculated before the component is placed. The shadow image of the component on diffuser screen 259 is used to obtain this correction.

Squaring Method

Figure 37:
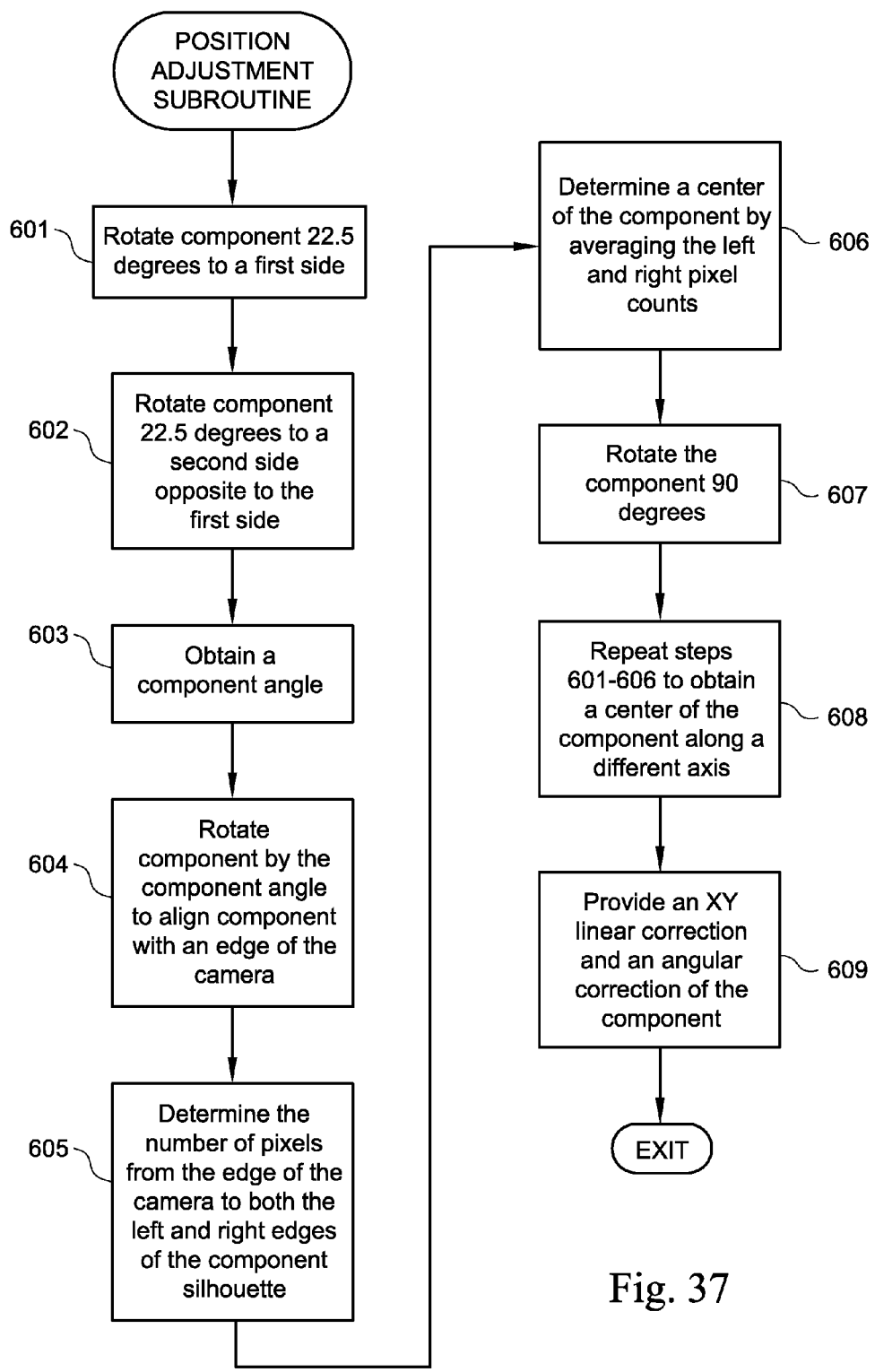
FIG. 37 is a flow chart diagram of computer program code structure for an example "squaring" method used to provide linear and/or angular corrections for component placement.

In an example, a position adjustment routine, or "squaring method," as described below with reference to FIG. 37, may be used to obtain alignment correction of component C.

The component angle as actually held by the nozzle is measured by rotating the component C to a test angle of 22.5 degrees on either side of a nominal predetermined normal angle, as represented by steps 601, 602. Measurements begin with the narrow side of the component facing the camera. This orientation will result in the largest shadow length change for a given rotation. The squaring scale factor number is based on this orientation and the measurement does not work if the long dimension initially faces the camera. This problem does not exist with square symmetrical components. If the picked-up component is rotationally misaligned by 5 degrees, for example, the test rotations would yield actual orientation angles of 22.5-5 and 22.5+5 degrees, thereby resulting in component angles of 17.5 degrees and 27.5 degrees.

By measuring both directions a greater difference in the resulting silhouette length (angles) is available, which enhances precision. Because the ratio of these values is employed, the actual magnitude of these values, or in other words the size of the part, is irrelevant. In addition, this makes certain forms of image distortion and non-linearity self cancelling.

The ratio of the lengths of the horizontal shadows is related to the component angle. If the ratio is smaller than 1, the inverse of the ratio is used, and in either case, 1 is subtracted. This results in a number that increases as the component angle increases. The relationship to actual angle depends on the aspect ratio of the component (width/length), but is independent of size. The ratio is nearly proportional to angle, but has a small downward slope decreasing about 15% between 1 and 10 degrees. An equation is used to better fit the slope. For example, K-ratio*K/2.4+4.2 works well over a good range of component sizes, where K is the scale factor of a rotation of 10 degrees. The value K is typically 20-40 and may be calculated in advance if the component dimensions are known. The derivation process for K rotates the coordinates of the component as determined by the given dimensions (e.g., 10 degrees via trigonometry), then figures the ratio of the silhouette lengths and derives the scale factor that would convert the ratio to 10 degrees.

The component angle calculated by this procedure, as represented by step 603, will first be used to align the component to measure its linear misalignment. In step 604, the component is rotated back from the test angle (22.5 degrees) to the nominal predetermined normal angle (but in addition accounting for the calculated error angle) which aligns the narrower side of the rectangular component parallel to the camera. This rotational orientation is equivalent to an orientation the component would have had if the component was initially picked up with zero error. The left edge of the camera image is used as the reference point for measurements.

The fundamental unit of video measurement is the sensor pixel. A resolution of 0.001 inches per pixel is suitable. However, the measurement resolution is not limited to the size of a single pixel. The pixel intensity may be used to infer the actual edge position of the component, thus effectively increasing the available resolution. This is commonly known as sub pixel imaging, or sub pixel interpolation. To reduce the effect of "image noise," measurements from several sequential lines may be averaged. In step 605, the pixel counts from the left edge of the image to both left and right edges of the component silhouette are measured. The center of the component is found by averaging these two values, in step 606. Center=(L+R)/2. The difference between the component center and the pickup spindle (nozzle holder) center is a linear error that must be corrected. In step 607, the component is then rotated 90 degrees and then, in step 608, the process is repeated to find the error on the other axis. The outcome of this process is both a linear X/Y correction and an angular correction, as represented by step 609. This will be applied to the spindle (nozzle holder) position just prior to the component being placed.

Averaging may be applied to the squaring process. That is, data from other scan lines in the component image may be employed. Specifically, several values of L from sequential scan lines may be averaged to produce a "cleaner" L. This process may also be used for R. Then, a single (L+R)/2 calculation may be performed, or alternatively, several (L+R)/2 calculations may be carried out with several raw L and R values, and then the (L+R)/2 results may be averaged to produce a cleaner (L+R)/2 result. When several data points are available, artifact rejection may also improve the quality of the resulting calculations. Data points that lie relatively far away from the others may be rejected as defective so as to not contaminate the result. This process can eliminate the influence of measurement noise or physical contamination such as dust in the image.

In addition to the center of the component, (R-L) may be calculated to determine the component length. Also, by counting the scan lines in the silhouette, the thickness of the component may be determined.

1.3.2 Multi-Purpose Camera

Figure 20A:
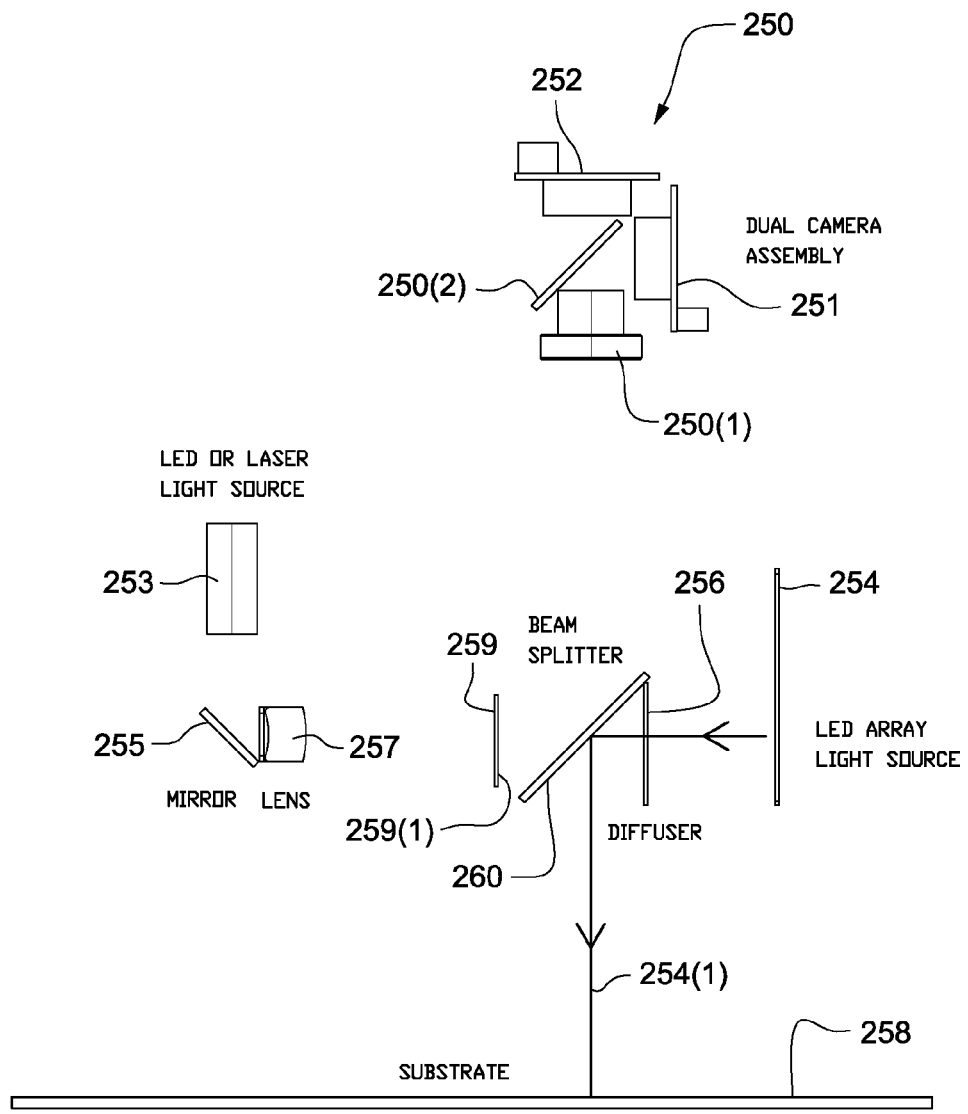
Figure 20B:
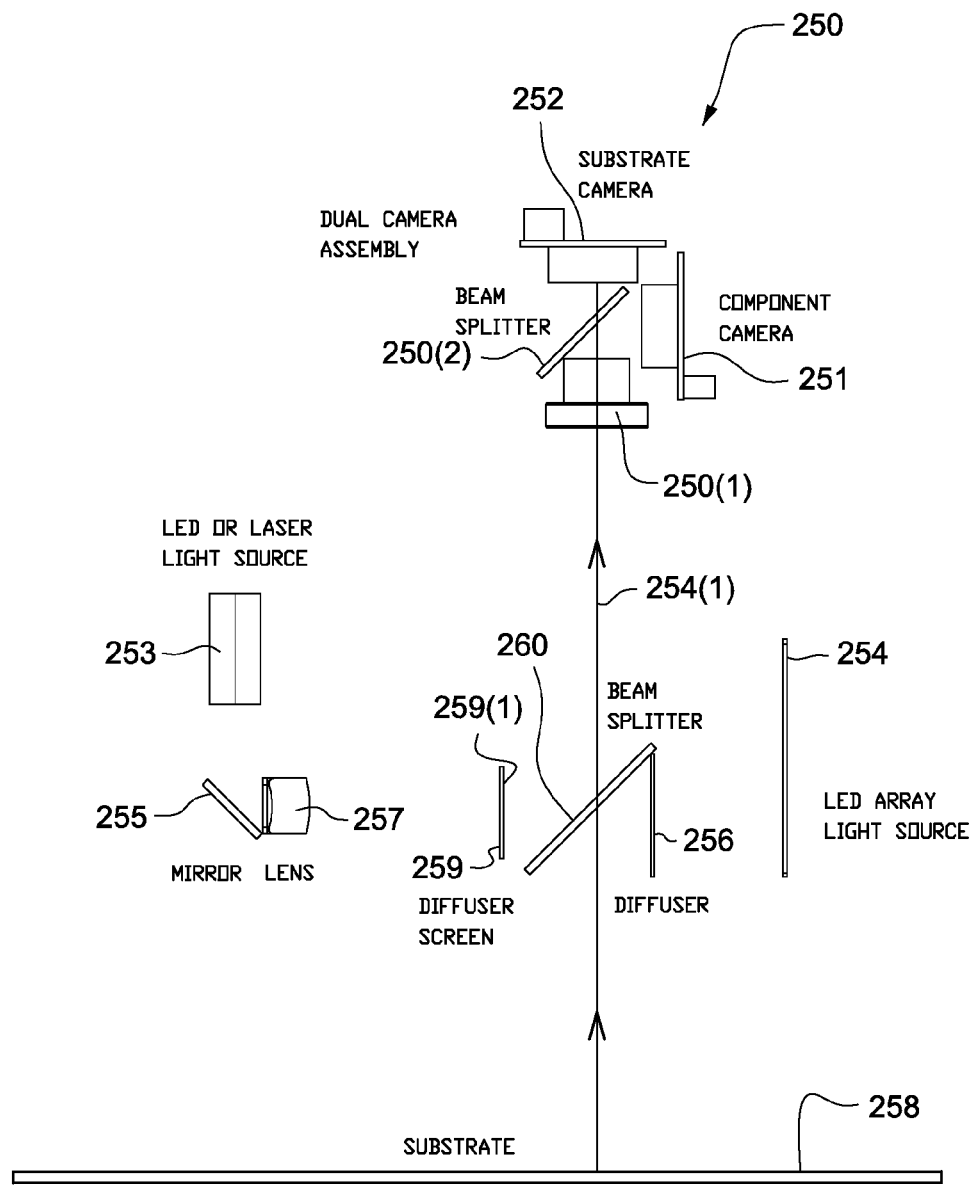

Referring to FIGS. 17, 18, 20A and 20B, light from a light source (e.g., a multi-color LED array) 254 is delivered to multi-purpose camera 252 via diffuser 256, beam splitter 260, lens 250(1) and beam splitter 250(2). Light source 254 projects light 254(1) through diffuser 256 and into beam splitter 260 which passes part of the light and directs the other part of the light downwardly to substrate 258, as best shown in FIG. 20A. As can be seen in FIG. 20B, substrate 258 reflects the light back through beam splitter 260 and then to multi-purpose camera 252 by way of lens 250(1) and beam splitter 250(2).

The light that passes through beam splitter 260 may hit diffuser screen 259 and/or its mounting frame and be reflected back to beam splitter 260 which will reflect part of the light up to multi-purpose camera 252. The light being reflected off of diffuser screen 259 may create an undesirable ghost image on the diffuser screen which will overlay and interfere with the image of the substrate 258. In an example, an antireflective device (e.g., an antireflective coated circular polarizer 259(1)) may be installed between diffuser screen 259 and beam splitter 260. In the illustrated example, antireflective coated circular polarizer 259(1) is applied (e.g., glued) to diffuser screen 259. The antireflective coating prevents ghost reflections from its front surface as those skilled in the art will understand. The circular polarizer polarizes incoming light before it strikes diffuser screen 259. Thus, the light reflected off of diffuser screen 259 will have an opposite polarization to that allowed through the circular polarizer, thereby suppressing reflections.

Unlike the component camera 251, which may have a fixed focus due to its fixed vertical movement with the vacuum nozzle 230 (and therefore the imaged component), multi-purpose camera 252 has a variable focus due to its relative vertical movement with respect to substrate 258. The variable focus ability of multi-purpose camera 251 enables the camera to perform a variety of imaging functions.

Multi-purpose camera 252 is arranged to image the substrate (or vacuum nozzles, feeder cartridges, etc. located beneath pickup head 200). Multi-purpose camera 252 may also provide close-up images of components placed on substrate 258. Multi-purpose camera 252 may also image calibration marks provided on machine 1000 (e.g., on a base or support portion). Further, the camera can read barcode labels (e.g., label 361) on feeder cartridges 350. The multi-purpose camera 252 may also measure feeder cartridge 350 location targets (fiducial marks) (e.g., a round or square dot) on the feeder cartridge (e.g., on upper attachment portion 352(1)) to update the system with actual feeder location values. Each of these imaging functions is likely performed at a different focus distance.

Additionally, with a reverse periscope mirror system (not shown), multi-purpose camera 252 may serve the function of an up-facing component camera utilized to obtain alignment correction of component C. This is particularly useful for large integrated circuit packages (e.g., greater than 0.75 inch), which are typically imaged by an up-facing camera.

1.4 Force Measurement

Utilizing control of a "touch" force of nozzle 230 when picking or placing a component (part) allows significant advantages. Particularly, with a crank driven nozzle, the below described system allows a clean, "noise" free measurement of the actual force component of the crank drive movement. The oscillatory nature of the crank provides force in a constantly changing direction. Measuring stress in the crank arm itself would produce a value contaminated by force components that do not all operate on the part being picked or placed. Indeed, some of these force components are used to accelerate the crank system. The challenge ultimately amounts to isolating the vertical component from all of the other components and identifying an amount of the force that is contributing to acceleration/deceleration of the crank structure, and further, the amount of the force that is imparted to the picked or placed part itself.

The vertical component of force is isolated by a flexible mechanical structure akin to a door hinge, which is described below in relation to FIGS. 11a to 11c. A typical door hinge allows free motion of the door to allow passage in/out while not allowing the door to move up/down or side-to-side. That is, the hinge offers solid resistance to up/down, left/right forces while allowing the door to swing freely in the operative axis. Similarly, a long thin flexible structure in the crank arm terminating structure functions in this manner. Motion of this structure in the flexure axis is measured by a force sensing chip that deflects a relatively small amount (e.g., 0.0001 inch) for the forces encountered. Force magnitude is conveyed as an analog voltage. The flexible structure is spring loaded to a midscale value and forces in an upward direction on the nozzle unload the spring loaded flexible structure. Thus, in the event of an unanticipated impact with the circuit board the sensor is unloaded, rather than overloaded, to prevent damage. The force reported by this system is the sum of nozzle touch force and acceleration/deceleration forces.

A 3-axis accelerometer may be mounted on the moving structure to report vertical acceleration as an analog voltage. Thus, (acceleration) force may be derived from the acceleration using F=ma. The touch force is then calculated by subtracting the acceleration force from the total force. This measured force may be used to create a force-distance profile that can identify the absence or presence of solder paste, as described below in relation to FIG. 47. The force-distance profile may report the measured force over a traveled distance of nozzle 230. Particularly, a force vs. distance profile may be analyzed and compared (e.g., with a control processor) to a predetermined force vs. distance profile to determine the presence or absence of solder paste.

Figure 11A:
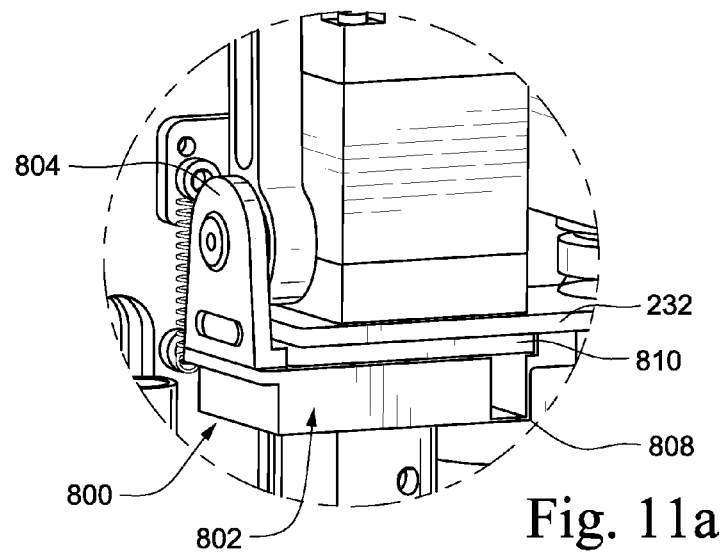
FIG. 11a is an enlarged detail of FIG. 11 showing an example force sensing mechanism of the pick-and-place machine of FIG. 1.
Figure 11B:
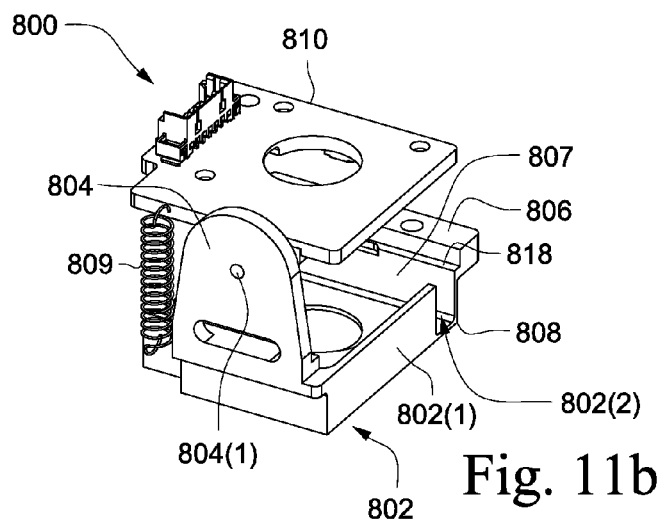
Figure 11C:
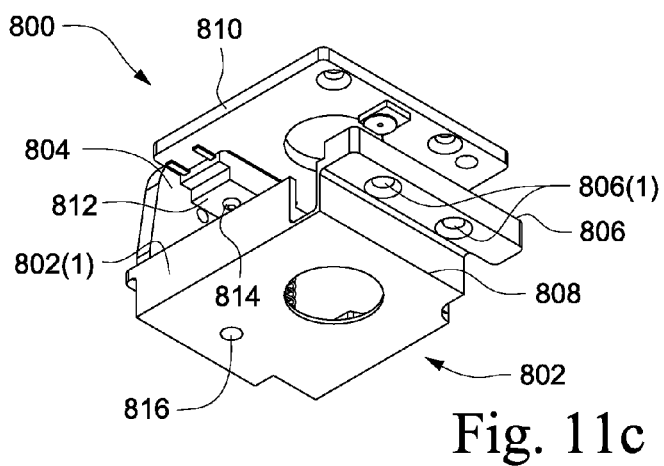

An example force sensing mechanism 800 is shown in FIGS. 11*a* to 11*c*. As best shown in FIGS. 11*b* and 11*c*, force sensing mechanism 800 includes housing 802, a plate (e.g., circuit board 810), and spring 809 connected to housing 802 and circuit board 810 in tension so as to pull them towards one another. Housing 802 includes tab 804 on a first side thereof which connects to connecting rod 242 at drive point 804(1). A pair of wall portions 802(1) extends from tab 804 and each includes a cutout 802(2) therein so as to form a hinge 808 (e.g., a thin flexible hinge). Flexing wall 807 extends upwardly from hinge 808 and terminates in an attachment portion 806. By this arrangement, force sensing mechanism 800 is flexible in response to forces in the direction of the operative axis and maintains rigidity in response to forces in the directions of the other axes.

Attachment portion 806 is attached to platform 232, for example by screws extending through screw holes 806(1). Thus, circuit board 810 and housing 802 are permitted to move relative to one another by movement of flexing wall 807 via hinge 808. That is, for example, an upward force on nozzle 230 may cause housing 802 to move toward circuit board 810 as flexing wall 807 rotates outwardly. Such movement may be measured by force sensor 812 (e.g., a semiconductor and strain gauge on circuit board 810) to determine a magnitude of the upward force on nozzle 230. An adjustable member (e.g., a screw) may be attached to housing 802 and extend through aperture 816 to a position adjacent contact point 814 such that the screw presses upon contact point 814 when housing 802 moves closer to circuit board 810 to provide a force input to force sensor 812. Circuit board 810 may rest on a recessed portion 818 formed in attachment portion 806 such that the circuit board lies below platform 232.

As the nozzle is moved downwardly, housing 802 will tend to move away from circuit board 810, thus diminishing the measured force. On the other hand, when the nozzle is moved upwardly, housing 802 will tend to move toward circuit board 810 thereby increasing the measured force.

1.5 Laser Engraver

Pickup head 200 may also include a laser to engrave substrate 258 (e.g., PCB) with part information, date of manufacture, or other information.

Figure 48:
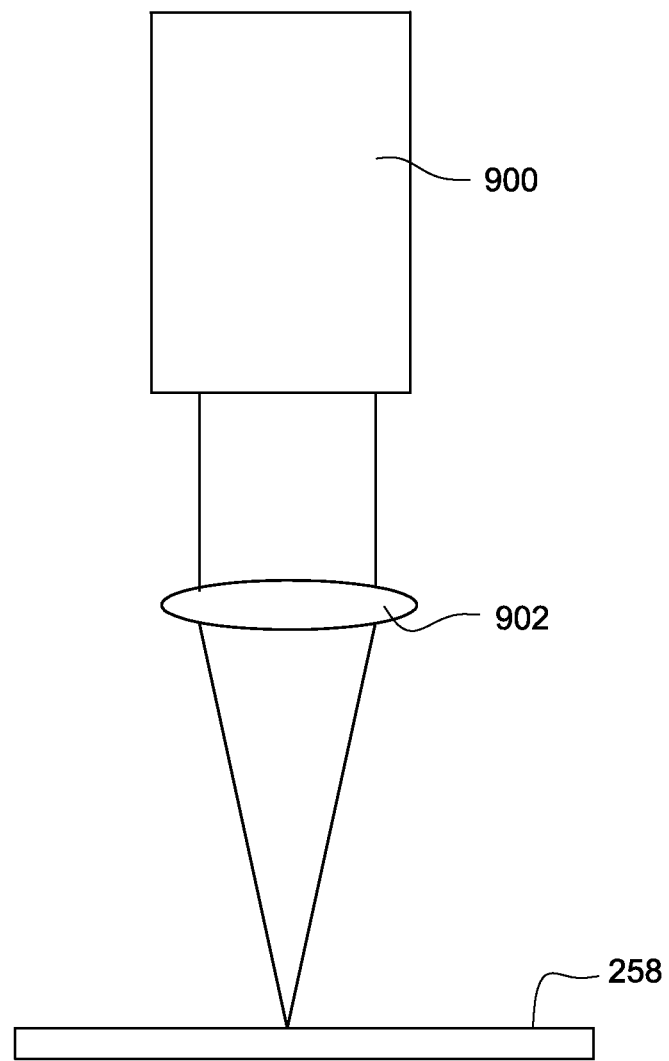
FIG. 48 is a schematic representation of a laser engraver of the pick-and-place machine of FIG. 1.

Referring to FIG. 48, a laser 900 (e.g., a laser diode) may be mounted on pickup head 200. Lens 902 may also be mounted on pickup head 200 to focus and concentrate the laser energy onto a small spot on a surface of the board. Lens 902 may include a single element, or alternatively, multiple elements. The laser wavelength may be chosen such that a portion of the laser energy is absorbed by the substrate surface. The power required is influenced by the absorption efficiency of the substrate surface. 10 watts or less of power may be suitable for most operations; however, more power may be used. Increasing the power facilitates marking at higher speeds.

XY motion of pickup head 200 may be coordinated with ON/OFF beam modulation to draw symbols (e.g., alphabetic, numeric and/or barcode types). The laser energy could be linearly modulated or pulse width modulated proportionally to marking speed, however simple full ON or full OFF may be suitable.

The laser energy absorbed by substrate 258 may be used to vaporize or scar a PCB solder mask coating, PCB ink stencil markings, or apply a label to identify the board by marking thereon, e.g., the board type, revision, serial number, manufacturing date, machine operators name, and/or production lot. Barcode marking may be applied for subsequent reading by other machinery or hand held barcode readers.

Symbols could also be drawn by laser motion along one axis and board motion along the other axis by means of a board conveyor or by the normal use of the board motion axis where the pick and place machine moves the board along one axis and the head moves along the other axis. Alternatively, the pick and place machine may move the board in two axis directions and the laser could remain stationary.

Laser 900 could be mounted outside of pickup head 200. Additionally, the laser may be mounted on its own separate single or dual axis motion platform independent of the pickup head motion. The laser beam could be scanned with a rotating or oscillating mirror (e.g., galvanometer driven mirrors) to mark a board that is stationary or moving.

2.0 Operation

Operation of the example pick-and-place machine 1000 will now be described.

After the desired feeder cartridges 350 have been installed in pick-and-place machine 1000, pickup head 200 is moved to a position adjacent a feeder cartridge 350 having a component to be picked. Sensors 218 then scan the calibration marks on the feeder gear of the selected feeder cartridge. This position information is used to locate the feeder gear so that rack gear 216 can be aligned and engaged with the feeder gear. Such position information may also be used to determine a position of the component pockets on tape 340 if the calibration marks on the feeder gear are arranged to match the component spacing on tape 340. Next, gear driving mechanism 210 is lowered to cause rack gear 216 to engage feeder gear 355. Taking into account the position information of the feeder gear 355, motion system 400 then moves pickup head 200 a precise distance such that rack gear 216 drives feeder gear 355 to index (i.e., incrementally move) tape 340, thereby causing the next component pocket 343 to enter pickup zone 342.

After rack gear 216 is disengaged from feeder gear 355, the sensors 218 again detect the position of feeder gear 350 by sensing the calibration marks on the feeder gear. This position information is used to precisely locate the rotary orientation of the feeder gear and the component pocket locations for storage by CPU 110 and later use in subsequent "pickups." Scanning calibration marks after the feed move substantially eliminates the negative effects of backlash. That is, if there is a discrepancy in actual distance moved and the intended distance of movement, such discrepancy can be corrected by a correction move in the Y direction. Gear driving mechanism 210 is then returned to its raised position (shown in FIG. 11).

Next, the vacuum source is turned on and vacuum nozzle 230 is lowered into pickup zone 342 to contact or nearly contact a component positioned in a component pocket 343 in tape 340. Due to the vacuum force, the component is drawn up against distal nozzle opening 230(3).

The component is then imaged by component camera 251 and the above-described squaring method is performed to obtain and effect both a linear XY correction and an angular correction of the component held against the distal nozzle opening.

The vacuum nozzle is then positioned over the desired placement location (with both linear and angular corrections included) and lowered to place the component (e.g., by pushing the component into solder paste) on the substrate 258. The vacuum source is then turned off and vacuum nozzle 230 is raised leaving the component in place on the substrate. The pickup head is then moved to the feeder cartridge having the next component to be picked and placed. This process is repeated until all the desired components have been placed on the substrate. CPU 110 may store computer program code structures to carry out the example method of operation described above.

2.1 Control Computer Program Code Structures

The control program code structures 112, when executed by CPU 110, provide a system designed to simplify machine operation for the user. CPU 110 executes stored program code to provide advantageous set-up features.

2.11 Auto-Setup

An example automated set-up process will be described. Feeder management is often the largest part of the set-up process and an area where errors are frequently made. The disclosed exemplary auto set-up system significantly reduces set up time associated with assembling a new printed circuit board and eliminates many error-prone processes.

A user may install feeder cartridges 350 at any feeder module location in pick-and-place machine 1000. The feeder cartridges may be installed in full or half slots and may be placed in the machine without concern of the particular component (part) associated with a given feeder cartridge. Each feeder cartridge has a permanent alignment target mark (e.g., on upper attachment portion 352(1)) that when measured by multi-purpose camera 252 reports an exact location of the feeder cartridge. Further, each feeder slot may include an optical sensor to confirm proper installation of feeder cartridge 350 in pick-and-place machine 1000.

Multi-purpose camera 252 in conjunction with optical interrupter 313 will detect each feeder cartridge and determine the location of each feeder cartridge by its position (location information) in pick-and-place machine 1000. The multi-purpose camera 252 may also scan a machine readable barcode on label 361 which will inform CPU 110 of the particular component (e.g., identification information such as part number) associated with that feeder cartridge. As described earlier, the operator also may simply read the alphanumeric text on label 361 to ensure that the component identifying information (e.g., part number) on the label matches the component identifying information (e.g., part number) on reel 330 containing the tape being fed through the feeder cartridge, as a confirmation.

The system will then provide gathered feeder cartridge information to an assembly program which will identify any missing components. Should any components be missing, the user can simply add the missing feeder cartridges. The system will organize (e.g., schedule the picking and placing of each component) the assembly of the substrate in accordance with the location of each feeder cartridge and the identification information of the components. The system may also offer optimization suggestions (e.g., to reduce assembly time).

In order to recognize and identify any missing components, the system may compare the gathered feeder information against pre-defined PCB information The pre-defined PCB information may include a listing of each required component and coordinates for the placement locations of the components for a given PCB assembly. This information may be provided to CPU 110 to guide the assembly process. A comparison of the gathered feeder information and the pre-defined PCB may be displayed to an operator in the manner shown in FIG. 46. Missing components may be highlighted to prompt the operator to add the missing feeder cartridges.

The system will also automatically select and install vacuum nozzles as needed. The vacuum nozzles 230 have machine readable identification information (e.g., a barcode) provided on an outer surface of the nozzles. Multi-purpose camera 252 is configured to read identification information on the vacuum nozzles and then automatically select the currently desired nozzle (e.g., from the nozzle changer cartridge 270) and install that nozzle on nozzle holder 231.

Additionally, the system provides flexible support for partial board population and various circuit board configurations. That is, for example, the user may activate or deactivate placement of a single component, multiple components or all components of a given part number.

Panel arrays are easy to setup and may be built in a variety of ways. It is often more efficient to build boards several at a time. The boards may be arranged in linear or rectilinear arrays. The user need only specify the spacing of the boards in the array and the system will perform the remaining set-up procedures. In a first example, the system may build complete boards one at a time. An advantage of this method is that the user may observe and inspect a complete board before building the other boards. This affords an opportunity to correct errors before building the other hoards. In another example, the system may place each component of a given type and designation on all boards in the array before proceeding to the next component. This method is potentially faster because it may reduce the frequency of nozzle changes.

2.12 Virtual Build

As part of an initial set-up procedure, the system may provide a virtual build feature that enables a user to confirm component alignment in the feeder cartridges without wasting any components. A scanned image of the board (substrate) to be assembled, having no components yet placed thereon, as shown in FIG. 38-1, may be uploaded to the system. The scanned image is preferably a high resolution image. The image may be used to teach coordinate locations; however, CAD centroid data is preferred for this function. The centroid data may include the component type/part number for all components, the x/y coordinate location on the board for each component, as well as the orientation of each component on the board.

The system may use individual stored images (C1 to C8) of the actual components in each feeder cartridge, as shown in FIG. 38-2. As shown in FIG. 39, the system may overlay component images C1 to C8 onto the scanned board image in accordance with predetermined locations (e.g., as contained in the centroid data) for placing each component (thereby building a virtual PCB).

In contrast to systems that create an image of the assembled board from imported data, the instant system does not presume a component orientation based on a user input (which if such input is incorrect results in a placement error). By using a captured image (including orientation) of the component on the tape, the possibility of user errors may be greatly reduced or even eliminated. In some machines, it is difficult to even see the component in the feeder. Further, determining an orientation of the component in such a machine may be further complicated by location (front, back, sides) of the feeder in the machine.

The virtual build process eliminates errors that have been common place. The results of the virtual build process may be presented to the user in a number of arrangements. In one example, a realistic view of the finished board is provided, as shown in FIG. 39. In another example, the system displays the components in a part number/feeder number organized mosaic with rotation correction. Thus, for example, if three capacitors were used from feeder cartridge number "17," then three images would be linked to feeder cartridge "17" for viewing. Unlike the realistic mode, the mosaic mode would undo the component rotation so all components of a particular type should appear the same. The user can simply focus on identifying differences in the images of components of the same type (part number).

This system also logically facilitates the user in identifying the cause of errors. For example, if there is a problem with only a single component, the user may logically suspect that there is a problem with the CAD centroid data. If there is a problem with all of the components for a given feeder, then the user may logically suspect that the feeder cartridge data (e.g., part number, part value (e.g., 0.01 uF/20V), package number, feeder orientation, tape width/pitch, polar/non-polar(n/p)) is the likely cause. If rotation of the components appears to be correct at 0° and 180°, but wrong at all other angles, then the user may logically suspect that the rotation direction in the centroid data is backwards. If the location of some components is vastly wrong while the location of other components appears to be correct, then the user may logically suspect that the centroid data is incorrect. Further, if most or all of the component locations are off target by a considerable degree, the user may logically suspect that confusion in the unit of dimensions (e.g., inch/metric) is the cause. An advantage of the system is that these "diagnoses" are much more evident as compared to other systems.

Accordingly, a user may confirm placement of the various components against the pre-defined PCB data (described earlier). Unlike other systems, no components are consumed in this virtual process of confirming feeder cartridge installation and alignment. Feeder cartridge alignment may pertain to whether the cartridge in mounted in the front or back of the machine. Additionally, as described above, the virtual build process may also catch other errors such as erroneous CAD data and errors with incoming translations (e.g., unit of dimension, rotation direction, etc.). A user may correct an incoming translation error by applying a revised rule to the entire board to be assembled.

Additionally, the pre-defined PCB data may be represented graphically, as shown in FIG. 40. Placement locations P1 to P8 for respectively receiving components C1 to C8 may be disposed in accordance with the coordinate information of the pre-defined PCB data. In this manner, the graphical representation of the pre-defined PCB may be overlaid onto the virtual PCB (e.g., with the overlaid image being partially transparent to facilitate visual comparisons) to provide a more intuitive confirmation procedure, as shown in FIG. 41. The user need only confirm proper placement of the component images C1 to C8 onto corresponding placement locations P1 to P8. In an example shown in FIGS. 42 and 43, mistakenly installed feeder cartridges and/or feeder modules, improperly placed tape reels 330, etc., have resulted in misplaced components (e.g., C4 and C8) that may be easily recognized by the operator.

The system may also store the length, width and thickness of each component to later qualify each measured component as actually placed. This information may be used to test, adjust and perfect the video centering process. For instance, when a component is measured (during the linear/rotational error correction process), the component must meet dimensional specifications to prevent attempted placement of an out of position or missing component. Components identified as a "mis-pick" will be rejected and a full image of the component will be stored for troubleshooting.

2.13 Product Inspection

To facilitate finished product inspection, multi-purpose camera 252 may capture images of each component as it is actually placed on substrate 258. These images may be acquired after each placement or acquired sequentially after the entire assembly is complete. Acquiring an image after each placement requires less pickup head motion and is faster; however, if a subsequent placement interferes with a previous placement, the image of the previous placement would not show the subsequent movement of the component. So, capturing all of the images on a completed assembly is the most error free process, but is also more time consuming. However, the inspection phase causes pickup head motion only between nearby components, so the process is reasonably fast.

The system then organizes the images for easy inspection. For example, the images are rotated to the same orientation and then grouped (e.g., by part number). An example of such display screen is shown in FIG. 45. The images are displayed in a mosaic array organized by component type feeder cartridge. Each line of the array may display components of a particular part number (i.e., component type) so that all of the images on a line should look the same. By this method, even the slightest dissimilarity is easily noticeable to the user. For instance, by analyzing a line of the array, an operator may readily detect whether in fact the components installed on the substrate (a) are the same component type; (b) are the intended component; and/or (c) were installed with the correct orientation.

As shown in FIG. 45, a component of a different type mistakenly installed in a "component-type 1" location may be easily identified as dissimilar to the other components. Additionally, a misaligned component-type 2 component may be identified by an operator due to its different orientation from the other components. Further, once the substrate solder is reflowed, the same process may be used to inspect the finished substrate.

As another finished product inspection procedure, the graphical representation of the pre-defined PCB (described earlier) may be overlaid onto an image of the actual finished PCB (e.g., captured by multi-purpose camera 252), as shown in FIG. 44, to ensure correct placement of the components.

One skilled in the art will recognize that for each of the overlay procedures described above, either image may serve as the overlaid image. Further, those skilled in the art will also recognize that providing one or both images in at least partial transparency may facilitate comparison.

3.0 Multi-Component Vacuum Nozzle

Instead of the previously described vacuum nozzle 231, a multi-component vacuum nozzle system 500, shown in FIGS. 21-35, may be used in pick-and-place machine 1000. The multi-component vacuum nozzle system includes vacuum nozzle 502 attached to body portion 506. Collar 502(1) of the nozzle abuts the body portion. Vacuum nozzle 502 is configured to simultaneously carry multiple components. In this manner, multiple components may be delivered to the substrate during each trip of vacuum nozzle 502 from feeder cartridges 350 to the substrate.

Figure 35:
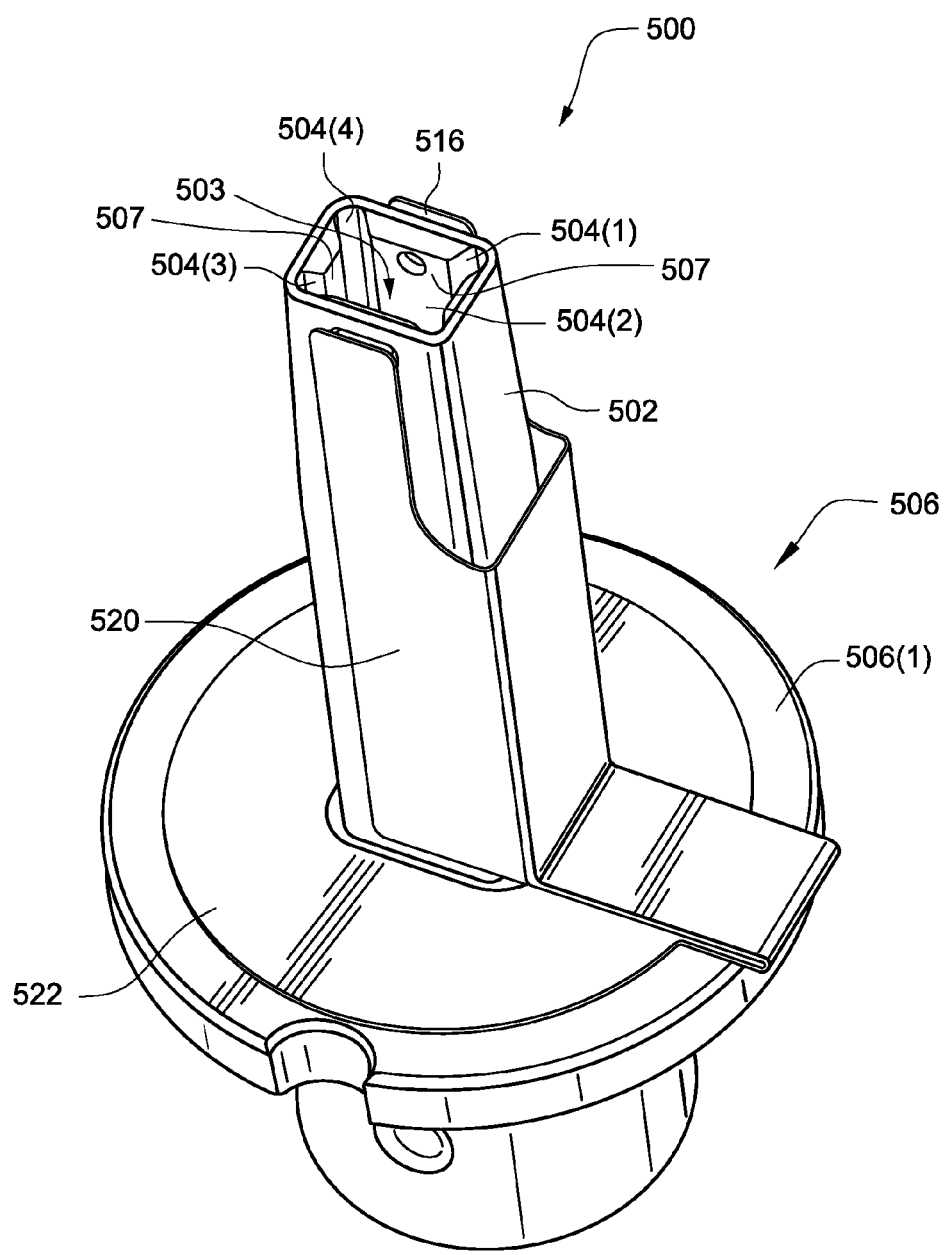
FIG. 35 is a perspective view of an other example of a multi-component vacuum nozzle system for the pick-and-place machine of FIG. 1.

Vacuum nozzle 502 is configured such that components enter the nozzle through distal nozzle opening 504. Vacuum nozzle 502 has a plurality of inner walls 507 forming a hollow portion 503, as best shown in FIG. 35 (only two of four are shown). The components may be stacked one on top of another in hollow portion 503. By this arrangement, the components are automatically aligned by the inner walls 507 of vacuum nozzle 502, thus there is no requirement for a component camera to correct misalignments of the components. However, vacuum nozzle 502 may still be rotated to place components at any angle. The inner walls 507 of vacuum nozzle 502 are designed to match the shape of the components, thereby automatically aligning the components. In the illustrated example, the components are rectangular. By way of example, if the components are 0.05× 0.08 inches, a suitable distal nozzle opening 504 may be 0.052×0.082 inches. Hollow portion 503 may have the same cross-sectional dimensions as the distal nozzle opening. Hollow portion 503 is made long enough to accommodate several components. A chamfer 505 may be provided at the distal nozzle opening 504 to assist component entry.

Stop 512 is slidably received in hollow portion 503. Four air passages 504(1), 504(2), 504(3), 504(4) are formed along respective corners of the hollow portion 503 to allow vacuum suction to pass around stop 512, as best shown in FIG. 30. It should be noted that more or fewer air passages may be provided. Further, the location of the air passages around stop 512 may vary. For instance, instead of being positioned at the corners of the stop, the air passages may be formed between the corners. One skilled in the art will further recognize that the shape of the hollow portion may vary in accordance with the shape of the component to be picked and placed; thus the air passages may be positioned in any suitable location in the hollow portion.

In operation, the vacuum force draws a component into hollow portion 503 via the distal nozzle opening 504 so as to abut against stop 512. The stop 512 prevents the component from flipping. Once the component is established in place against the stop and between the inner walls 507, the stop is retracted into hollow portion 503 by a distance equal to the thickness of one component to make room for the next component. By providing a space at the end of hollow portion 503 that is only large enough for a single component, motion of the component is fully controlled. This process may be repeated to stack as many components as desired (e.g., up to 10 or more, 2-5, 5-10, 10-20, 15-20, up to 20, 20 or more) into hollow portion 503.

The stop 512 may later be moved toward distal nozzle opening 504 to push the components into the solder paste on the substrate. Stop 512 is preferably controlled by a servo step motor or a voice coil actuator with position feedback to enable precise incremental movements. Pickup head 200 may also incorporate a conventional force feedback measurement system to help guide the placement process.

3.1 Confirmation of Component Pickup

An optical sensor (e.g., LED/phototransistor sensor) 516 may be provided at an end portion of vacuum nozzle 502 to detect when a component has been successfully picked up. Sensor 516 is configured to emit a light beam from one side of the nozzle and to detect the light beam at the other side of the nozzle. When a component is successfully picked up, the component will block the light beam, thereby indicating a successful pickup. However, those skilled in the art will recognize that the sensor could depend on light reflection rather than light blockage in which case the sensor and emitter would be positioned on the same side of the nozzle. Additionally, mirrors, optical fibers, prisms, reflectors and/ or light pipes may be used to transport light to/from stationary sensors/emitters on pickup head 200, thereby eliminating the need for inductive power transfer to sensors/emitters on vacuum nozzle 502. Further, other non-optical sensing methods may be employed. For instance, magnetic sensors that utilize induction or eddy current could be used, as well as other techniques such as ultrasonic detection, fluidic cross flow, air pressure or capacitance change. Cavity resonate frequency would change with component presence which could be detected in both acoustic and electromagnetic spectrums.

Further, as one skilled in the art will understand, an LED may be used both to emit light and to serve as a photodiode to sense light. Such dual function arrangement may reduce the space required by sensor 516 since an LED is typically smaller than a light-sensing photodiode or phototransistor.

An inductive coupling system is provided in the exemplary embodiment to provide power to illuminate the LED and to return an optical status signal over the inductive link. The inductive coupling system includes two coils that inductively couple without touching. Referring to FIGS. 31-34, primary coupling coil 530 is arranged to be fixed on pickup head 200 while secondary coupling coil 510 is mounted on vacuum nozzle system 500. Secondary coupling coil 510 may be mounted on seat 508 of body portion 506 and connected to sensor 516 via a flexible printed circuit board 520. A suitable air gap (e.g., 0.25 inches) may exist between primary coupling coil 530 and secondary coupling coil 510. This enables vacuum nozzle 502 and sensor 516 to be easily dismounted for replacement. Further, rotation of the vacuum nozzle by nozzle rotation motor 234 is not complicated by electrical connection since primary coupling coil 530 is fixed on the Z axis and secondary coupling coil 510 is mounted on the vacuum nozzle system. A flange 509 may be arranged on an upper side of seat 508 to contain secondary coupling coil 510. Seat 508 and flange 509 are electrically non-conductive, as one skilled in the art will understand.

Figure 36:
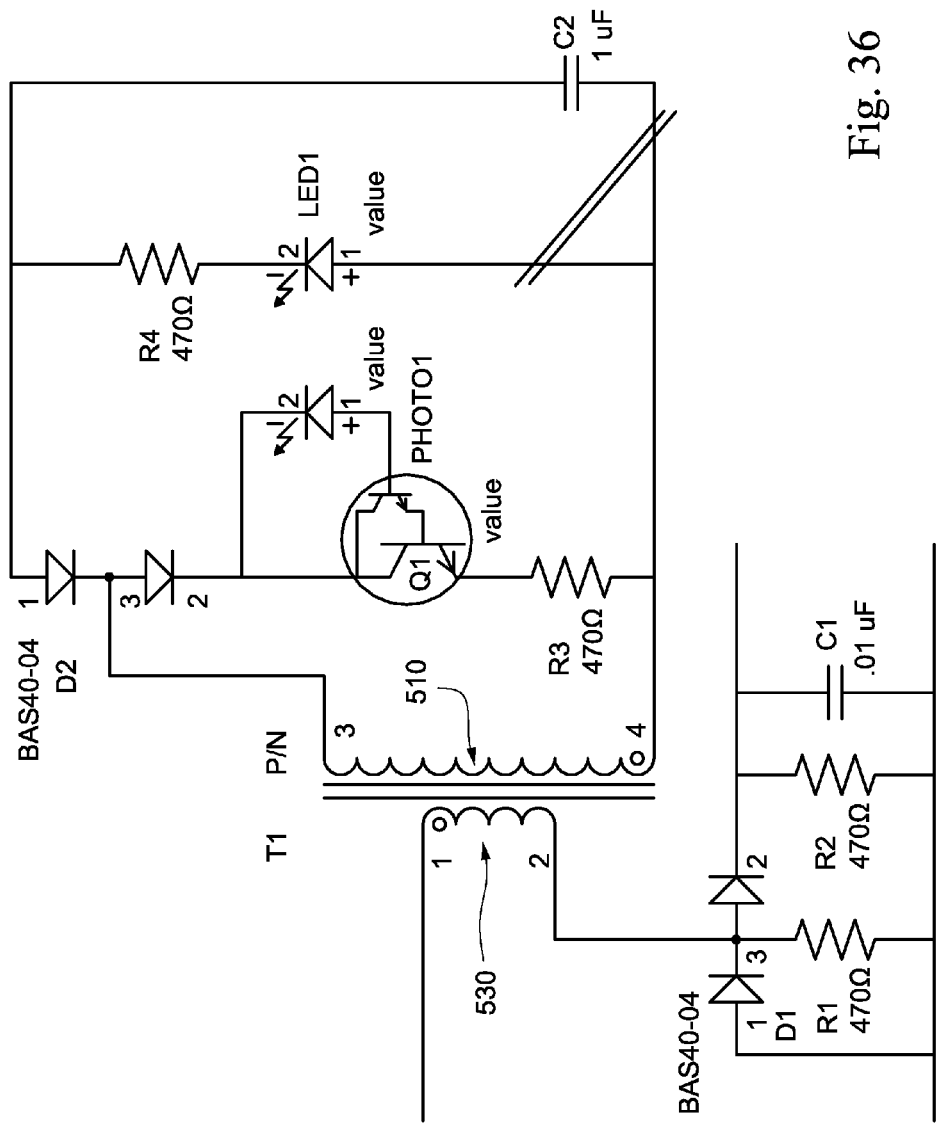
FIG. 36 is an example electrical inductive coupling circuit for use with the nozzles of the pick-and-place machine of FIG. 1.

An example of a circuit for the inductive coupling system is shown in FIG. 36. Primary coupling coil 530 and associated circuits are included on pickup head 200. Secondary coupling coil 510 and associated circuits (included on flexible PCB 520) are mounted on vacuum nozzle system 500. Primary coupling coil 530 is driven with a high frequency AC signal (e.g., 3.0-6.0 MHz). The signal could be a square wave, pulse train, filtered square wave or sinusoid which would radiate the least radio interference. A resistor (R1) acts as a current sensing shunt allowing primary drive current to be measured. A clamp diode (left half of D1) may parallel the shunt resistor (R1) to reduce its impedance during an LED drive phase. When output of secondary coupling coil 510 is in a negative half phase, a diode (top half of D2) and a capacitor (C2) provide DC to power the LED and create an illuminative output. The capacitor (C2) stores energy so that the LED light output will persist across the other (positive) half phase.

The positive half phase powers the light sensing system. Either a phototransistor or an LED (PHOTO1) operating in photo sensing mode provides a signal that is amplified by a suitable transistor (Q1). This transistor draws more current when the sensor is illuminated and very little when the sensor is not illuminated. The magnitude of the current draw during the positive half phase reports the light/dark status of a light sensor. The shunt resistor (R1) in series with primary coupling coil 530 reports the LED drive current as a negative signal and the photo current as a positive one. A simple diode (right half of D1) separates the photocurrent from the LED current for easy measurement. Ultimately, the signal is conveyed as an analog level to a processor chip (e.g., CPU 110). The processor may note a light level just prior to beam blockage to reduce the effects of variation and drift. The processor may then set a threshold based on this value to reliably recognize small changes.

In another example, vacuum nozzle 502 may include a planar secondary coupling coil 522 (e.g., a planar spiral coil connected to or as part of flexible PCB 520) instead of the wire coil 510 for inductively coupling with primary coupling coil 530, as shown in FIG. 35. The planar secondary coupling coil 522 is integrally connected and easier to assemble while the wire secondary coupling coil 510 is closer to primary coupling coil 530 and thus has greater coupling efficiency. The planar secondary coupling coil 522 may be disposed on either a distal side of flange 506(1) as shown in FIG. 35 or a proximal side of flange 506(1) as shown in FIGS. 31-34. Further, one skilled in the art will understand that either secondary coupling coil 510 or planar secondary coupling coil 522 would be used at any given time; however, both coils may be disposed on the nozzle system.

In another example, a vacuum sensor (not shown), instead of the optical sensor 516, could be provided near an end portion of vacuum nozzle 502 to confirm a successful pickup by detecting a change in pressure when a component occludes the hollow portion 503 thereby restricting vacuum flow.

3.2 Actuation of the Stop

Figure 31:
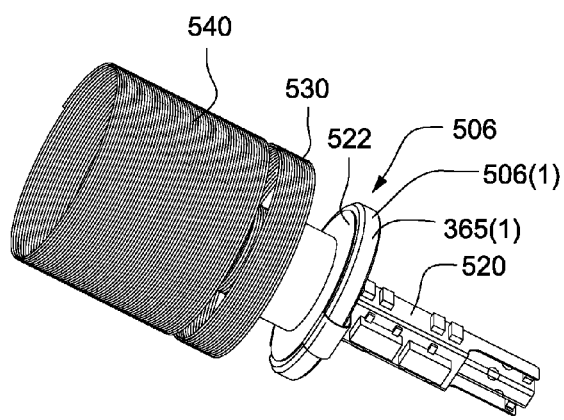
FIG. 31 is a perspective view of an example optional multi-component vacuum nozzle system including pickup-head-mounted coils for inductive coupling with the multi-component vacuum nozzle system.
Figure 32:
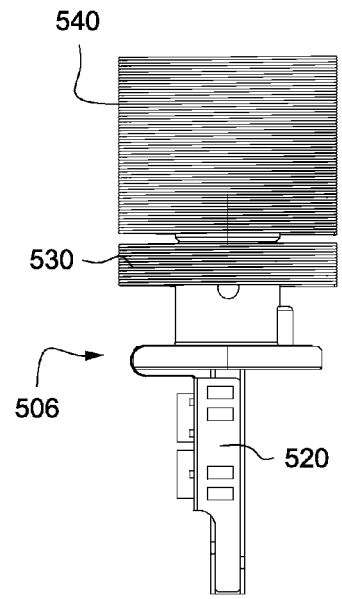
FIG. 32 is a side view of the multi-component vacuum nozzle system of FIG. 31.
Figure 33:
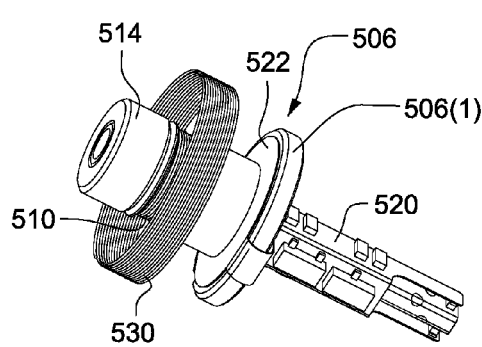
FIG. 33 is a perspective view of an example optional multi-component vacuum nozzle system including a pickup-head-mounted coil for inductive coupling with the multi-component vacuum nozzle system.
Figure 34:
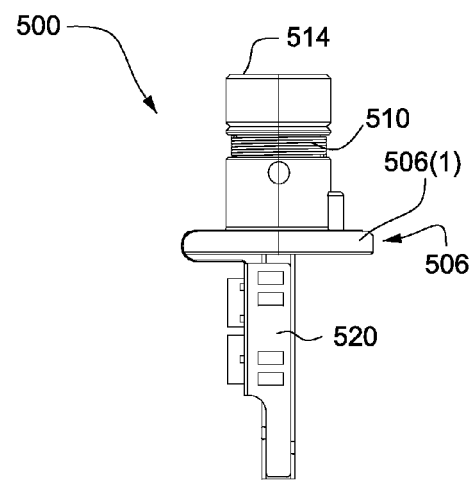
FIG. 34 is a side view of an example optional multi-component vacuum nozzle system for the pick-and-place machine of FIG. 1.

A voice coil actuator may be employed to create a force to move stop 512 along hollow portion 503. A rare earth magnet 514 (e.g., 0.236 inches in diameter and 0.236 inches long) is attached to a magnet-receiving portion 513 at an upper portion of stop 512, as shown in FIG. 22. The stop is nonmagnetic to prevent flux from conveying down to the components (which are typically magnetic). Stop 512 and magnet-receiving portion 513 are slidably received in the body portion 506. Referring to FIGS. 31 and 32, a linear drive coil 540 may be configured to be fixed on pickup head 200 for inductively coupling with magnet 514 to move stop 512.

The space between linear drive coil 540 and magnet 514 may be as small as possible to optimize magnetic coupling. Linear drive coil 540 controls the position of the magnet 514 and the stop 512 with a magnetic field created by current flow in the linear drive coil, as one skilled in the art will understand. A suitable material for body portion 506 is carbon fiber. Current in linear drive coil 540 is preferably controlled by a class-D-amplifier with pulse width modulation.

Actuation of magnet 514 and stop 512 is preferably servo controlled to enable precise movements. The position of the magnet may be accurately determined with a magnetic field strength sensor. This technique is described in Honeywell application note AN211, which is incorporated herein by reference. The position may be reported magnetically as an analog voltage. This may be used in a proportional-integral-derivative (PID) servo loop to control the current in linear drive coil 540. Current in linear drive coil 540 may be adjusted as necessary to keep stop 512 in a desired position. Because the static magnetic field from magnet 514 and the dynamic field from linear drive coil 540 may both influence the magnetic field strength position sensor, position measurement requires measuring the static component from magnet 514 without outside influence. In order to achieve this, current in linear drive coil 540 may be turned off briefly during position measurement intervals. Several thousand measurements per second may be taken, as one skilled in the art will understand.

The combination of the voice coil actuator and the magnetic position feedback sensor provides very high resolution force measurement. Because the voice coil produces a force in proportion to drive current independent of magnet position over a modest range, the voice coil acts like a nearly linear spring. Thus, the voice coil actuator combined with the position sensor is somewhat analogous to a spring scale with milligram resolution. The system is adept at measuring force vs. distance relationships, since force is easily controlled as a direct function of current and distance is measured directly with the magnetic sensor. For relatively small parts, precision force control is essential to placing the parts without damage. It is noted that other feedback systems may also be used.

Vibration of stop 512 may be induced to aid in picking up and aligning components in the hollow portion 503. This vibration may be introduced as hysteresis in the servo loop to produce vibration at the update rate, or the vibration could be introduced as a separate error signal in the loop to obtain vibration at a lower frequency. The vibration may be turned on or off and the frequency and amplitude of the vibration may be changed to accommodate various components.

Additionally, optical sensor 516 may be used to confirm the location of the components held within hollow portion 503. The position of the components may be relative to a reference location such as the bottom of the last component picked up by vacuum nozzle 502. Thus, all movements of stop 512 may be relative to this reference location. This arrangement may diminish the need for accurate linearity over long travel distances of the magnet. This arrangement also mitigates variation in field strength of different magnets on different vacuum nozzles.

In an alternative arrangement, movement of stop 512 may be accomplished by a motor driven screw connected to the stop, as should now be appreciated by those in the art. A connection between stop 512 and the servo system is accomplished with a toroidal ring magnet on the outside of the body portion 506 that couples and captures a cylindrical magnet attached to the stop on the inside of the body portion. The stop is nonmagnetic to prevent flux from conveying down to the components. A rare earth magnet is used. The ring magnet and the cylinder magnet are magnetized along their lengths or thicknesses. These magnets are oriented so their opposing poles align and attract. While this coupling is compliant, it takes a large force to displace the magnet when captured inside the toroid. The magnetic coupling is essentially solid in the vertical displacement axis but allows friction-free rotation. The toroidal magnet is driven by a lead screw which is in turn driven by a gear and a long pinion. A servo or stepper motor may be used to control rotation of the lead screw and thus the vertical position of stop 512.

3.3 Operation

In operation of the example multi-component vacuum nozzle system 500, a calibration process is performed to set the position of stop 512 before a first component is picked from tape 340. Stop 512 is first lowered to break the light beam from sensor 516 and is then raised until the light beam is restored. This position of stop 512 may be a sufficient starting position for picking thin components; however, for thicker components, the stop may be raised further. Next, the vacuum source is turned on and vacuum nozzle 502 is lowered to nearly contact tape 340 between adjacent component pockets 343. Then, the vacuum nozzle is moved over a component pocket 343 to draw the component into the vacuum nozzle. A successful pick-up of the component is reported by sensor 516. Instead of sensor 516, it is noted that the previously described vacuum sensor may be used. Stop 512 is then moved up a distance equal to the thickness of a component in order to make room for the next component. Sensor 516 then reports that there is no blockage of the light beam. The vacuum nozzle is moved over the next component pocket 343 to pick the next component. This process may be repeated as necessary to pick a desired number of components. The tape may be indexed to bring the components to the vacuum nozzle 502 one at a time, or possibly, a large number of component pockets 343 may be simultaneously exposed in an elongated pickup zone so that the vacuum nozzle 502 can move across an exposed section of tape to rapidly pick up components. That is, each feed move may expose multiple components (e.g., 2-7, 7 or more, 10, 10 or more, 15-20, 5-15, 15 or more, 20, 20 or more).

If a component is unable to be picked by vacuum nozzle 502, the nozzle may re-try the pickup or go on to a subsequent component instead. Further, if the component ultimately is unable to be picked up by vacuum nozzle 502, the CPU 110 may keep track of such component and adjust the placement process accordingly so the nozzle does not attempt to place the ("missed") component.

As described earlier, vibration of stop 512 may be induced to aid in picking up components. The stop may be lowered to a position near distal nozzle opening 504 and then a slight vertical vibration of stop 512 may be induced. The component would remain in motion after being drawn into hollow portion 503 due to the vibration of stop 512. However, in another example, the vibration may be stopped once the component is picked up. The stop is then moved up to confirm the component pickup and to make room for the next component. The vibration helps components find their way into and past distal nozzle opening 504, which for example may be a chamfered opening.

Once a desired number of components are loaded into hollow portion 503 of vacuum nozzle 502, the placement process may begin. The vacuum nozzle will be positioned over the first placement location and lowered to nearly touch substrate 258. Stop 512 is then lowered to push (or eject) a component out of nozzle opening 504 and into solder paste on the substrate. Once the component has been completely removed from vacuum nozzle 502, the vacuum force will be smaller than the adhesive force of the solder paste thereby causing the component to remain on the substrate as the vacuum nozzle 502 is raised. Because of the high bandwidth of motion of stop 512, components may be rapidly placed while pickup head 200 is still moving. Since slowing the pickup head to a complete stop consumes a great deal of time, keeping the pickup head moving at even a modest pace adds significantly to performance.

Figure 47:
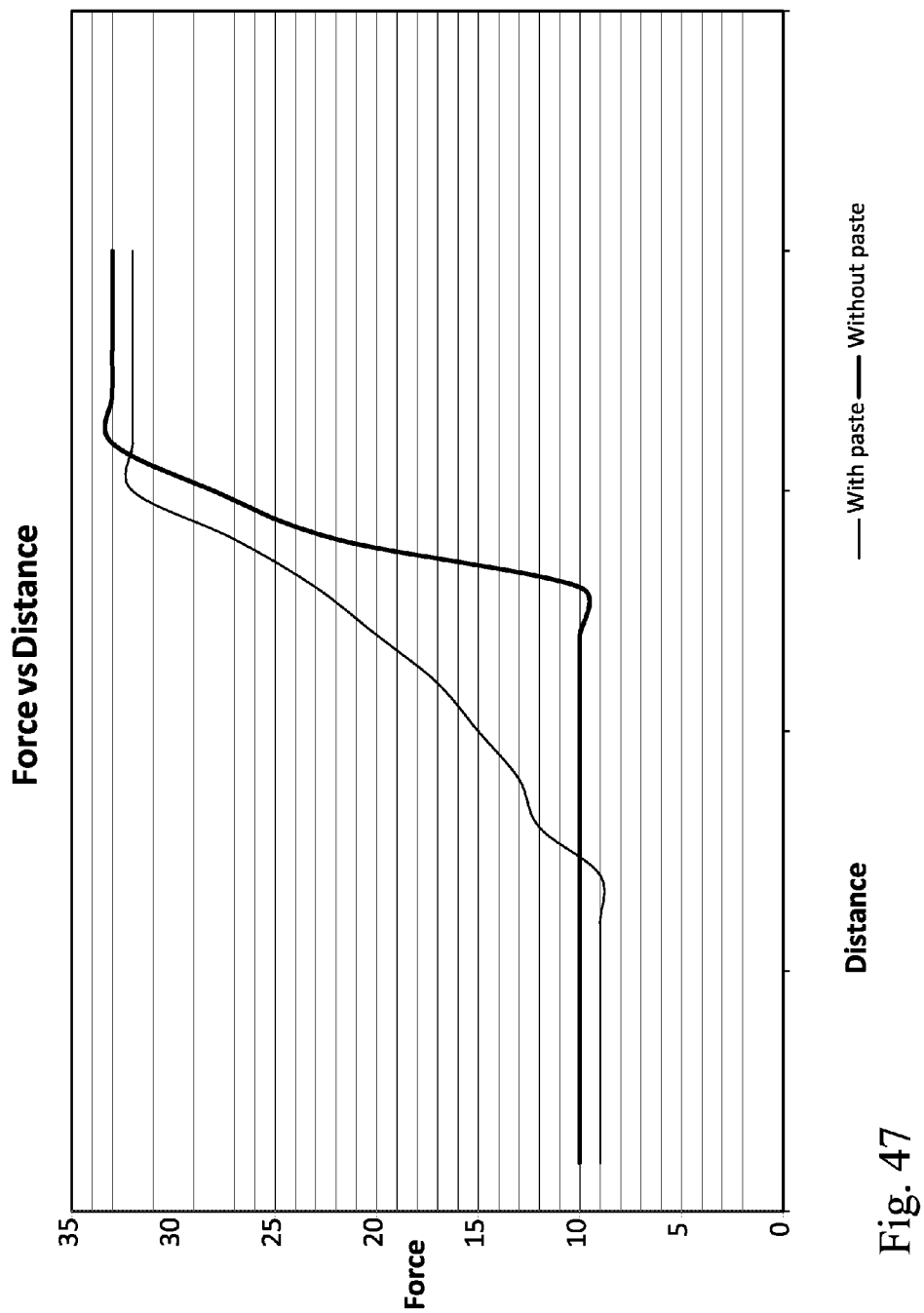
FIG. 47 is a graph showing an example force vs. distance profile of pickup device placing a component onto a substrate.

The stop positioning system can also report push force and distance with fine resolution, as described previously. Referring to FIG. 47, the shape characteristics of the force vs. distance curve can be used to identify the presence or absence of solder paste. Placing a component on a board without paste will report an abrupt rise in force because the component will experience no resistance until it hits the hard board. On the other hand, placing a component in paste will report a more gradual rise in force as the displacement of the paste cushions the impact. Without solder paste, the component will not connect to the board which will cause a defective assembly. Detection of absent solder paste is significant in preventing defective assemblies. A force vs. distance profile of stop 512 may be analyzed and compared (e.g., with a control processor) to a predetermined force vs. distance profile to determine the presence or absence of solder paste.

Additionally, sensor 516 may be used to confirm that a component was actually placed in the paste on the substrate. Stop 512 and the stack of components may be raised to confirm placement of a component by verifying that the light beam is not blocked. A component that will not remain on substrate 258 (e.g., because of missing paste) may be purged by placing the component in a dump area having an adhesive coated tape which retains the component.

While the examples discussed above have been described in connection with what are presently considered to be practical and preferred features, it is to be understood that appended claims are intended to cover modifications and equivalent arrangements included within the spirit and scope of these examples.

What is claimed is:

1. At least one non-transitory computer readable medium comprising executable computer program code instructions that, when executed by at least one processor, automatically set up a pick-and-place machine that picks components from a feeder cartridge and places the picked components onto predetermined respective positions on a substrate to assemble a printed circuit board (PCB) after manually installing at least one feeder cartridge on a feeder cartridge support in the pick-and-place machine, each feeder cartridge having been placed in an available one of plural mounting positions on the feeder cartridge support and configured to controllably advance a tape containing a respective group of components, each mounting position having a corresponding optical interrupter, said setup effected by executing said computer program code instructions comprising:
    automatically detecting the presence of each feeder cartridge in whatever mounting position of the plural mounting positions the feeder cartridge has been placed by detecting the interruption, by a portion of the feeder cartridge, of light emitted by a corresponding optical interrupter;
    automatically acquiring machine readable information on each feeder cartridge by use of an imaging device carried by the pick-and-place machine to obtain identification information for components carried by the feeder cartridge; and
    automatically organizing assembly of a pre-defined printed circuit board using the components in the at least one feeder cartridge, in whatever mounting position of the plural mounting positions the feeder cartridge has been placed, in accordance with detection of the feeder cartridge by the optical interrupter and the acquired component identification information.

2. The at least one non-transitory computer readable medium according to claim 1, further comprising executable computer program code instructions configured to automatically determine whether one or more required components for the pre-defined PCB assembly is currently missing from the pick-and-place machine.

3. The at least one non-transitory computer readable medium according to claim 1, the setup further comprising automatically scanning, with the imaging device, and acquiring machine readable information on at least one pickup nozzle to obtain pickup nozzle identification information of each respective nozzle, and
    selecting one of the scanned nozzles, in accordance with the acquired nozzle identification information, for use in the pre-defined PCB assembly.

4. A pick-and-place machine for picking components from a feeder cartridge and placing the picked components onto predetermined respective positions on a substrate to assemble a printed circuit board (PCB), said machine comprising:
    a feeder cartridge support including a plurality of mounting locations;
    a plurality of manually installable feeder cartridges respectively mounted on the feeder cartridge support in an available one of the plurality of mounting locations, each feeder cartridge being configured to controllably advance a tape containing a respective group of components, each feeder cartridge having machine readable information provided thereon;

a plurality of optical interrupters corresponding respectively to the plurality of mounting locations, each optical interrupter being configured to detect the presence of a corresponding feeder cartridge in a respective mounting location when a portion of the feeder cartridge interrupts transmission of light emitted by the optical interrupter;

an imaging device configured to acquire the machine readable information on each feeder cartridge to obtain identification information for components carried therein; and at least one control processor configured to automatically organize assembly of a pre-defined printed circuit board using the components carried by the feeder cartridges, in whatever mounting location of the plurality of mounting locations each respective feeder cartridge has been mounted, in accordance with detection of the feeder cartridges by the optical interrupters and the acquired component identification information.

5. The pick-and-place machine according to claim 4, wherein the at least one control processor is configured to automatically determine whether one or more required components for the pre-defined PCB assembly is currently missing from the pick-and-place machine.

6. The pick-and-place machine according to claim 4, further comprising at least one pickup nozzle configured to pick components from the feeder cartridges, wherein the imaging device is configured to automatically scan and acquire machine readable information carried on the at least one nozzle to obtain nozzle identification information of each respective nozzle, and wherein the at least one control processor is configured to select one of the scanned nozzles, in accordance with the acquired nozzle identification information, for use in the pre-defined PCB assembly.

7. The pick-and-place machine according to claim 4, wherein the plurality of manually insertable feeder cartridges are not mounted on the feeder cartridge support according to an expected arrangement as programmed in the pick-and-place machine.

8. A method of assembling a printed circuit board (PCB) with a pick-and-place machine, the method comprising:

manually installing a plurality of feeder cartridges on a feeder cartridge support in the pick-and-place machine, each feeder cartridge being mounted on the feeder cartridge support in an available one of plural mounting positions and configured to controllably advance a tape containing a respective group of components, each one of the plural mounting positions having a corresponding optical interrupter;

automatically detecting the presence of each mounted feeder cartridge, in whatever mounting position of the plural mounting positions each respective feeder cartridge has been placed by detecting the interruption, by a portion of the feeder cartridge, of light emitted by the corresponding optical interrupter;

automatically acquiring machine readable information on each feeder cartridge by use of an imaging device carried by the pick-and-place machine to obtain identification information for components carried by each feeder cartridge; and automatically organizing assembly of a pre-defined PCB using the components in the feeder cartridges, in whatever mounting position of the plural mounting positions each respective feeder cartridge has been placed, in accordance with detection of the feeder cartridges by the optical interrupters and the acquired component identification information.

9. The method according to claim 8, further comprising automatically determining whether one or more required components for the pre-defined PCB assembly is currently missing from the pick-and-place machine.

10. The method according to claim 8, further comprising automatically scanning, with the imaging device, and acquiring machine readable information on at least one pickup nozzle to obtain pickup nozzle identification information of each respective nozzle, and selecting one of the scanned nozzles, in accordance with the acquired nozzle identification information, for use in the pre-defined PCB assembly.

11. The method according to claim 8, wherein the plurality of feeder cartridges are not mounted on the feeder cartridge support according to an expected arrangement as programmed in the pick-and-place machine.

12. The at least one non-transitory computer readable medium according to claim 1, wherein each optical interrupter includes spaced-apart light emitting and light detecting portions.

13. The pick-and-place machine according to claim 4, wherein each optical interrupter includes spaced-apart light emitting and light detecting portions.

14. The method according to claim 8, wherein each optical interrupter includes spaced-apart light emitting and light detecting portions k.

* * * * *